(12) United States Patent
Asakura et al.

(10) Patent No.: US 6,586,940 B2
(45) Date of Patent: Jul. 1, 2003

(54) CAPACITY ESTIMATION METHOD, DEGRADATION ESTIMATION METHOD AND DEGRADATION ESTIMATION APPARATUS FOR LITHIUM-ION CELLS, AND LITHIUM-ION BATTERIES

(75) Inventors: Kaoru Asakura, Nakano-ku (JP); Toshiro Hirai, Suginami-ku (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 09/804,503

(22) Filed: Mar. 12, 2001

(65) Prior Publication Data

US 2001/0022518 A1 Sep. 20, 2001

(30) Foreign Application Priority Data

| Mar. 13, 2000 | (JP) | 2000-068921 |
| Apr. 3, 2000 | (JP) | 2000-100654 |
| Apr. 3, 2000 | (JP) | 2000-100680 |
| May 22, 2000 | (JP) | 2000-149902 |
| Nov. 28, 2000 | (JP) | 2000-361149 |

(51) Int. Cl.⁷ ............................................. G01N 27/416
(52) U.S. Cl. ..................................................... 324/426
(58) Field of Search ................................. 324/426, 427; 320/132, 134

(56) References Cited

U.S. PATENT DOCUMENTS

| 5,172,044 A | 12/1992 | Sasaki et al. | 320/160 |
| 5,187,424 A | 2/1993 | Benz et al. | 320/132 |
| 5,552,953 A | 9/1996 | Meyerdirks et al. | 361/93.1 |
| 5,744,937 A | 4/1998 | Cheon | 320/125 |
| 6,191,559 B1 * | 2/2001 | Berthoud et al. | 324/427 |

FOREIGN PATENT DOCUMENTS

| DE | 39 34 353 | 10/1989 |
| DE | 691 12 243 | 2/1991 |
| DE | 44 02 716 | 1/1994 |
| DE | 196 41 989 | 10/1996 |
| JP | 8-136629 | 5/1996 |
| JP | 9-219221 | 8/1997 |
| JP | 9-285029 | 10/1997 |
| JP | 9-322420 | 12/1997 |
| JP | 11-52033 | 2/1999 |
| JP | 11-271408 | 10/1999 |
| JP | 11-329512 | 11/1999 |

OTHER PUBLICATIONS

Translation of JP 09322420.*
M. Broussely, M. Perelle, J. McDowall and G. Sarre, "Lithium ion: The Next Generation of Long Life Batteries—Characteristics, Life Predictions, and Integration into Telecommunications Systems," Proceedings of INTELEC2000, pp. 194–201 (2000).

(List continued on next page.)

Primary Examiner—Michael Sherry
Assistant Examiner—Pia Tibbits
(74) Attorney, Agent, or Firm—Kenyon & Kenyon

(57) ABSTRACT

A capacity estimation method for a Li-ion cell is provided. In the method, according to a first aspect, an elapsed time from the time when charge voltage in constant current charge reaches a predetermined voltage to the time when charge condition is changed to a constant voltage mode is used for calculating an estimated capacity of said Li-ion cell. According to a second aspect, a charge current after a lapse of a predetermined time from the time when charge condition is changed to a constant voltage mode is used. According to a third aspect an elapsed time from the time when charge condition is changed to a constant voltage mode to the time when charge current becomes $\alpha$ ($0<\alpha<1$) times is used.

45 Claims, 48 Drawing Sheets

OTHER PUBLICATIONS

T. Sasaki, N. Iwamura, M. Terasaki, M. Mizutani and M. Yamachi, "Studies on the characteristics of float–charged Li–ion battery," Extended Abstract of the 196th Electrochemical Society Meetings, P. 319 (1999).

K. Asakura, M. Shimomura, T. Hirai, "Behavior of Deterioration of Li–ion Cells as a Backup Power Supply," The Electrochemical Society of Japan, 67th Conference, IC27, p. 47, Apr. 4, 2000 (with English translation).

K. Asakura, M. Shimomura, T. Hirai, "Impedance Characteristics of Li–ion Cells after Storage," The Electrochemical Society of Japan, 67th Conference, p. 47, Apr. 4, 2000 (with English translation).

* cited by examiner

FIG. 9

| EXPERIMENT NO. | CHARGE PERIOD PER CYCLE | NUMBER OF DATA USED | EQUATIONS | ERR(%) |
|---|---|---|---|---|
| 1 | 2.5 HOURS | 5 | $C/C_0 = 0.900 \times t^{0.0872}$ | 21.3 |
| 2 | 3 HOURS | 5 | $C/C_0 = 0.985 \times t^{0.0617}$ | 9.49 |
| 3 | 3 DAYS | 5 | $C/C_0 = 0.995 \times t^{0.123}$ | 19.9 |
| 4 | 7 DAYS | 2 | $C/C_0 = 0.995 \times t^{0.117}$ | 18.8 |
| 5 | 10 DAYS | 2 | $C/C_0 = 0.995 \times t^{0.111}$ | 17.8 |
| 6 | 10.5 DAYS | 1 | $C/C_0 = 1.015 \times t^{0.207}$ | 31.7 |
| 7 | 11 DAYS | 1 | $C/C_0 = 1.025 \times t^{0.213}$ | 31.9 |

FIG. 10

| EXPERIMENT NO. | TEMPERATURE SET AT LOWER TEMPERATURE TEST | DIFFERENCE IN TEMPERATURE | EQUATIONS | ERR(%) |
|---|---|---|---|---|
| 8 | -11°C | 31°C | $C/Co=1.015 \times t^{0.400}$ | 23.6 |
| 9 | -10°C | 30°C | $C/Co=1.015 \times t^{0.259}$ | 10.8 |
| 10 | 0°C | 20°C | $C/Co=1.005 \times t^{0.204}$ | 5.7 |
| 11 | 5°C | 15°C | $C/Co=0.995 \times t^{0.118}$ | 3.3 |
| 12 | 6°C | 14°C | $C/Co=1.056 \times t^{0.532}$ | 31.6 |
| 13 | 15°C | 5°C | $C/Co=1.035 \times t^{0.456}$ | 27.0 |

FIG. 22

| EXPERIMENT NO. | CHARGE PERIOD | EQUATIONS I | MAXIMUM ERROR (ABSOLUTE VALUE) (%) | EQUATIONS II | MAXIMUM ERROR (ABSOLUTE VALUE) (%) | SYMBOLS OF MEASUREMENT POINTS IN FIG. 23 |
|---|---|---|---|---|---|---|
| 1 | 2HOURS | $C=-75.5t+105$ | 21.2 | $C=-75.5t+57.4$ | 13.3 | ■ |
| 2 | 3HOURS | $C=-35.8t+103$ | 5.1 | $C=-35.8t+75.5$ | 0.9 | ✗ |
| 3 | 3DAYS | $C=-44.8t+108$ | 4.2 | $C=-44.8t+71.4$ | 2.3 | ◆ |
| 4 | 7DAYS | $C=-38.2t+108$ | 1.2 | $C=-38.2t+74.4$ | — | ✚ |
| 5 | 10DAYS | $C=-44.4t+108$ | 4.0 | $C=-44.4t+71.6$ | 2.2 | ▶ |
| 6 | 11DAYS | $C=-72.5t+113$ | 11.8 | $C=-72.5t+58.8$ | 12.2 | ◀ |

FIG. 37

| EXPERIMENT NO. | CHARGE PERIOD | EQUATIONS | MAXIMUM ERROR (ABSOLUTE VALUE) ERR(%) |
|---|---|---|---|
| 1 | 2HOURS | $C/C_o = 0.202t + 0.977$ | 54.2 |
| 2 | 3HOURS | $C/C_o = 0.548t + 0.496$ | 14.9 |
| 3 | 3DAYS | $C/C_o = 0.674t + 0.387$ | 7.3 |
| 4 | 7DAYS | $C/C_o = 0.706t + 0.356$ | 5.0 |
| 5 | 10DAYS | $C/C_o = 0.739t + 0.324$ | 2.6 |
| 6 | 11DAYS | $C/C_o = 1.20t - 0.108$ | 28.8 |

CAPACITY ESTIMATION METHOD, DEGRADATION ESTIMATION METHOD AND DEGRADATION ESTIMATION APPARATUS FOR LITHIUM-ION CELLS, AND LITHIUM-ION BATTERIES

BACKGROUND OF THE INVENTION

1. Field of the Invention

The present invention relates to a lithium-ion cell (in the following, the lithium-ion cell will be called as an Li-ion cell) and a lithium-ion battery (in the following, the lithium-ion battery will be called as an Li-ion battery). More specifically, the present invention relates to a capacity estimation method, a degradation estimation method and a degradation estimation apparatus for the Li-ion cell and the Li-ion battery.

2. Description of the Related Art

Recently, demand for cells is growing as various electronic devices become smaller, sophisticated and portable. According to this growing demand, cells are intensively developed and improved. Accordingly, the scope of application of cells has been extended.

As the cells are becoming widespread, demand for improvement of reliability of the cells is growing. Especially, ensuring reliability of a nickel-metal hydride cell (in the following, the nickel-metal hydride cell will be called as an Ni/MH cell) and a Li-ion cell is an important problem since energy which is accumulated in the Ni/MH cell or the Li-ion cell is higher than that of a conventional lead-acid cell or a nickel-cadmium cell (in the following, the nickel-cadmium cell will be called as an Ni/Cd cell) so that damage which may be caused by a trouble of the Ni/MH cell or the Li-ion cell is more serious than that of the lead-acid cell or the Ni/Cd cell. That is, since volumetric or gravimetric energy density of the Ni/MH cell or the Li-ion cell is much higher than that of the lead-acid cell or the Ni/Cd cell, energy which is accumulated in the Ni/MH cell or the Li-ion cell is higher than the lead-acid cell or the nickel-cadmium cell.

In addition, the Li-ion cell does not have gas absorbing reaction mechanism which absorbs gas which is generated due to side reaction of overcharging although the lead-acid cell, the Ni/Cd cell, and the Ni/MH cell have such a gas absorbing reaction mechanism. The latter cells include aqueous solution, sulfuric acid or alkaline solution, as electrolyte. Oxygen gas evolves on the cathode and the gas is absorbed in anode active materials for these cells. On the other hand, the Li-ion cell includes lithiated transition metal oxide as cathode active material which intercalates and deintercalates lithium, carbon compound as anode active material which intercalates and deintercalates lithium, and nonaqueous organic mixed solvent in which lithium salts are dissolved as electrolyte. Thus, gases which are generated by the Li-ion cell due to side reaction of overcharging are CO, $CO_2$ or other organic gases for which any gas absorbing reaction mechanism has not been established.

Furthermore, the lead-acid cell, the Ni/Cd cell, and the Ni/MH cell have recoverable safety vent which releases oxygen gas which evolves due to side reaction of overcharging and cannot be absorbed in anode active material. On the other hand, the safety vent is not recovered for the Li-ion cell because of preventing from outer moisture. The Li-ion cell thus does not operate once the vent opens. Therefore, as for the Li-ion cell, cell reaction and the safety vent mechanism for keeping safety are largely limited.

In addition, when a plurality of Li-ion cells are placed in series in which degradation of each cell is proceeding, overcharging or over discharging may occur due to imbalance between characteristics of cells so that safety can not be secured. Especially, since the Li-ion cell is expensive, the number of times of exchanging a cell is desired to be as small as possible so as to use the cell over a long time period as possible. However, since safety of the Li-ion cell which is in the last period of its life degrades very much, it is favorable that the cell is exchanged before it is in the unsafe condition. Therefore, for the Li-ion cell, there is an economical problem.

To exchange a cell timely by keeping track of degradation of the cell accurately is one of methods for attaining reliability. As for high energy density cells such as the Ni/MH cell or the Li-ion cell, Smart Battery System (SBS) which was proposed in 1994 is becoming widespread while being modified as a battery management system including charging control and residual capacity evaluation (www.sbs-forum.org can be referred to). However, for controlling and managing cells, only a method based on managing enormous volumes of data is adopted, in which the enormous volumes of data include manufacturing makers, kinds of cells, in addition, data obtained by always monitoring currents, voltages, temperature of cells and the like. Thus, this method is very costly so that prices of products become high.

In addition, monitoring degradation of cells which is important for keeping safety is not regarded as important while keeping and monitoring use time per charge or residual capacity are regarded as important. One of the reason of this is that model changes are often performed for devices which mount the Li-ion cells.

Especially, SBS has only functions of charge control, residual capacity management and the like so that it does not have a function of grasping degradation status of cells. Therefore, exchanging of cells or batteries is performed through user's intuition.

In addition to SBS, a method of controlling and managing the Li-ion cell used in a video camera is proposed. In this method, since degradation of the cell is judged only by applying previous capacity to relationship between capacity and the number of repetition of charge and discharge which is stored in a memory beforehand, there is a problem in accuracy.

SUMMARY OF THE INVENTION

An object of the present invention is to provide a method for performing capacity estimation of the Li-ion cell accurately, a method for performing degradation estimation of the Li-ion cell accurately, an apparatus for performing degradation estimation of the Li-ion cell accurately, and a Li-ion battery which includes a capability for performing degradation estimation accurately.

According to a first aspect of the present invention, the above object of the present invention is achieved by a capacity estimation method for a Li-ion cell, comprising the steps of:

obtaining, when the Li-ion cell is charged by a constant current and constant voltage charging method, an elapsed time from the instant when charge voltage in constant current charge reaches a predetermined voltage to the instant when charge condition is changed from a constant current mode to a constant voltage mode; and calculating an estimated capacity of the Li-ion cell by using the elapsed time.

According to a second aspect of the present invention, the above object of the present invention is achieved by a capacity estimation method for a Li-ion cell, comprising the steps of:

obtaining, when the Li-ion cell is charged by a constant current and constant voltage charging method, a charge current after a lapse of a predetermined time from the instant when charge condition is changed from a constant current mode to a constant voltage mode; and calculating an estimated capacity of the Li-ion cell by using the charge current.

According to a third aspect of the present invention, the above object of the present invention is achieved by a capacity estimation method for a Li-ion cell, comprising the steps of:

obtaining, when the Li-ion cell is charged by a constant current and constant voltage charging method, an elapsed time from the instant when charge condition is changed from a constant current mode to a constant voltage mode to the instant when charge current becomes a ($0<\alpha<1$) times of charge current in the constant current mode; and calculating an estimated capacity of the Li-ion cell by using the elapsed time.

BRIEF DESCRIPTION OF THE DRAWINGS

Other objects, features and advantages of the present invention will become more apparent from the following detailed description when read in conjunction with the accompanying drawings, in which:

FIG. 9 is a table showing each charge time per one cycle used for preparing equations of an example 1-5, the number of sets of data for each experiment, prepared equations and absolute values of estimation errors calculated by applying the equations;

FIG. 10 is a table showing temperatures of lower temperature tests used for preparing the equations of an example 1-6, obtained equations, and absolute values of estimation errors calculated by applying the equations;

FIG. 22 shows equations obtained in an example 3-2 of the present invention;

FIG. 37 shows capacity estimation equation and the resulted error (absolute values) for the charge and discharge cycles with various charge time in an example 5-2;

DETAILED DESCRIPTION OF THE PREFERRED EMBODIMENTS

As mentioned above, in the present invention, capacity estimation and degradation estimation are performed in a constant current and constant voltage charge method focusing attention on three points: (1) a charge time in a constant current mode; (2) a current value after a lapse of a predetermined time interval in a constant voltage mode; and (3) a time taken for charge current to decrease to a predetermined current value.

In the following, in a first embodiment, the capacity estimation method and the degradation estimation method using (1) the charge time in the constant current mode will be described. In a second embodiment, the charge time in the constant current mode will be used as in the first embodiment in which estimation equations which are simpler than those in the first embodiment will be used.

In a third embodiment, the capacity estimation method and the degradation estimation method using (2) the current value after a lapse of a predetermined time interval in the constant voltage mode and (3) the time taken for charge current to decrease to a predetermined current value will be described. In a fourth embodiment, the capacity estimation method and the degradation estimation method using (2) the current value after a lapse of a predetermined time interval in the constant voltage mode will be described in which these methods are simpler than those in the third embodiment. In a fifth embodiment, the capacity estimation method and the degradation estimation method using (3) the time taken for charge current to decrease to a predetermined current value will be described in which these methods are simpler than those in the third embodiment.

In addition, in a sixth embodiment, examples for applying the capacity estimation method and the degradation estimation method to an electric vehicle and the like will be described.

(First Embodiment)

In the following, the capacity estimation method of the Li-ion cell of the first embodiment of the present invention will be described with reference to figures in detail. In the following description, "battery" means "secondary battery as a self-contained power source" in which a cell or a plurality of cells and safety control circuits or charge/discharge control circuits are integrated wherein the plurality of cells are connected in series or in parallel or in combination.

Figure 1:
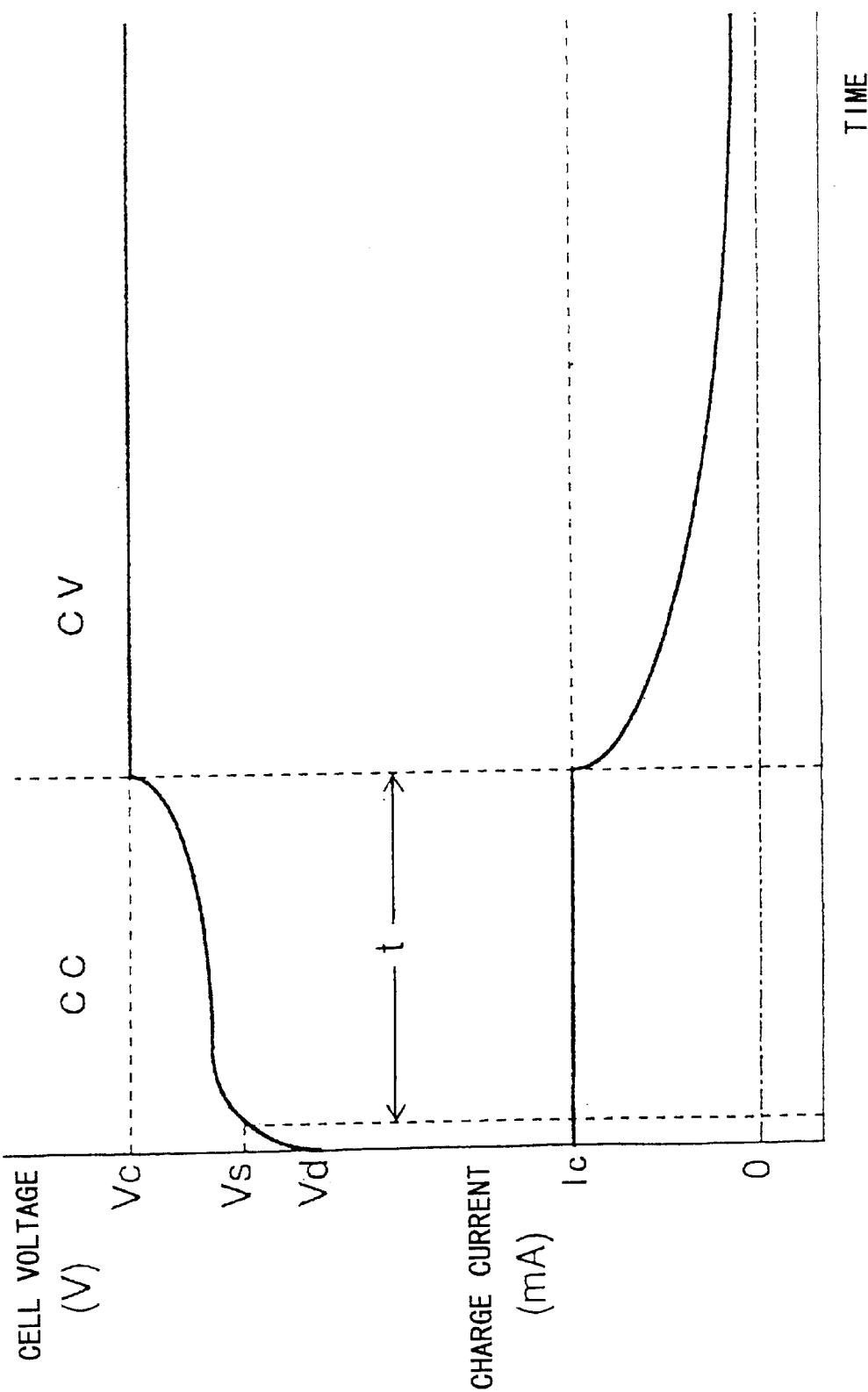
FIG. 1 shows variation per time of voltage and current values of a Li-ion cell when charging the Li-ion cell by the constant current and constant voltage (CC-CV) charging method which is generally used for charging the Li-ion cell.

FIG. 1 shows profiles of voltage and charge current of a Li-ion cell when charging the Li-ion cell. In FIG. 1, first, the Li-ion cell, which may be a Li-ion cell in a battery, is charged to a predetermined charge limit voltage Vc with a predetermined constant current Ic in the constant current mode (in the following, the constant current mode will be called as CC mode), wherein the charge limit voltage Vc is normally 4.1 V/cell or 4.2 V/cell. After the charge voltage reaches the predetermined voltage Vc, charge of the constant voltage mode (in the following, the constant voltage mode will be called as CV mode) starts in which the charge current decreases over time while the charge voltage (which is shown as "cell voltage" in FIG. 1) keeps the constant value Vc.

In the capacity estimation method of the Li-ion cell of the present invention, when the cell is charged in the CC mode in the constant current and constant voltage charge method (in the following, the constant current and constant voltage charge will be called as CC-CV charge), a time t is monitored and the time t is used for capacity estimation of the Li-ion cell, wherein the time t is a time lapsed from the instant when the cell voltage reaches a voltage Vs which is set such that it is equal to or larger that a discharge cut-off voltage Vd and smaller than the charge limit voltage Vc to the instant when the CC mode is changed to the CV mode.

In the following, the reason why such estimation is possible will be described.

In the charge process of the Li-ion cells, Li in the cathode active material dissolves as $Li^+$ ions in the electrolyte and the $Li^+$ ions are intercalated into the anode carbon. In contrast, in the discharge process, Li intercalated into anode dissolves as $Li^+$ ions in the electrolyte and the Li+ ions are intercalated into the cathode active material.

Due to repeating charge and discharge, long time nonoperation, or overcharging, transition metal such as Co, Ni, or Mn which constitutes the cathode active material dissolves in the electrolyte so that the reaction area is decreased since the separator is clogged and the compounds are deposited on the anode surface, a passive film is generated on the anode surface due to electrolyte decomposition with $Li^+$ ions in the electrolyte, inactive or dead Li remains in the cathode and anode active materials after discharging and charging, or particles of electrode component materials become to be disconnected electrically due to degradation of polymer binder. As a result, electron passing through electrode particles and $Li^+$ ion mobility in the electrolyte degrade. Therefore, effective area which performs reaction of electrodes or the number of storage sites of Li decreases so that internal resistance of the cell increases. Then, $Li^+$ ion at the time of charging deintercalates from cathode active material so that the amount of $Li^+$ ions which disperse in the inside of the anode and the rate of dispersion decreases. In this state, charge time in the CC mode becomes shorter since the internal resistance of the cell increases. In the CC mode, diffusion rate of Li in the anode gradually decreases and it delays relaxation of the Li in the surface layer of the electrode dispersing to the inside layer. Eventually, the speed of decrease of the current value decreases.

The inventors of the present invention discover a correlation between decrease of capacity and decrease of the charge time in the CC mode so that they invent the present invention which will be described with the first embodiment.

(Outline of the First Embodiment)

In the first embodiment, a capacity estimation method for a Li-ion cell will be described. The method comprises the steps of:

obtaining, when the Li-ion cell is charged by the CC-CV charge method, an elapsed time t from the instant when charge voltage in constant current charge reaches a predetermined voltage Vs to the instant when charge condition is changed from a CC mode to a CV mode; and calculating an estimated capacity Ce of the Li-ion cell by using the time t.

In order to enable this estimation method, it is necessary to obtain correlation between the estimated capacity Ce and the time t beforehand. For example, there is a following method to obtain the correlation.

Charge and discharge cycle is repeated for a Li-ion cell which has the same structure and the same specification (which will be called as the same kind in this specification) as a Li-ion cell which is the target of capacity estimation. Then, correlation between the time tn of each cycle and discharge capacity Cn which is obtained by integrating discharge current with respect to time (n is a number which is assigned to each cycle). In this case, since it is favorable that the value of the discharge capacity Cn ranges widely, it is favorable to perform the above method for a plurality of Li-ion cells which are the same kind and have different capacities when the discharge capacity Cn does not range widely.

The correlation is not necessarily represented as an analytic equation. For example, it may be represented as a line graph in which measured values in a correlation diagram are connected by lines.

When the analytic equation is adopted as representation of the correlation, there is a favorable range in the charge current Ic when the constant current charge (in the following, the constant current charge will be called as CC charge) is performed.

In addition, if relationship between the estimated capacities Ce and the number of charge repetitions is obtained by recording the estimated capacities Ce which are calculated in each charge, the life-span of the cell can be estimated, that is, it can be estimated how many times the cell can be recharged and reused before degradation. When a Li-ion cell is used by repeating charge and discharge under usage condition which is the same as or similar to that used in the estimation, accuracy of the life-span estimation becomes high.

The favorable range of the charge current Ic can be represented as $Co/(30\ hours) \leq Ic \leq Co/(1\ hour)$, wherein Co is the nominal capacity of the Li-ion cell which is the target of capacity estimation. Generally, when a current of the cell is Co/(T hours), the current is represented by (1/T) CmA. For example, Co/(20 hours) can be represented as 0.05 CmA. Therefore, the above condition can be represented as $0.033\ CmA \leq Ic \leq 1.0\ CmA$.

When the charge current Ic satisfies the above condition, a following equation approximately holds, wherein A and B are positive constants which are determined by the Li-ion cell, the voltage Vs and the charge current Ic.

$$Ce/Co = A \times t^B \qquad (1)$$

Thus, according to this equation, the estimated capacity Ce can be obtained by using the time t.

When the charge current Ic does not satisfy the above condition, it is not favorable to calculate the estimated capacity Ce by using the equation (1). That is, when the charge current Ic is smaller than the above limitation range, a calculated capacity by the equation (1) becomes different from an actual capacity for reasons that the cell is not fully charged, effect of self-discharge can not be neglected and the like. When the charge current Ic is larger than the above limitation range, since the time taken for charging the cell becomes short, the measured value of the time t may includes large error and variations of charge time due to degradation becomes different to each other. Thus, it becomes also difficult to estimate capacity accurately.

However, since charge current values which are applied to almost all apparatuses mounting the Li-ion cell and chargers are within the range of the above condition, the capacity estimation method according to this embodiment of the present invention is effective for Li-ion cells used under a normal condition.

Apparatuses and chargers which adopt a current value which is out of the range are used only for very limited use such as in a case when very high rate charge is required in an emergency. These apparatuses and chargers hardly requires the capacity estimation method of the present invention.

The equation (1) represents relationship between the time t in the CC mode charge in a charge condition of an apparatus mounting Li-ion cell to which the equation is applied and an estimated specific capacity Ce/Co under the charge condition. When the charge current value in the CC mode for obtaining the equation (1) is different from the charge current value in the CC mode of the apparatus mounting the cell or the charger, following processes need to be performed.

That is, the time t is obtained under each charge condition beforehand. Then, after obtaining a ratio te/tm wherein the time te is obtained under the condition for preparing the equation (1) and the time tm is obtained under a condition which corresponds to the apparatus or the charger, a result of multiplying measured time by the ratio te/tm is substituted into the equation (1).

Because the smaller the current value is, the larger the charge ratio in the CC mode charge (charge ratio is ratio of the CC mode charge period to full charge period) is. That is, because the smaller the current value is, the larger the charge ratio is. In addition, since the ratio varies according to cell size, cell shape, manufacturer, cell component material and the like, it is necessary to grasp effects of the current value by performing experiments.

For preparing the equation (1), it is necessary to determine the constants A and B in the equation (1). For this purpose, as mentioned above, it is appropriate to determine the constants A and B by using a cell or a battery which is the same kind as the Li-ion cell or battery which is the target of the capacity estimation. Because, in commercial Li-ion cells, many kinds of cathode active materials, anode carbons and electrolytes are used so that initial charge behaviors as well as variations of charge voltage behaviors due to-cell degradation differ.

Next, the method for determining the constants A and B will be described.

In this embodiment, a charge and discharge cycle are repeated at least equal to or more than two times by using a Li-ion cell which is a capacity estimation target or the same kind of Li-ion cell as the Li-ion cell, wherein the charge and discharge cycle includes a charge period from 3 hours to 10 days in which charge is performed by the CC-CV charge method, a discharge period, a rest period which is provided as necessary between the charge period and the discharge period. In each cycle, an elapsed time tn from the instant when charge voltage in CC charge reaches a predetermined voltage Vs to the instant when charge condition is changed from a CC mode to a CV mode and discharge capacity Cn (n is a number assigned to each cycle) which is obtained by integrating discharge current with respect to time are obtained and recorded.

Then, values of the constants A and B from the elapsed time tn and the discharge capacity Cn are determined so that the estimated capacity can be calculated.

In the following, the determining method of A and B in detail.

A cell or a battery which is the same kind of a cell or a battery for which degradation is estimated is used and two kinds of charge and discharge cycle experiments are performed so as to obtain data necessary for preparing the equation (1). In one experiment, the environment temperature is set from 10° C. to 30° C. In another experiment, the environment temperature is set from −10° C. to 5° C. In addition, the temperatures are set such that the difference becomes larger than 15° C.

The reason why the experiments are performed under two kinds of environments is to ensure high accuracy by incorporating characteristics in an environment temperature at the time of performing degradation estimation of an Li-ion cell which is set in an actual apparatus or in an environment temperature which is very close to the realistic one into the equation (1). In addition, by performing experiment in an temperature which is equal to or more than 15° C. lower than the above temperature, cell characteristics data of a cell having very low capacity which is the same as a case when the cell degrades very much. It is not favorable to perform only one kind of experiment in which the temperature is the same as that of usage environment or a temperature close to that of usage environment which is from 10° C. to 30° C. since enormous time is required for a cell to degrade. The present invention surely determines equation (1) sooner than such a conventional procedure.

The charge and discharge cycle experiment for obtaining the equation (1) is performed by setting a voltage range which is the same as that in a charge condition, charge limit voltage Vc, and discharge cut-off voltage Vd, of a real apparatus mounting Li-ion cells. In addition, a charge current value which is the same as a charge current value of the real apparatus or which is from 0.033 CmA to 1.0 CmA is used.

The charge period per one cycle is set to be from 3 hours to 10 days or from 3 days to 10 days which is favorable when the experiment environment temperature is set from 10° C. to 30° C. By setting the charge period per one cycle to be from 3 hours to 10 days or 3 days to 10 days desirably, the cell degrades moderately per one cycle so that data necessary for preparing the equation (1) accurately can be obtained efficiently.

When the charge period is smaller than 3 hours, the Li-ion cell degrades slowly. Thus, several hundred cycles are necessary for obtaining the equation (1) accurately so that enormous time is consumed. In some cases, charge is performed insufficiently so that degradation and insufficient charge are mixed. As a result, degradation status and characteristics of the Li-ion cell can not obtained properly, which is not favorable.

When the charge period is longer than 10 days, the time necessary for performing one cycle experiment becomes long so that it takes much time for obtaining necessary data, which is also not favorable.

When the experiment environment temperature is set to be from −10° C. to 5° C. inclusive, the charge period is set to be shorter than that used in the above experiment from 10° C. to 30° C., that is, the charge period is set to be from 3 hours to 24 hours or from 3 hours to 12 hours desirably. Because, when the cell is charged and discharged in a low temperature, cell degradation due to overcharge when charging within the set voltage range becomes smaller than that of the case when the cell is charged and discharged at about room temperature. Therefore, in the case of the experiment at the low temperature, the number of the charge discharge cycles in a predetermined period is increased in order to accelerate cell degradation. When the upper limit of the charge period is set as 12 hours, the effect further increases.

If the charge period is longer than 24 hours (one day), the number of the cycles decreases so that cell degradation does not proceed adequately. This is not favorable. If the charge period is shorter than 3 hours, cell charge becomes insufficient so that cell degradation does not proceed adequately. This is not favorable, either.

The discharge current value in the charge and discharge cycle is set to be from 0.5 CmA to 2.0 CmA. When the lower limit is set to be from 1.0 CmA to 2.0 CmA, data can be obtained more efficiently. When the discharge current is smaller than 0.5 CmA, it takes much time to discharge completely, which is not favorable. When the discharge current is larger than 2.0 CmA, discharge period becomes too short. Thus, measurement values of discharge capacity may vary. In addition, when degradation proceeds, the capacity may decrease abruptly so that the equation (1) can not be prepared accurately. This is not favorable.

When the charge and discharge cycle experiment is performed, a rest is included between charge and discharge as necessary due to limitation of settings of the apparatus.

More particularly, in order to obtain the constants A and B in the equation (1), a time tn which is taken until the CC mode charge ends from the time when the charge voltage is a voltage Vs and a discharge capacity Cn are measured for each charge and discharge cycle, wherein the voltage Vs is equal to or larger than the discharge cut-off voltage and smaller than the charge limit voltage Vc in the CC mode charge, the discharge capacity Cn is obtained by integrating discharge current with respect to time, and n is a number which is assigned to each cycle. Then, the measured times tn and capacities Cn are plotted to be applied to the equation (1).

As for above mentioned charge and discharge cycle experiment, more than two cycles are performed in order to obtain data necessary for achieving high accuracy in the degradation estimation result which is within ±20% of real capacity. If only one cycle is performed, only two points of data can be used for determining the constants A and B in the equation (1) so that accurate degradation estimation becomes impossible.

In the following, a method for determining whether the cell degrades will be described.

It is judged that Li-ion cell is degraded when the estimated capacity Ce becomes smaller than a predetermined limit capacity Cmin. In the above method, the estimation may be performed by comparing estimated specific capacity Ce/Co (Co is nominal capacity) and limit specific capacity Cmin/Co. This method is favorable since Ce/Co is directly calculated by the equation (1).

As the limit capacity Cmin, a value of 60% of the nominal capacity is used for example (in this case, Cmin/Co=0.6).

Next, an apparatus which can estimate degradation by using the above method will be described.

The apparatus includes:

means for obtaining, when the Li-ion cell is charged by a CC-CV charge method, an elapsed time t from the instant when charge voltage in CC charge reaches a predetermined voltage Vs to the instant when charge condition is changed from a CC mode to a CV mode; and an arithmetic circuit for calculating an estimated capacity Ce of the Li-ion cell by using the time t; and means for outputting a signal representing that the Li-ion cell is degraded when the estimated capacity Ce becomes smaller than a predetermined limit capacity Cmin.

A configuration of the apparatus will be described in detail with reference to FIG. 2.

Figure 2:
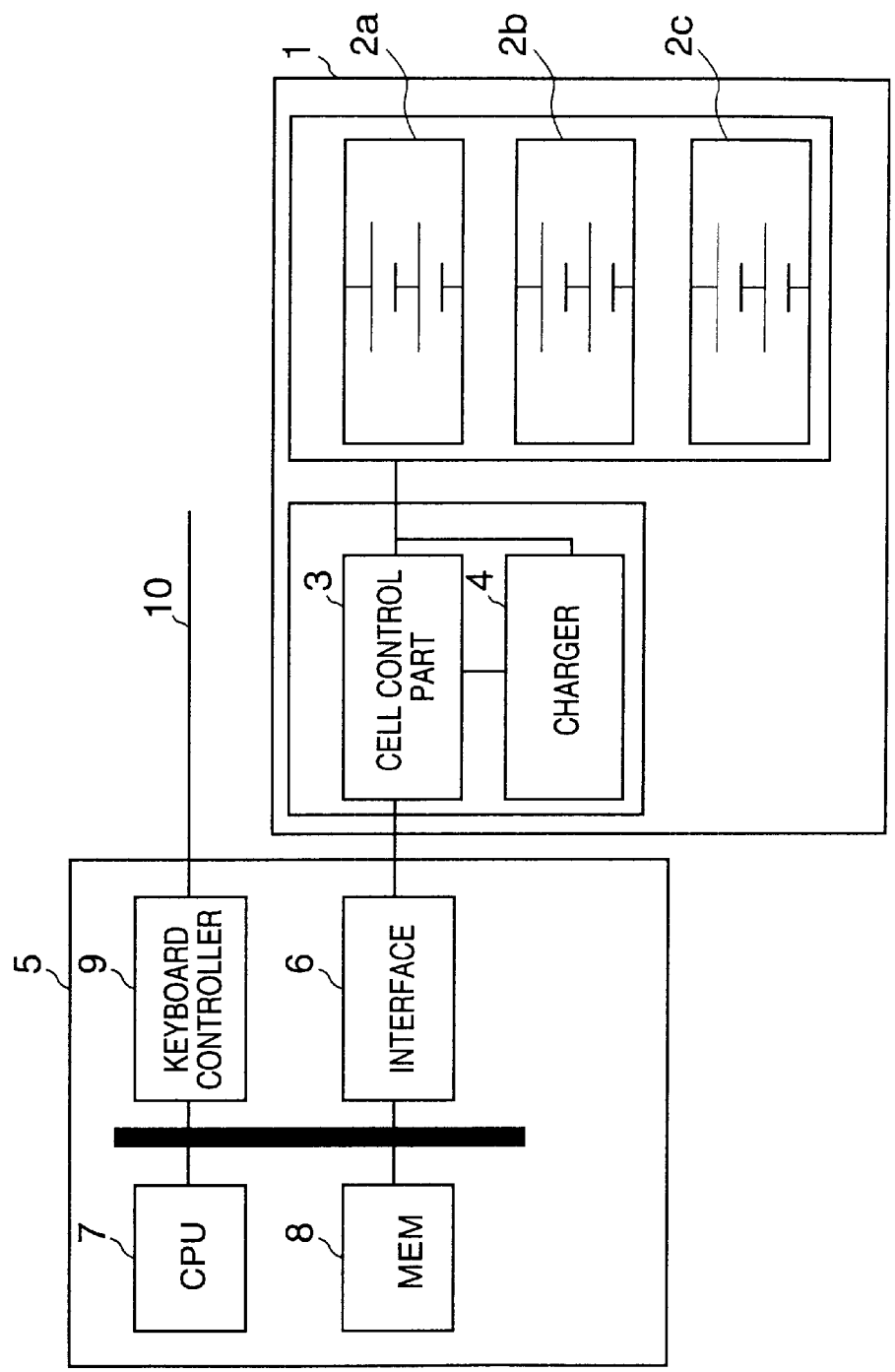
FIG. 2 shows a configuration of a general power source part and peripheral equipment of an apparatus which mounts the Li-ion cell to which the degradation estimation method of the present invention is applied.

FIG. 2 shows a configuration of a general power source part and peripheral-equipment of an apparatus which mounts the Li-ion cell. This part includes the power source part 1 which includes Li-ion cells 2a, 2b, and 2c. Charge/discharge and safety of the Li-ion cells 2a, 2b, and 2c are controlled by a cell control part 3 in the power source part 1. The power source part 1 includes a charger 4 which charge the cells 2a, 2b, and 2c controlled by the cell control part 3. A logic part 5 includes an interface 6, a CPU 7, a memory 8 and keyboard controller 9. The cell control part 3 is connected to the CPU 7 via the interface 6 and receives information on the cells 2a, 2b, and 2c and instruction of control. The cell control part 3 sends data on cell control to the CPU 7. In the logic part 5, the CPU 7 and the memory 8 provide instructions for control, perform operations, store information on cell control and store data. IDs of the cells 2a, 2b, and 2c are input via the keyboard controller 9. A line 10 is connected to the keyboard controller 9 for sending data.

The equation (1) of the present invention is stored in an available memory in the CPU 7 and the like beforehand. Or, the equation (1) is stored in an memory chip which is added as necessary. The CPU provides the cell control part 3 with an instruction to measure the time t from the instant when the charge voltage in the CC mode charge reaches the voltage Vs which is within the range of use voltage until the instant when the CC mode charge is changed to the CV mode charge, and receives data of the time t from the cell control part 3. In addition, the CPU 7 performs calculation by substituting the time t into the equation (1) so that the CPU 7 obtains the estimated capacity Ce (or the estimated specific capacity Ce/Co). The memory 8 stores the estimated capacity Ce (or the estimated specific capacity Ce/Co) if necessary. If Ce<Cmin (or Ce/Co<Cmin/Co) when the estimated capacity Ce (or the estimated specific capacity Ce/Co) is compared with the predetermined limit capacity Cmin (or limit specific capacity Cmin/Co), the Li-ion cell is estimated to be degraded. The result of degradation estimation is applied to the body of the apparatus via the line 10 such as a system management bus. The body of the apparatus displays the estimation result to a display part of the apparatus and sounds an alert by using a beep or a voice as necessary. Accordingly, the apparatus which has the degradation estimation capability for the Li-ion cells are realized. The configuration is not limited to the above mentioned one as long as the degradation estimation of the present invention is performed.

The method of the present invention can also be applied to a Li-ion battery. A configuration example of the Li-ion battery is shown in FIG. 3.

Figure 3:
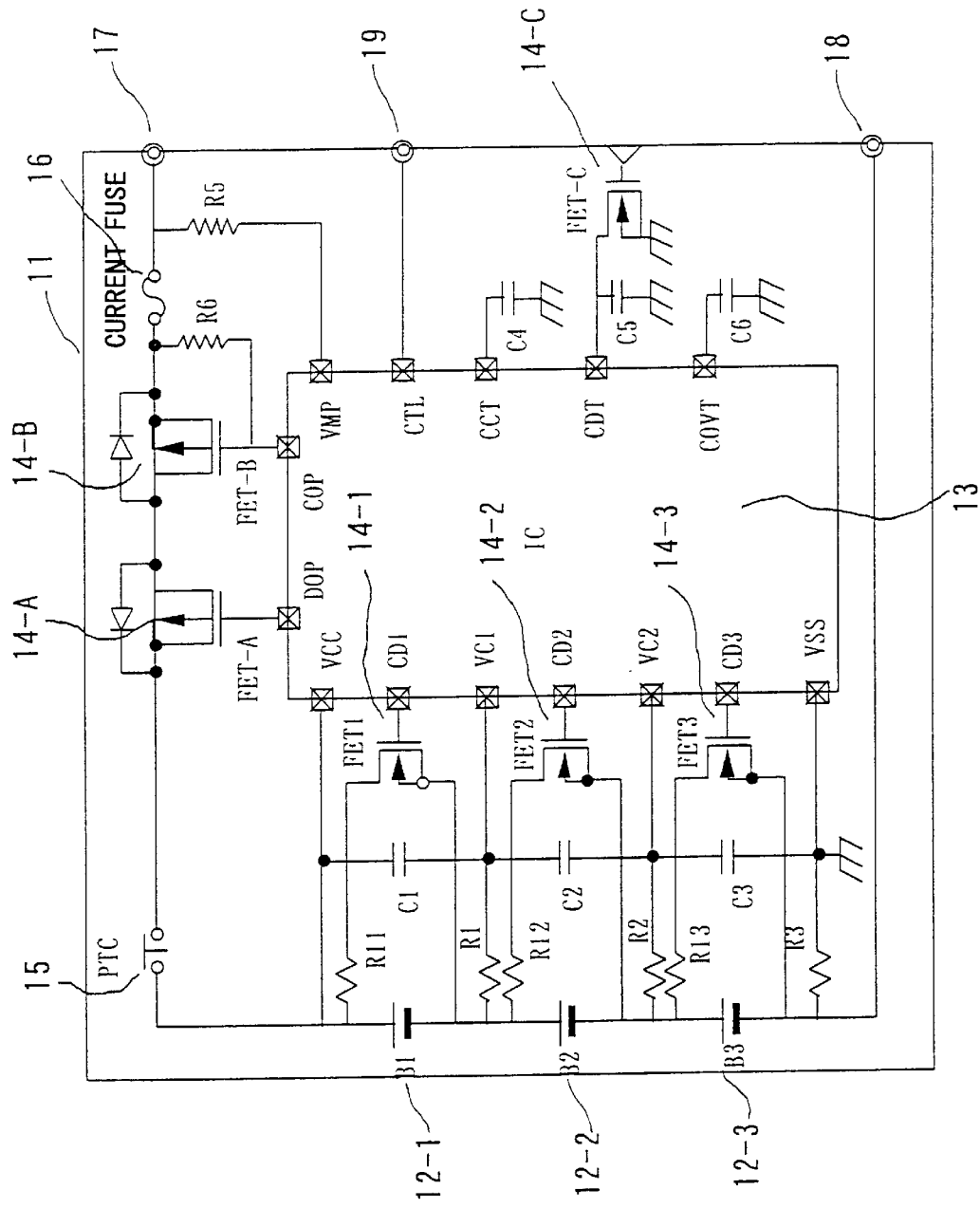
FIG. 3 shows a general circuit configuration of a Li-ion battery which includes a capability of degradation estimation of the present invention.

FIG. 3 shows a general circuit configuration of the Li-ion battery in which three Li-ion cells (12-1, 12-2, and 12-3) are connected in series.

In FIG. 3, 11 indicates the body of the battery and 12-1, 12-2, and 12-3 indicate the Li-ion cells. 13 indicates an IC for protection which monitors voltage, current, temperature and the like, and performs safety control. 14-1, 14-2, and 14-3 indicate FET for controlling charge current of each cell indicated by 12-1, 12-2, and 12-3. 14-A and 14-B indicate the FET controlling discharge and charge current of the battery. And, 14-C indicates the FET controlling earth current from the body. These FETs insulate the current in case of extraordinarily enormous current. 15 indicates a PTC (Positive Temperature Coefficient) element which is a temperature fuse which interrupts current when the temperature increases too much or when the current is large extraordinarily. 16 indicates a current fuse which interrupts current when the amount of current increases abnormally. 17 indicates a plus terminal, 18 indicates a minus terminal and 19 indicates a terminal for outputting information and controlling.

In FIG. 3, a timer is mounted in the IC 13 for protection in the above safety mechanism and the equation (1) is stored in an available memory beforehand. The IC 13 monitors the voltage across the Li-ion cells 12-1, 12-2, and 12-3 by using terminals Vcc and Vss and counts elapsed time t from the time when charge voltage in the CC mode reaches a start voltage Vs until the CC mode charge is changed to the CV mode charge wherein the start voltage Vs is determined beforehand such that it is equal to or higher than the discharge cut-off voltage Vd and lower than the charge limit voltage Vc. The IC 13 can monitor one of the voltages of each Li-ion cell, 12-1, 12-2, or 12-3 by using terminals VCC and VC1, VC1 and VC2, or VC2 and VSS, or can monitor the all voltages of each cells if necessary. Then, the counted time t is substituted into the equation (1) so that the estimated capacity Ce is calculated. An additional IC can be provided at a proper position in the battery if necessary. When the estimated capacity Ce (or estimated specific capacity Ce/Co) becomes smaller than a predetermined limit capacity Cmin (or limit specific capacity Cmin/Co), a warning (by using electronic signal in this case) which represents capacity degradation is output to the body of the apparatus which mounts the battery via the terminal 19 in order to display the warning on a display or sound an alarm.

When the body of the apparatus does not have any means of warning of degradation, it is favorable that the battery itself includes means of outputting the warning, for example, by displaying characters or an image, or sounding beep tones or a voice. Such a battery can be realized by applying the present invention and conventional technologies.

Accordingly, it becomes possible to provide the Li-ion battery which includes means of performing degradation estimation according to the present invention by modifying an existing Li-ion battery minimally. The configuration is not limited to that of the above mentioned Li-ion battery as long as the degradation estimation of the present invention is performed.

The degradation estimation method and the Li-ion battery which includes the degradation estimation capability of the present invention can be applied to apparatuses for which high reliability is required. By applying the present invention to the apparatuses, degradation status of cells can be grasped properly and the cells can be exchanged in a timely fashion so that troubles of the apparatuses can be avoided. However, there is no problem in that any apparatus which uses Li-ion cells adopts the degradation estimation method of the present invention. Accordingly, cells can be exchanged with minimum waste so that the present invention can be used very advantageously.

EXAMPLES IN THE FIRST EMBODIMENT

In the following, the capacity estimation method, the degradation estimation method and a degradation estimation apparatus for the Li-ion cell and the Li-ion battery will be described in more detail. However, the present invention is not limited to the following examples.

Example 1—1

An experiment was performed by using a cell charge and discharge automatic test apparatus which has data collection and data storing capability in order to obtain an equation for a prismatic Li-ion cell (the nominal capacity is 600 mAh). In the experiment, two kinds of temperatures 25° C. and 0° C. were used. The test cells were cycled 5 times by discharging at 600 mA (charge current ratio of 1.0C, 1.0 CmA) to 2.75V and charging in CC-CV mode at 600 mA (1.0 CmA) to 4.1V with intervals of one hour between charge and discharge. That is, the discharge and charge cycle was repeated 5 times. The charge period was 7 days when the temperature was 25° C. and the charge period was 3 hours when the temperature was 0° C.

In each cycle of charge and discharge, an elapsed time t from the charge start time to the end of CC mode charge and a specific capacity Cn/Co (n is a number assigned to each cycle) were measured. In this experiment, it is assumed that the voltage Vs is the same as charge voltage at the time when the CC mode charge starts.

Figure 4:
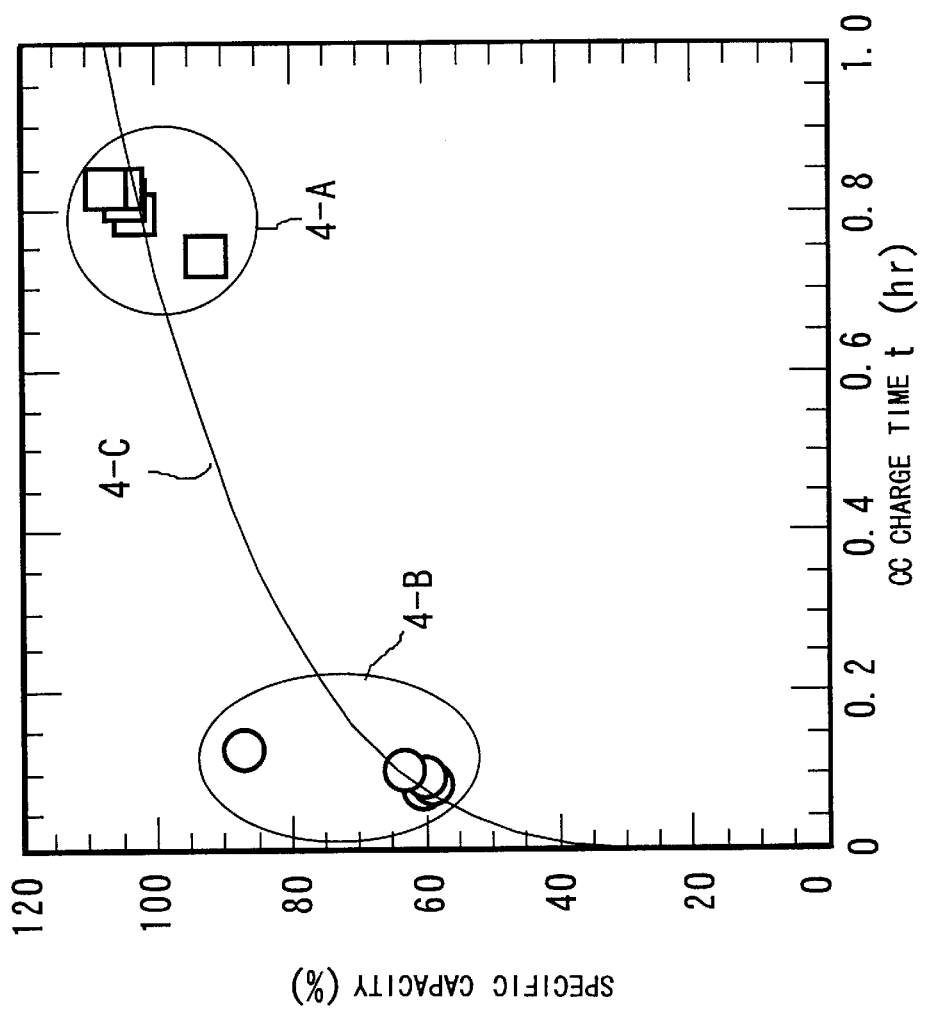
FIG. 4 shows relationship between elapsed time t and specific capacity which are obtained by the charge and discharge cycle experiment in an example 1—1.

FIG. 4 shows obtained data. FIG. 4 shows relationship between the elapsed times t and the specific capacities Cn/Co which are obtained by the charge and discharge cycle experiment. 4-A in FIG. 4 shows a group of data obtained from the test at 25° C., and 4-B in FIG. 4 shows a group of data obtained from the test at 0° C. The constants A and B in the equation (1) which is a function of t and which represents the estimated specific capacity Ce/Co are obtained by using the data so that a following equation (2) is prepared.

$$Ce/Co = 1.067 \times t^{0.228} \tag{2}$$

Strictly speaking, "t" in this equation (2) should be represented as (t/1 hour), that is, should be represented as a dimensionless number. However, in the equation (2), it is represented as simply t for the sake of convenience. The same goes for following equations.

The relationship which is represented by the equation (2) is indicated by 4-C in FIG. 4.

In order to verifying validity of the equation (2), a following experiment was performed.

In this experiment, the same kind of prismatic Li-ion cell (the nominal capacity is 600 mAh) was used. The test cells were cycled 5 times by discharging at 600 mA (1.0 CmA) to 2.75V and charging in CC-CV mode at 600 mA (1.0 CmA) to 4.1V for 3 hr with intervals of 10 minutes between charge and discharge.

In each cycle of charge and discharge, a time t (hr) necessary for the CC mode charge, and the ratio of discharge capacity Cn to the nominal capacity 600 mAh, that is, a specific capacity Cn/Co were recorded.

Figure 5:
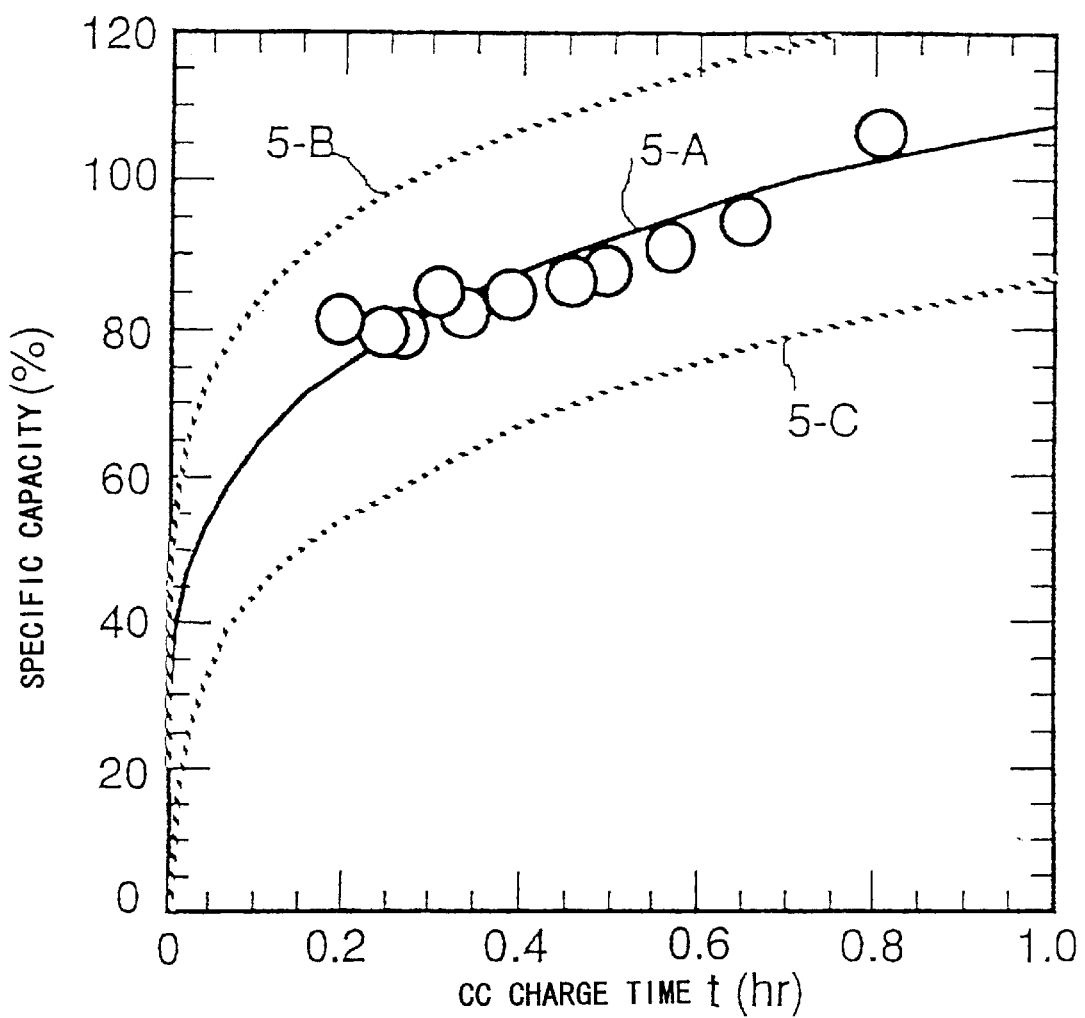
FIG. 5 shows relationship between CC charge time and specific capacity which are obtained by the charge and discharge cycles in the example 1—1.

The results are shown in FIG. 5. FIG. 5 shows the relationship between the CC mode charge times and the specific capacities Cn/Co which are obtained by the charge and discharge cycles. As shown in FIG. 5, results until the 11th cycle are plotted. In FIG. 5, 5-A indicates a curve represented by the equation (2) which is obtained by data shown in FIG. 4. 5-B indicates a curve which has 20% larger specific capacity values than those of 5-A (assuming +20% error). 5-c indicates a curve which has 20% smaller specific capacity values than those of 5-A (assuming −20% error).

As shown in FIG. 5, every plotted data is within the error range ±20%. In addition, the curve 5-A of the equation (2) is very close to each data point. Thus, it can be understood that the result of the degradation estimation is superior.

Example 1-2

An experiment was performed by using a cell charge and discharge automatic test apparatus which has data collection and data storing capability in order to obtain an equation for a prismatic Li-ion cell (the nominal capacity is 600 mAh). In this experiment, the cell was cycled in the same condition as the experiment for preparing the equation in the example 1—1. In each cycle of charge and discharge, an elapsed time t (hr) from the charge start time to the end of CC mode charge and a specific capacity Cn/Co were measured.

In this example, the constants A and B in the equation (1) of the necessary time t of the CC mode and the estimated specific capacity Ce/Co were obtained by using one set of data for each experiment in 0° C. and 25° C. so that a following equation (3) was prepared.

$$Ce/Co = 1.089 \times t^{0.114} \tag{3}$$

In order to verifying validity of the equation (3), a following experiment was performed.

In this experiment, the same kind of prismatic Li-ion cell (the nominal capacity is 600 mAh) was used. The test cells were cycled 12 times by discharging at 600 mA (1.0 CmA)

to 2.75V and charging in CC-CV mode at 600 mA (1.0 CmA) to 4.1V for 3 hr with intervals of 10 minutes between charge and discharge.

In each cycle of charge and discharge, a time t (hr) necessary for the CC mode charge, and the ratio of discharge capacity Cn to the nominal capacity 600 mAh, that is, a specific capacity Cn/Co were recorded.

The equation (3) was applied to the charge and discharge cycle experiment results obtained like this so that maximum and minimum errors were obtained. The maximum error was −21.7% and the minimum error was −1.0%.

In the same way, equations were prepared by using 2 sets of data, 3 sets of data, 5 sets of data, 10 sets of data, 11 sets of data and 15 sets of data respectively for each of 0° C. and 25° C. Then, each equation was applied to the above mentioned experiment results so that maximum and minimum errors were obtained. Accordingly, the accuracy of the equation according to the number of data sets was verified.

Figure 6:
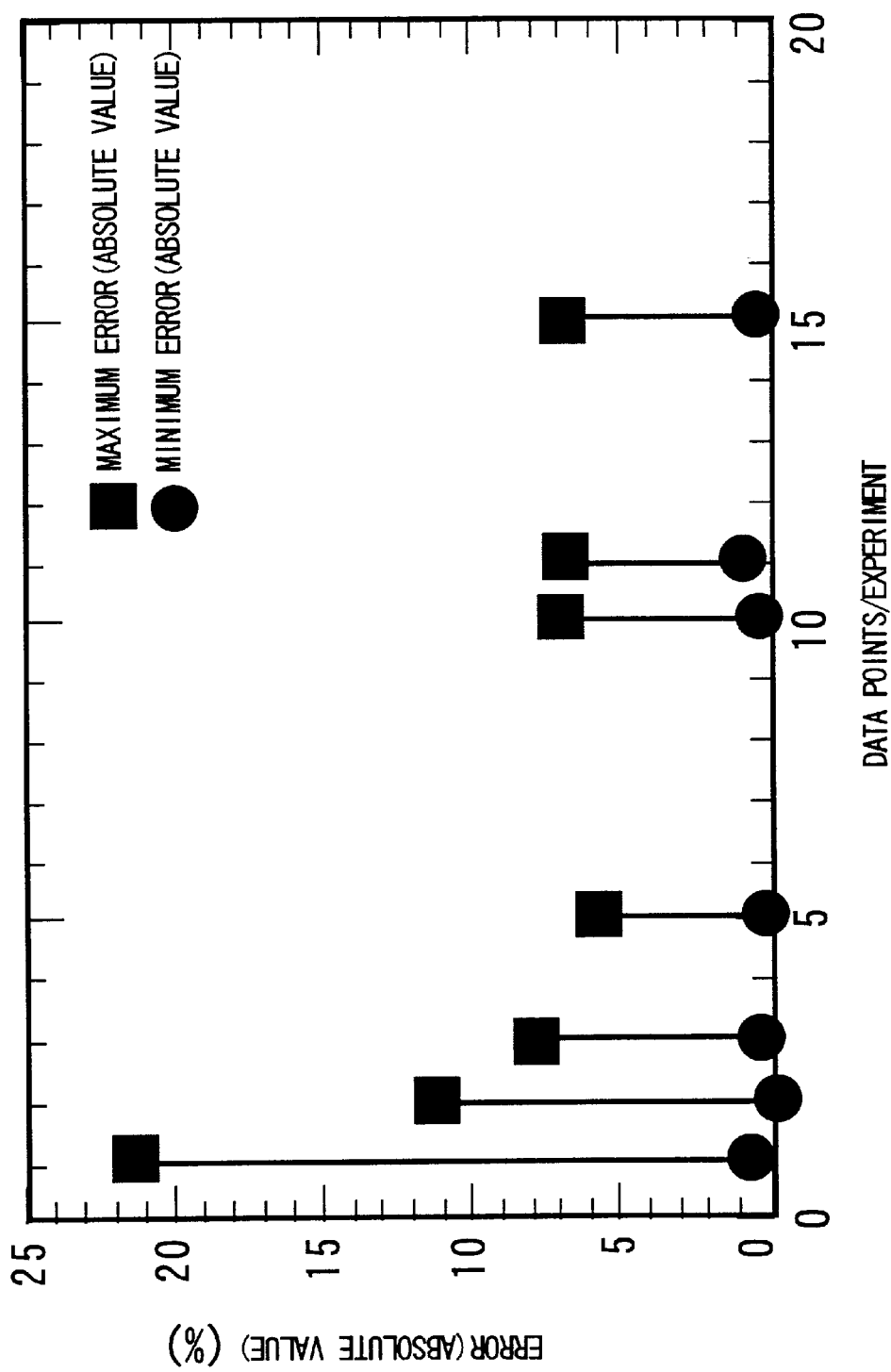
FIG. 6 shows the number of data sets used for preparing equations of an example 1-2 and widths of absolute value of error where the upper limit indicates the maximum error (absolute value) and the lower limit indicates the minimum error (absolute value)

The result is shown in FIG. 6. FIG. 6 shows the number of data sets used for preparing the equations and widths of absolute value of error where the upper limit indicates the maximum error (absolute value) and the lower limit indicates the minimum error (absolute value).

As is evident from FIG. 6, by using equal to or more than 2 sets of data for each experiment of 0° C. and 25° C. for preparing the equation, accurate equation can be prepared so that the error falls within ±20%. By using an equation prepared by using one set of data for each experiment of 0° C. and 25° C., the error may exceed ±20% which is unfavorable. In addition, it is revealed that accuracy of an equation prepared by using equal to or more than 11 sets of data for each experiment is almost the same as that prepared by using from 2 sets of data to 10 sets of data.

Example 1-3

An experiment was performed in order to obtain an equation by using the same kind of prismatic Li-ion cell as was used in the example 1—1. In the experiment, two kinds of temperatures 25° C. and 0° C. were used. In each of the temperatures 25° C. and 0° C., the test cells were cycled 5 times by discharging at 600 mA (discharge current ratio was 1.0C, 1.0 CmA) to 2.75V and charging in CC-CV mode at 600 mA (charge current ratio was 1.0C, 1.0 CmA) to 4.1V for 7 days with intervals of one hour between charge and discharge.

In each cycle of charge and discharge, an elapsed time t (hr) from the charge start time to the end of CC mode charge and a specific capacity Cn/Co (n is a number assigned to each cycle) were measured. According to this experiment, a following equation (4) was obtained.

$$Ce/Co = 1.015 \times t^{0.0794} \quad (4)$$

In order to verify validity of the equation (4), a following experiment was performed.

In this experiment, the same kind of used prismatic Li-ion cell as that used for preparing the equation was collected and used for the experiment. The test cells were cycled 3 times by discharging at 600 mA (1.0 CmA) to 2.75V and charging in CC-CV mode at 600 mA (1.0 CmA) to 4.1V for 3 hr with intervals of 10 minutes between charge and discharge. In each cycle of charge and discharge, a time t (hr) necessary for the CC mode charge, and a specific capacity Cn/Co of the discharge capacity Cn to the nominal capacity 600 mAh were recorded.

By applying data obtained by this experiment, the accuracy of the equation (4) was verified.

Figure 7:
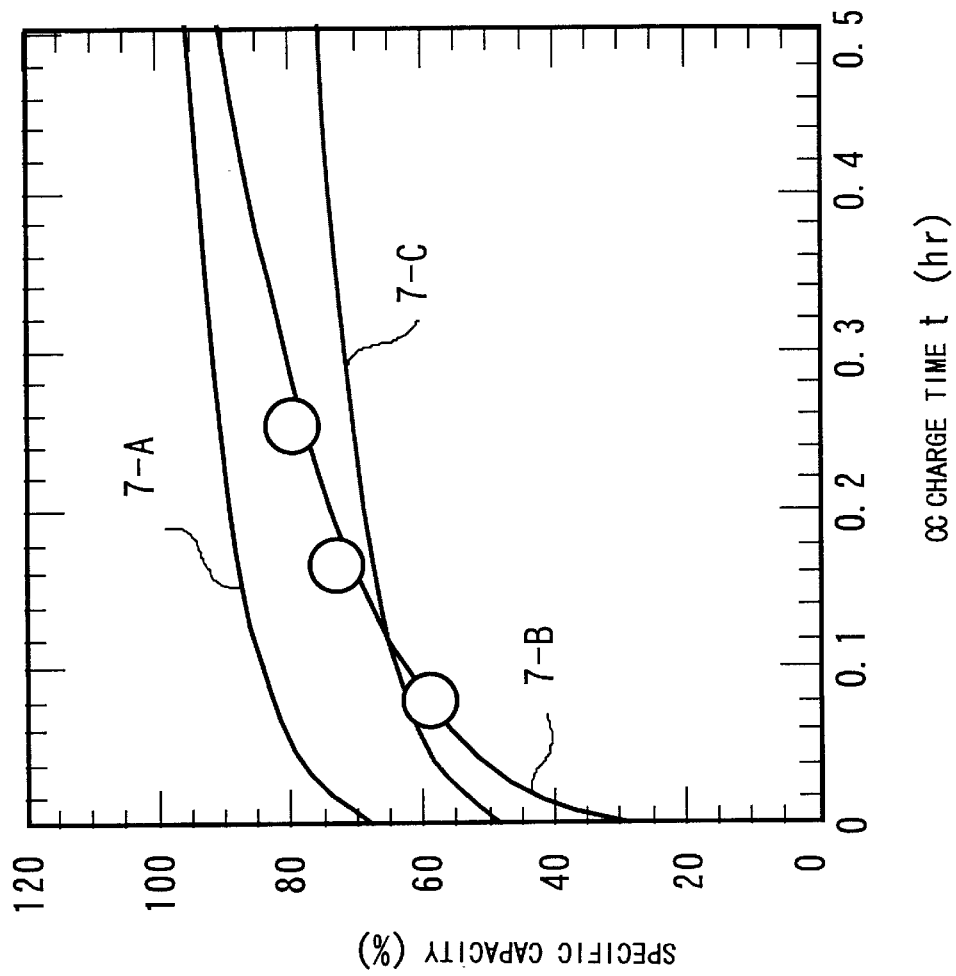
FIG. 7 shows relationship between CC charge time and specific capacity obtained in an example 1-3.

The result of verification is shown in FIG. 7. FIG. 7 shows the relationship between the CC mode charge time and the specific capacities Cn/Co for the degraded cell. In FIG. 7, 7-A indicates a curve represented by the equation. 7-B, which is shown for comparison, indicates a curve represented by the equation (2) prepared in the example 1—1. 7-C indicates a curve which has 20% smaller specific capacity values than those of the equation (4), that is, a curve indicating error of −20%.

As is evident from FIG. 7, the curve 7-B indicating the equation (2) exists very close to each obtained data, which shows that the accuracy of the estimation is high. On the other hand, as for the equation (4) obtained by this example, the curve deviates by much amount from data. In addition, as for the equation (4), data exists at a position which is lower than −20% error position, which is unfavorable. That is, it can be understood that the equation (2) prepared in the example 1—1 is more suitable for capacity estimation than the equation (4) prepared in this example.

Example 1-4

An experiment was performed in order to obtain an equation by using the same kind of prismatic Li-ion cell as was used in the example 1—1. In the experiment, two kinds of temperatures 25° C. and 0° C. were used. In each of the temperatures 25° C. and 0° C., the test cells were cycled 5 times by discharging at 600 mA (discharge current ratio was 1.0C, 1.0 CmA) to 2.75V and charging in CC-CV mode at 60 mA (charge current ratio was 0.1C, 0.1 CmA) to 4.1V for 3 hr with intervals of one hour between charge and discharge.

In each cycle of charge and discharge, an elapsed time t (hr) from the charge start time until the end of CC mode charge and a specific capacity Cn/Co (n is a number assigned to each cycle) were measured. According to this experiment, a following equation (5) was obtained.

$$Ce/Co = 1.046 \times t^{0.219} \quad (5)$$

In order to verify validity of the equation (5), a following experiment was performed.

In this experiment, the same kind of used prismatic Li-ion cell as that used for preparing the equation (5) was collected and used for this experiment. The test cells were cycled 4 times by discharging at 600 mA (1.0 CmA) to 2.75 V and charging in CC-CV mode at 60 mA (0.1 CmA) to 4.1V for 30 days with intervals of one hour between charge and discharge. In each cycle, CC mode charge time (hr), and a specific capacity Cn/Co of the discharge capacity Cn to the nominal capacity 600 mAh were recorded.

By applying data obtained by this experiment, the accuracy of the equation (5) was verified.

Figure 8:
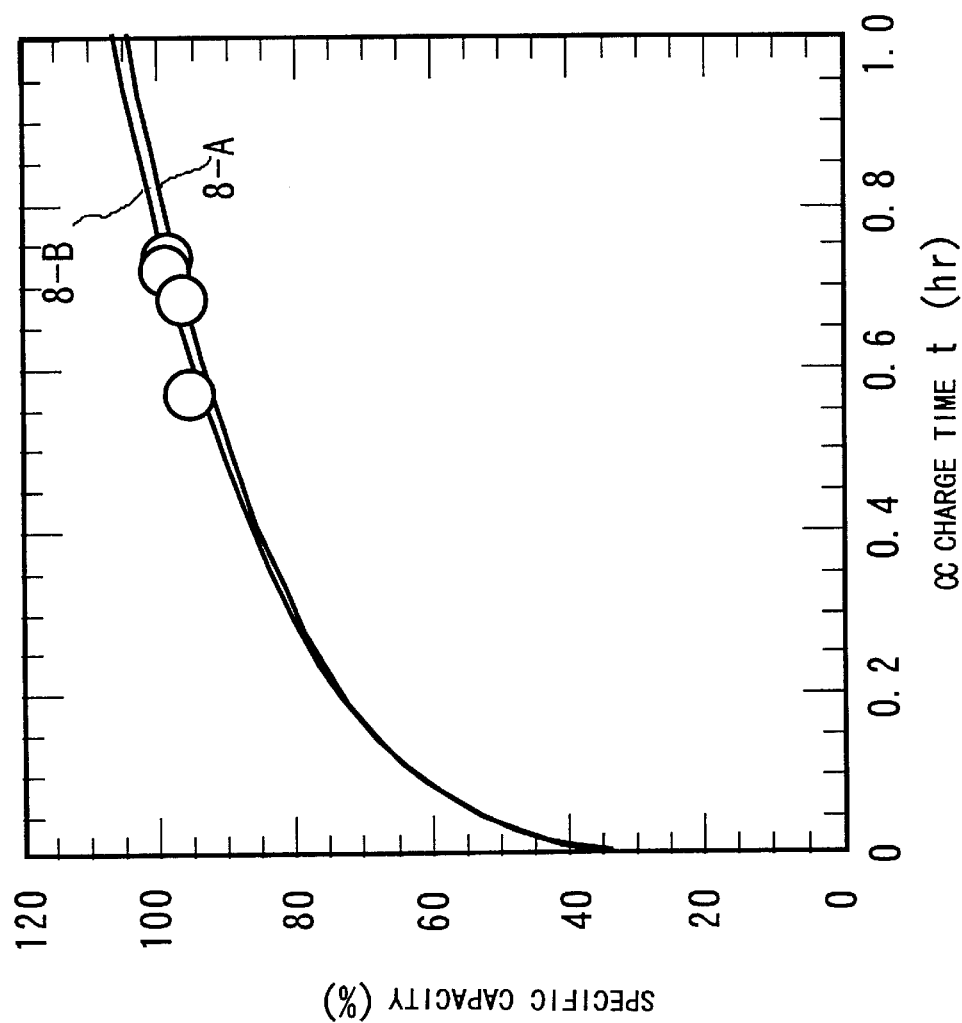
FIG. 8 shows relationship between CC charge time and specific capacity obtained in an example 1-4.

The result of verification is shown in FIG. 8. FIG. 8 shows the relationship between the CC mode charge times and the specific capacities Cn/Co for the degraded cell. 8-A indicates a curve representing the equation (5). 8-B, which is shown for comparison, indicates a curve representing the equation (2) prepared in the example 1—1.

As is evident from FIG. 8, both of the curves of the equation (5) prepared in this example and the equation (2) which is a comparison example prepared in the example 1—1 exist near the data, which shows that both equations have favorable high accuracy. More precisely, it can be seen that the equation (2) enables more accurate degradation estimation than the equation (5). Therefore, it is understood that the range from 3 days to 10 days of the charge period is more favorable than the range from 3 hours to 10 days for the test at higher temperature.

Example 1-5

An experiment was performed for a 18650 size cylindrical Li-ion cell (the nominal capacity was 1400 mAh). In this experiment, two kinds of temperatures 30° C. and 5° C. were used. The test cells were cycled 4 times by discharging at 2800 mA (2.0 CmA) to 2.75V and charging in CC-CV mode at 1400 mA (1.0 CmA) to 4.1V with intervals of one hour between charge and-discharge. When the temperature was 30° C., 7 values from 2.5 hours to 11 days were used for the charge period per one cycle. The 7 values are shown in FIG. 9. When the temperature was 5° C., the charge period per one cycle was set to be 5 hours.

In each cycle of charge and discharge, an elapsed time t (hr) from the time when the charge voltage was 3.50V until the end of CC mode charge and the specific capacity $C_n/C_o$ were recorded.

This experiment was performed for 21 days. The constants A and B in the equation (1) of t and $C_e/C_o$ were determined by using sets of data in 30° C. and the same number of sets of data in 5° C. obtained in this experiment so that a equation was prepared. When equal to or more than five sets of data were obtained for each of 30° C. and 5° C., the equation was prepared from five sets of data for each of 30° C. and 5° C.

In addition, when the charge period was set to be 7 days in 30° C. experiment temperature, another experiment was performed in which the charge current was set as 46 mA (0.033 CmA). A time t from the charge voltage of 3.5V until the end of the CC mode charge was obtained. As a result, $t(1.0)/t(0.033)=0.030$ was obtained as conversion ratio of the CC mode necessary time by using 1400 mA (1.0 CmA) to the CC mode charge time by using 46 mA (0.033 CmA) as the charge current.

Additionally, a following experiment was performed.

In this experiment, a used 18650 size cylindrical Li-ion cell (the nominal capacity was 1350 mAh) was collected and set in the charge and discharge automatic test apparatus. Then, charge of the CC-CV charge method was performed wherein the charge limit voltage was 4.1V, the charge current was 44.6 mA (0.033 CmA) and the charge period was 7 days. Next, discharge was performed wherein discharge current was 2700 mA (2.0 CmA) and the discharge cut-off voltage was 2.75V. Then, a time t' (hr) elapsed from the instant when the charge voltage was 3.5V to the instant when the CC mode charge ended and the ratio of discharge capacity $C_m$ to the nominal capacity $C_o$, that is, a specific capacity $C_m/C_o$ were recorded. Then, a value of t calculated by $t=t' \times (t(1.0)/t(0.033))=0.030$ t' was substituted into each above mentioned equation so that the estimated specific capacity $C_e/C_o$ was calculated. After that, absolute value of $Err=(C_e/C_o-C_m/C_o)$, that is, absolute value of difference between the estimated specific capacity $C_e/C_o$ and the actual measurement specific capacity $C_m/C_o$ was obtained.

The result is shown in FIG. 9. FIG. 9 is a table showing each charge period per one cycle used for preparing the equations of this example, the number of sets of data for each experiment, prepared equations and absolute values of estimation errors calculated by applying the equations.

As is evident from FIG. 9, when any charge period from 3 hours to 10 days, which is a condition of the present invention for preparing the equation, is used, the estimation error is within ±20% which shows favorable high accuracy. On the other hand, when any charge period smaller than 3 hours or larger than 10 days is used, large error which exceeds ±20% occurs which shows that there is a problem in estimation accuracy.

Example 1-6

An experiment was performed for a 18650 size cylindrical Li-ion cell (the nominal capacity is 1400 mAh). In this experiment, the test cells were cycled 5 times by discharging at 2800 mA (2.0 CmA) to 2.75V and charging in CC-CV mode at 1400 mA (1.0 CmA) to 4.1V with intervals of one hour between charge and discharge. In this experiment, temperatures were 20° C. for higher temperature test, and −11° C., −10° C., 0° C., 5° C., 6° C., and 15° C. for lower temperature tests. Charge period was 7 days for the higher temperature tests and 5 hours for the lower temperature tests. 2 cycles were performed for each temperature. In each cycle, an elapsed time t (hr) of the CC mode charge and the specific capacity $C_n/C_o$ were recorded.

The constants A and B in the equation (1) of t and $C_e/C_o$ were determined by using two sets of data for the higher temperature (20° C.) test and the lower temperature test. Thus, six equations were obtained.

In addition, as another higher temperature test, the test cell was cycled under the same condition as above mentioned, except charge current of 46 mA (0.033 CmA) instead of 1400 mA (1.0 CmA), and charge limit voltage of 3.5V instead of 4.1V. As a result, $t(1.0)/t(0.033)=0.029$ was obtained as conversion ratio of the elapsed time by using 1400 mA (1.0 CmA) to the elapsed time by using 46 mA (0.033 CmA).

Additionally, a following experiment was performed.

In this experiment, a used 18650 size cylindrical Li-ion cell (the nominal capacity is 1350 mAh) was collected and set in the charge and discharge automatic test apparatus. Then, charge of the CC-CV charge method was performed wherein the charge limit voltage was 4.1V, the charge current was 44.6 mA (0.033 CmA) and the charge period was 7 days in the same way as the example 1-5. Next, discharge was performed wherein discharge current was 2700 mA (2.0 CmA) and the discharge cut-off voltage was 2.75V. Then, a time t' (hr) elapsed from the instant when the charge voltage was 3.5V to the instant when the CC mode charge ended and the ratio of discharge capacity $C_m$ to the nominal capacity $C_o$, that is, a specific capacity $C_m/C_o$ were recorded.

Then, a value of t calculated by $t=t' \times (t(1.0)/t(0.033))=0.029t'$ was substituted into each of above mentioned six equations so that the estimated specific capacities $C_e/C_o$ were calculated, wherein $t(1.0)/t(0.033)=0.029$ was the above mentioned conversion ratio. After that, absolute value of $Err=(C_e/C_o-C_m/C_o)$, that is, absolute value of difference between the estimated specific capacity $C_e/C_o$ and the actual measurement specific capacity $C_m/C_o$ was obtained.

The result is shown in FIG. 10. FIG. 10 is a table showing each temperature for the lower temperature tests used for preparing the equations of this example, obtained equations, and absolute values of estimation errors calculated by applying the equations.

As is evident from FIG. 10, when the temperature is set from −0° C. to 5° C. for the lower temperature tests and the temperature difference between the higher and lower temperature tests is equal to or higher than 15° C., the estimation error is within ±20% which shows favorable high accuracy.

Example 1-7

In this example, a charger which charges a battery by using the constant current and constant voltage charge (CC-CV) method and performs capacity and degradation estimation of the battery was manufactured and will be shown.

The battery includes three prismatic Li-ion cells (nominal capacity of each is 600 mAh) which are connected in series. In the CC-CV charge method used by the charger for charging the battery, the charge limit voltage is 12.3V, the charge current is 600 mA (1.0 CmA) and charge-end current which is a threshold for ending charge is 60 mA.

Figure 11:
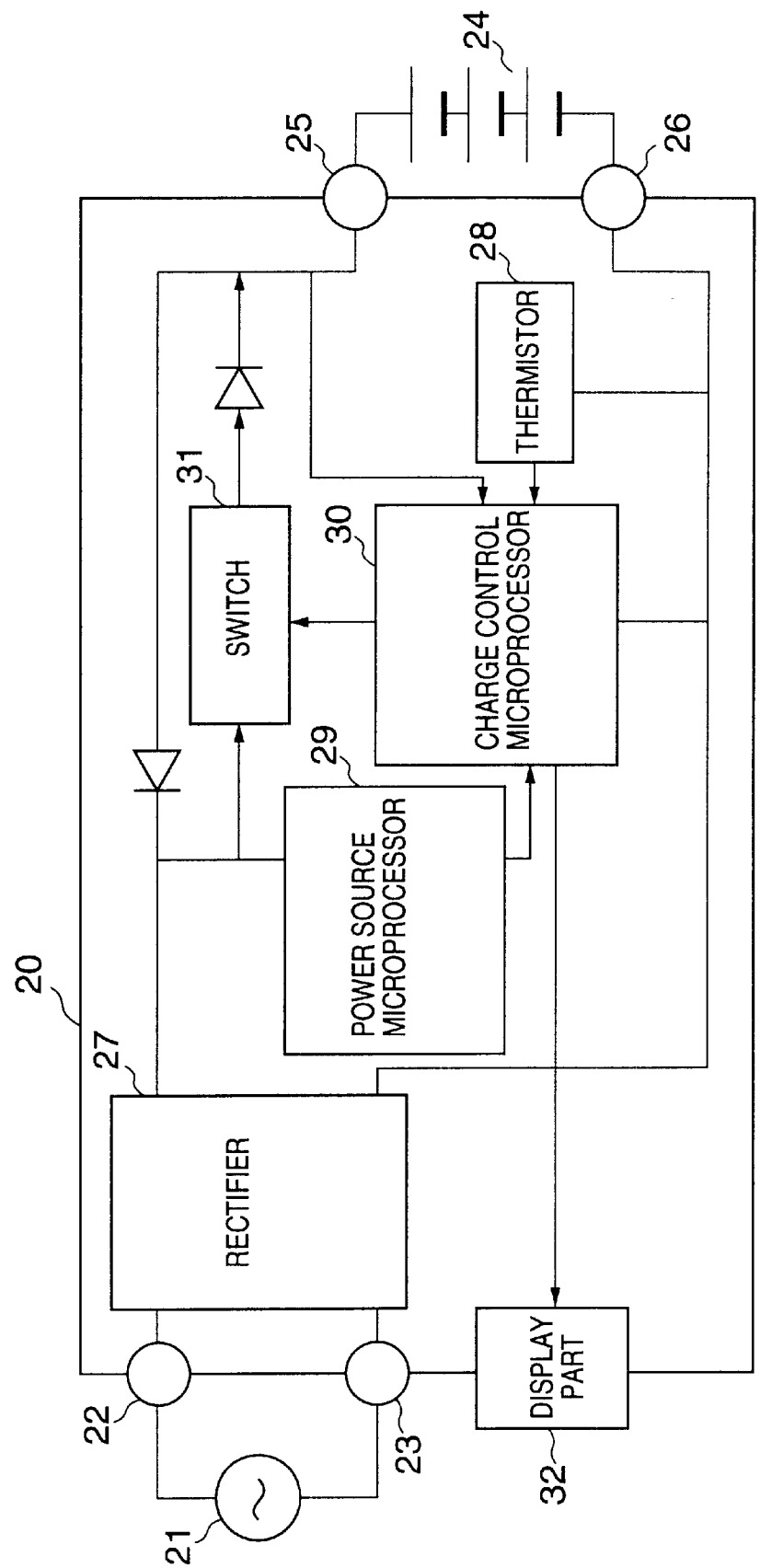
FIG. 11 shows a configuration of a charger according to an embodiment 1-7.

A schematic diagram of the charger is shown in FIG. 11. That is, FIG. 11 shows a configuration of the charger according to this embodiment. As shown in FIG. 11, the charger 20 is connected to a utility power source by terminals 22 and 23. A Li-ion battery 24 can be connected to the charger 20 via terminals 25 and 26 for charging. The battery 24 is charged in the following way.

The charger 20 converts current provided from the utility current source 21 into direct current by a rectifier 27. The charger 20 controls the above mentioned charge conditions by using a power source microprocessor 29 and a charge control microprocessor 30 while monitoring charge current, battery voltage, and monitoring temperature by a thermistor 28. In addition, the charger 20 performs control for detecting and avoiding overcharge, over discharge, abnormal large current, abnormal battery temperature increase and the like by using the power source microprocessor 29 and the charge control microprocessor 30.

The charge is stopped by a switch 31 when the charge is completed or when something abnormal is detected. Completion of charge or something abnormal is displayed to a display part 32 by using the charge control microprocessor 30. The display part 32 includes LEDs (light-emitting diodes) which indicate a state of charge (red one is used for indicating a charging state, green one is used for indicating completion of charge), LEDs which indicate degradation estimation results (red one is used for indicating the cell should be replaced, yellow one is used for indicating the cell should be replaced shortly, green one is used for indicating replacement of the cell is not necessary) and an LCD (liquid crystal display) which displays the degradation estimation results numerically and abnormal events.

As for the LEDs for indicating the state of charge, the green LED illuminates only when the charge completes. During charge, the red LED illuminates. In other cases, that is, in abnormal cases, either of the LEDs does not illuminate.

As for the LEDs for indicating the degradation estimation results, the red LED illuminates when the estimated specific capacity Ce/Co is smaller than 60%, which means that the battery should be replaced by a new battery. The yellow LED illuminates when the estimated specific capacity Ce/Co is equal to or larger than 60% and smaller than 70%, which indicates that the battery should be replaced within several months which depend on using condition. The green LED illuminates when the estimated specific capacity Ce/Co is larger than 70% since the battery is new or can be used for a long time which means that replacement of the battery is not necessary.

The LCD (liquid crystal display) is provided for the sake of displaying information by characters. For example, faulty connection of the battery, alarm information on safety and the like are displayed on the LCD, by which it can be recognized that normal charge is difficult. In addition, degradation estimation results are shown on the LCD. Further, in the case that the utility power source stops to provide power unexpectedly, power is supplied from the battery placed in the charger so that information of the outage of the utility power source is displayed only when the voltage of the battery is higher than 8.25V.

Figure 12:
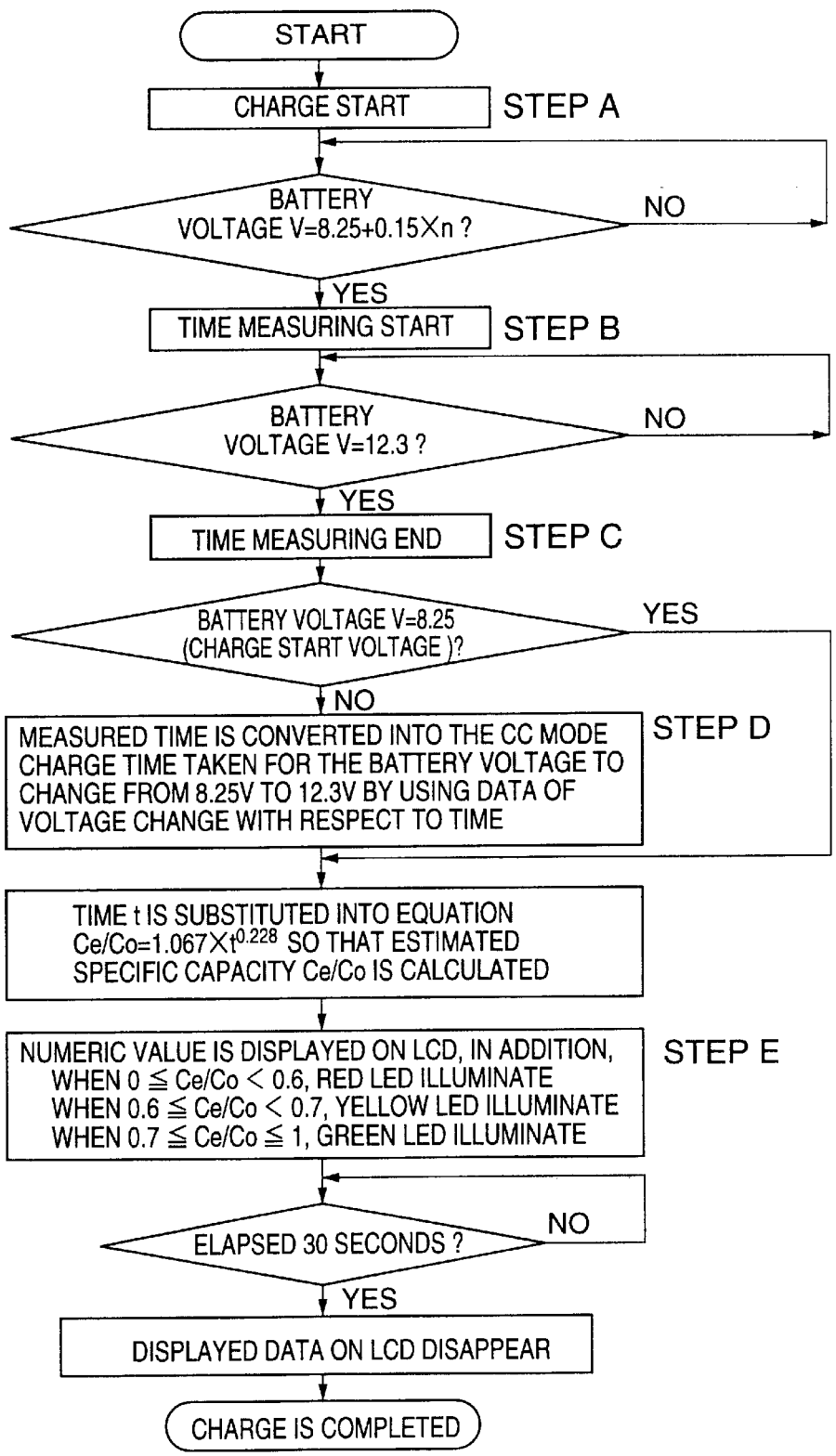
FIG. 12 is a flowchart showing degradation estimation procedures performed in an experiment 1-7.

For performing degradation estimation of the present invention, a program embodying the equation (2) and procedures shown in FIG. 12 is stored in the charge control microprocessor 30 beforehand. The degradation estimation is performed by measuring CC charge time t by the internal timer while monitoring the battery voltage and substituting the time t into the equation (2). The estimation result is displayed on the display part 32.

As for the charger of this example, since charge is not necessarily performed after complete discharge, the degradation estimation is performed in the following way.

Data of change of charge voltage with respect to time is stored in the charge control microprocessor beforehand. The battery voltage is monitored from the start of charge. Time measuring is started from the time when the charge voltage becomes a voltage which is higher than the start voltage and is nearest to a value of $8.25+0.15 \times n$ (n is an integer, $0 \leq n \leq 25$) which is between or equal to 8.25V (2.75 V/cell) and 12V (4.0 V/cell) and increases in steps of 0.15V. Then, an elapsed time t" until the charge voltage reaches the charge limit voltage 12.3V (until CC mode charge ends) is measured. After that, the charge time t" from the above start voltage to 12.3 V is converted into the CC mode charge time t from 8.25 V to 12.3 V by using the voltage-profile data stored in the charge control microprocessor 30.

Next, the procedures for degradation estimation stored in the charge control microprocessor 30 shown in FIG. 12 will be described.

(step A) The charge is started by placing the battery in the charger so that the battery voltage is monitored. It is monitored whether the battery voltage V reaches a value which satisfies $V=8.25+0.15 \times n$ (n is an integer, $0 \leq n \leq 25$) (6).

(step B) When the battery voltage reaches the value which satisfies the equation (6), time measuring is started. The time is counted until the battery voltage reaches the charge limit voltage 12.3V.

(step C) When the battery voltage reaches the charge limit voltage 12.3V, the time measuring ends. When the charge start voltage is the discharge cut-off voltage 8.25V, the measured time t is used for degradation estimation.

(step D) When the charge start voltage is higher than 8.25V, the measured time is converted into the CC mode charge time taken for the battery voltage to change from 8.25V to 12.3V by comparing measured data with data of voltage change with respect to time which is stored beforehand. The converted time t is used for degradation estimation. The time t is substituted into the equation (2) so that the estimated specific capacity Ce/Co is calculated.

(step E) The calculation result is displayed on the LCD and the LED. According to the estimated specific capacity, one of red, yellow and green LEDs illuminates. At the same time, a numeric value is displayed on the LCD. The value is displayed on the LCD for 30 seconds and the LED illuminates the charger is connected to the utility power source.

By using this charger, a used battery of the same type was charged. The degradation estimation result was displayed 4.5 minuets after the start of charge. "65%" was displayed on the LCD and the yellow LED illuminated. The charge was completed in 2.5 hours. Then, the charged battery was mounted in the battery charge and discharge automatic test apparatus so that constant current discharge was performed wherein the discharge current was set to be 600 mA (1.0 CmA) and the discharge cut-off voltage was set to be 8.25V. The discharge capacity was 414.2 mAh according to this test. This value is equivalent to 69% in specific capacity, which revealed that the error of capacity estimation was about 4%.

Accordingly, it is evident that the charger having capabilities of the present invention can estimate degradation in high accuracy.

Example 1-8

Li-ion battery shown in FIG. 3 was manufactured. The Li-ion battery can be mounted in a portable information terminal which has a capability of performing the CC-CV mode charge on condition that the charge limit voltage is 12.3V, charge current is 600 mA (1.0 CmA) and the charge-end current is 60 mA. The battery includes three prismatic Li-ion cells (nominal capacity is 600 mAh) 12-1, 12-2, and 12-3 which are connected in series. The equation (2) and the data of change of charge voltage with respect to time as described in the example 1-7 are stored in the IC for protection such that the CC mode charge time taken for the charge voltage to change from 8.25V to 12.3V can be calculated even when the battery voltage at the charge start time is higher than the discharge cutoff voltage 8.25V.

In addition, a program is stored in a memory in the IC 13 for protection. According to this program, following process is performed. The voltage across the cells is monitored by using Vcc and Vss. Time measuring is started from the time when the charge voltage becomes a voltage which is higher than a charge start voltage Vs and is nearest to a value of 8.25+0.15×n (n is an integer, $0 \leq n \leq 25$) which is higher than the charge start voltage Vs, wherein the charge start voltage Vs which is determined beforehand is equal to or higher than the discharge cut-off voltage Vdd and lower than the charge limit voltage Vc. Then, an elapsed time t" until the charge voltage reaches the charge limit voltage 12.3V is measured. After that, the time t" is converted into the CC mode charge time t taken for the voltage to change from 8.25V to 12.3V. The time t is substituted into the equation (2) so that the estimated specific capacity Ce/Co is calculated.

The battery is configured such that the result is output to the body of the portable terminal in order to be displayed on an LCD of the portable terminal via the terminal 19.

On the LCD, a numerical value indicating the estimation result is displayed as % and a bar in which a part of the bar corresponding to the % value ratio is colored is displayed.

A command for doing degradation estimation is provided from the body of the terminal concurrently with the start of charge. Procedures for performing the degradation estimation are the same as those shown in FIG. 12 except for the result to be sent to the body since the result is displayed on the display of the terminal.

The battery was mounted in the portable information terminal and used for one hour. After that, charge of the battery was started by connecting the terminal to the utility power source. The estimation result of the battery was displayed as 87% right after the start of the charge. After checking that a sign of charge completion was displayed, the information terminal was powered off and the battery was removed from the terminal. Then, the battery was connected to the battery charge and discharge automatic test apparatus by using proper codes and the discharge capacity was measured by discharging the battery on condition that the discharge current was 600 mA (1.0 CmA) and the discharge cut-off voltage was 8.25V. The discharge capacity was 534.6 mAh, which is 89.1% in specific capacity. Thus, the error of estimation was ±2.1%.

Therefore, it became evident that the degradation estimation capability of the battery of the present invention can provide estimation result with high accuracy.

(Second Embodiment)

Next, the second embodiment of the present invention will be described. In the second embodiment, capacity estimation is performed by using equations simpler than those of the first embodiment.

(Outline of the Second Embodiment)

The outline of the second embodiment will be described in the following.

The capacity estimation method of the Li-ion cell according to the second embodiment includes the steps of:

obtaining, when the Li-ion cell is charged by a constant current and constant voltage charge method (in the following, the constant current and constant voltage charge method will be called as CC-CV charge method), an elapsed time t from the instant when charge voltage in constant current charge (in the following, the constant current charge will be called as CC charge) reaches a predetermined voltage Vs to the instant when the charge voltage reaches a charge limit voltage Vc, wherein charge current is equal to or smaller than Co/(20 hours) wherein Co is a nominal capacity of the Li-ion cell; and calculating an estimated specific capacity Ce/Co of the Li-ion cell by using an equation Ce/Co=At+B (7), wherein Ce is an estimated capacity of the Li-ion cell, and A and B are positive constants.

That is, when performing charge by the CC-CV charge method shown in FIG. 1, a time t elapsed from the time when the charge time reaches a voltage Vs until CC charge starts (that is, the charge voltage reaches Vc) is monitored, wherein the voltage Vs is between or equal to the discharge cut-off voltage Vd and the charge limit voltage Vc. Then, the estimated specific capacity Ce/Co of the Li-ion cell is calculated from the equation (7) by using t.

In this case, the constant current Ic is set to be smaller or equal to Co/(20 hours) in order to estimate the capacity of the cell accurately. If the charge is performed by using a current larger than this, error becomes large in capacity estimation by using the equation (7).

In addition, it is favorable that the Li-ion cell which is a target of the capacity estimation of the present invention is a Li-ion cell which is used in a condition that each charge period is equal to or shorter than 30 days. When the charge period is longer than 30 days, large estimation error may arise since degree of degradation due to overcharge may vary and degradation of cell component material with respect to time becomes outstanding.

Further, it is favorable that the charge voltage Vs at the time when time measuring is started is equal to or higher than the discharge cut-off voltage Vd and at least 0.2V lower than the charge limit voltage Vc. When the difference between the voltage Vs and the charge limit voltage Vc is lower than 0.2V, measured time t becomes so short that large estimation error may occur.

The equation of this embodiment is applied to capacity estimation only when cell degradation is such state that discharge capacity C is equal to or more than 50% of the nominal capacity Co, wherein the discharge capacity C is obtained by integrating discharge current with respect to time when discharging from full charge state to the discharge cut-off voltage Vd. When the cell is degraded largely such that the specific capacity C/Co is lower than 50%, the relationship between the elapsed time t and the specific capacity C/Co does not become linear as indicated in the equation (7) so that error of capacity estimation by using the equation becomes large, which is not favorable.

The equation (7) represents relationship between the time t in the constant current (CC) mode charge in a charge condition of an apparatus mounting the Li-ion cell or a charger to which the equation is applied and an estimated specific capacity Ce/Co under the charge condition. When the charge current value in the CC mode for obtaining the equation (7) is different from the charge current value in the CC mode of the apparatus or the charger, following processes need to be performed.

The time t is obtained under each charge condition beforehand. Then, after obtaining a ratio te/tm wherein the time te is obtained under the condition for preparing the equation (7) and the time tm is obtained under a condition which corresponds to the apparatus or the charger, a result of multiplying measured time by the ratio te/tm is substituted into the equation (7). The reason is the same as one explained in the first embodiment.

As in the case of the first embodiment, it is most appropriate to determine the constants A and B by using the same kind of a cell or a battery as the Li-ion cell or battery for which capacity is estimated.

Thus, in this embodiment, the positive constants A and B are calculated by the steps of:

repeating a charge and discharge cycle at least equal to or more than three times by using the same kind of Li-ion cell as a Li-ion cell which is a target of capacity estimation, wherein the charge and discharge cycle includes a charge period from 3 days to 10 days by the CC-CV charge method, a discharge period, a rest period provided between the charge period and the discharge period as necessary, wherein charge current in the charge period is equal to or smaller than $Co/(20$ hours), discharge current in the discharge period is from $Co/(5$ hours) to $Co/(0.5$ hour) and a predetermined discharge cut-off voltage Vd is used in the discharge period;

obtaining an elapsed time tn from the instant when charge voltage in CC charge reaches a predetermined voltage Vs to the instant when the charge voltage reaches a charge limit voltage Vc and discharge capacity Cn in each cycle; and determining values of the constants A and B from the elapsed time tn and the discharge capacity Cn.

To be more specific, a cell or a battery which is the same kind as the Li-ion cell for which capacity is estimated is used. Charge is performed by the CC-CV charge method in which the cell is charged by using a constant current equal to or smaller than 0.05 CmA (Co/20 hours) until the charge voltage reaches the charge limit voltage Vc, after that, the charge is continued by using a constant voltage. Charge period is set to be from 3 days to 30 days. As for discharge, discharge current is set to be from 2 CmA to 20 CmA (from Co/5 hours to Co/0.5 hour) and the discharge cut-off voltage Vd is set to be the same as that of the cell for which capacity is estimated. A rest is provided between charge and discharge as necessary. The cycle is repeated equal to or more than three times. Then, an elapsed time tn from the instant when charge voltage in CC charge reaches a predetermined voltage Vs to the instant when the CC mode charge ends (when the charge voltage reaches a charge limit voltage Vc) and discharge capacity Cn in each cycle are recorded, wherein Vs is between Vd and (Vc−0.2V) and Cn is obtained by integrating discharge current with respect to time. Then, values of the constants A and B are determined from the elapsed time tn and the discharge capacity Cn.

That is, the left side of the equation (7) is substituted into Cn/Co and t in the right side is substituted into tn. Then, the constants A and B are determined such that the equation represents the relationship between Cn/Co and tn.

Charge period per one cycle is set to be from 3 days to 30 days. By setting the charge period like this, cell degradation per one cycle proceeds properly so that data necessary for preparing the equation (7) accurately can be obtained efficiently. If the charge period per one cycle exceeds 30 days, degree of degradation due to overcharge becomes large and degree of degradation of cell component material with respect to time becomes large. Thus, the relationship between the time tn and the specific capacity Cn/Co does not become linear relationship which is represented by the equation (7) (assuming that Cn/Co is substituted for the left side and that tn is substituted into t in the right side). Therefore, large error may occur by using the equation in which the constants A and B are determined by such data.

In addition, when the charge period per one cycle is longer than 30 days, the elapsed time per one cycle becomes long so that it takes much time to obtain necessary data.

On the other hand, when the charge period per one cycle is shorter than 3 days, degradation of electrodes due to the charge and discharge cycle becomes remarkable and degree of degradation due to overcharge becomes small. When the constants A and B are determined in this condition and capacity estimation is performed by using the equation (7) having the constants A and B, capacity estimation error becomes large on condition that the target cell is used such that conditions of discharge and charge are different each time, except that the target cell is used such that charge and discharge are performed frequently.

Discharge current in the charge and discharge cycle is set to be from 0.2 CmA to 2.0 CmA. When the discharge current is set from 1.0 CmA to 2.0 CmA, data can be obtained more efficiently. When the discharge current is smaller than 0.2 CmA, it takes much time to discharge completely, which i not favorable. When the discharge current is larger than 2.0 CmA, the time taken for discharge becomes so short that measured values of discharge capacity may vary and the capacity decreases abruptly when degradation proceeds. Thus, the equation (7) is not prepared accurately, which is not favorable.

When performing the charge and discharge cycle experiment, a rest can be taken for a predetermined time between charge and discharge as necessary, for example, due to limitation of setting of the apparatus.

In each charge and discharge cycle, the time t elapsed from the time when the charge voltage is the voltage Vs until the CC mode ends and the charge specific capacity Cn/Co obtained by discharge are measured, wherein the voltage Vs is from the discharge cut-off voltage Vd to (Vc−0.2V) which is 0.2V lower than the charge limit voltage Vc. Then, the time t and the specific capacity Cn/Co are plotted so that the constants A and B are obtained by applying the time t and the specific capacity Cn/Co to the equation (7).

In the charge and discharge cycle experiment, the cycle is repeated equal to or more than three times in order to obtain data of the time tn and the specific capacity Cn/Co necessary for obtaining accurate result of capacity estimation Ce such that Ce is within the bounds of ±20% of actual capacity C.

When the cycle is repeated only two times, only two points of data are obtained for determining the constants A and B so that accurate capacity estimation becomes impossible, which is not favorable.

Temperature conditions under which the charge and discharge cycle experiment is performed are not particularly determined. However, it is favorable that the experiment is performed under temperature range which the manufacturer recommends as temperature range of the Li-ion cell, or under the same temperature as that under which the Li-ion cell is actually used. When the temperature for the experiment is different from the temperature of actual use vary much, the capacity is corrected by using data representing relationship between discharge capacity and temperature.

Next, a degradation estimation apparatus for performing degradation estimation using the above mentioned method will be described.

The apparatus includes:

means for obtaining, when the Li-ion cell is charged by a CC-CV charge method, an elapsed time t from the instant when charge voltage in CC charge reaches a predetermined voltage Vs to the instant when the charge voltage reaches a charge limit voltage Vc; and an arithmetic circuit for calculating an estimated specific capacity Ce/Co of the Li-ion cell by using an equation Ce/Co=At+B, wherein Ce is an estimated capacity of the Li-ion cell, Co is a nominal capacity of the Li-ion cell, and A and B are positive constants;

an arithmetic circuit for estimating degradation state of the Li-ion cell on the basis of the estimated specific capacity Ce/Co; and means for displaying estimation result obtained by the circuit for estimating, or, generating an alarm which warns of degradation of the Li-ion cell.

As the degradation estimation apparatus, for example, the apparatus described in the first embodiment with reference to FIG. 2 can be used. In this embodiment, the equation (7) is used.

In addition, the capacity estimation method of the present invention for the Li-ion cell can be applied to a battery by providing a control microprocessor and additional memory as necessary in the battery. The battery shown in FIG. 3 is an example of the battery to which this capacity estimation method is applied. In this embodiment, the equation (7) is used. By using the equation (7), capacity estimation can be realized by simpler calculation.

Like the first embodiment, the degradation estimation method and the Li-ion battery which includes the degradation estimation capability of the present invention can be applied to apparatuses for which high reliability is required such as a backup power source. By applying the present invention to the apparatuses, degradation status of cells can be grasped properly and the cells can be exchanged in a timely fashion so that troubles of the apparatuses can be avoided. There is no problem in that apparatuses which use Li-ion cells adopts the degradation estimation method or the Li-ion battery which has the degradation estimation capability. Accordingly, cells can be exchanged with minimum waste so that the present invention can be used very advantageously.

EXAMPLES

In the following, the capacity estimation method, the degradation estimation method and a degradation estimation apparatus for the Li-ion cell and the Li-ion battery will be described in more detail. However, the present invention is not limited to the following examples.

Example 2-1

An experiment was performed by using a cell charge and discharge automatic test apparatus which has data collection and data storing capability in order to obtain an equation for a cylindrical Li-ion cell (18650 type, the nominal capacity is 1350 mAh). In the experiment, test was done at 25° C. The test cell was cycled 5 times by discharging at 1350 mA (1.0 CmA) to 2.75V and charging in CC-CV mode at 45 mA (0.033 CmA) to 4.1V for 30 days with intervals of one hour between charge and discharge.

In each cycle of charge and discharge, an elapsed time t (hr) from the charge start time until the CC mode charge ended and a specific capacity C/Co which is a ratio of discharge capacity C to the nominal capacity Co were measured, wherein the discharge capacity C was calculated by integrating the discharge current with respect to time.

Figure 13:
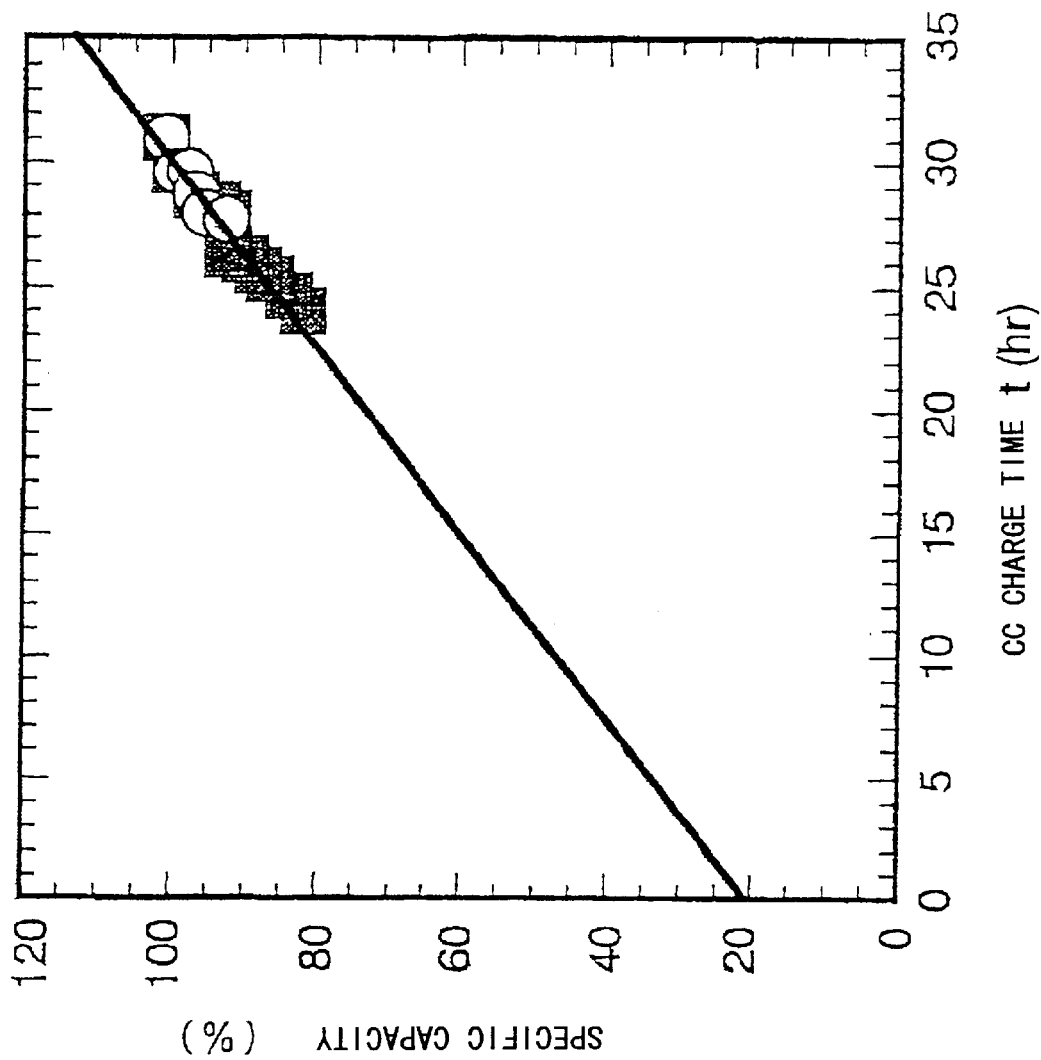
FIG. 13 shows relationship between elapsed time t and specific capacity which are obtained by charge and discharge cycle experiment of an example 2-1.

FIG. 13 shows obtained data. FIG. 13 shows relationship between the elapsed times t and the specific capacities C/Co which are obtained by the charge and discharge cycle experiment. "○" in this figure shows the obtained data. The constants A and B in the equation (1) which is a function of t and which represents the estimated specific capacity Ce/Co are obtained by using the data so that a following equation (8) is prepared.

$$Ce/Co = 0.0263 \times t + 0.207 \quad (8)$$

Strictly speaking, "t" in this equation (2) should be represented as (t/1 hour), that is, should be represented as a dimensionless number. However, in the equation (8), it is represented as simply t for the sake of convenience. The same goes for following equations.

The equation (8) is represented as a line shown in FIG. 13.

In order to verifying validity of the equation (8), a following experiment was performed.

In this experiment, the same kind of cylindrical Li-ion cell (the nominal capacity was 1350 mAh) was used. The test cell was cycled by discharging at 1350 mA (1.0 CmA) to 2.75V and charging in CC-CV mode at 45 mA (0.033 CmA) to 4.1V for 30 days with intervals of 10 minutes between charge and discharge.

In each cycle of charge and discharge, a CC charge time t (hr), and the ratio of discharge capacity C to the nominal capacity 1350 mAh, that is, a specific capacity C/Co are recorded.

The result of this experiment is shown by "■" in FIG. 13. As shown in FIG. 13, data shown by a plurality of "■" is very close to values of the equation (8) shown by the line, which means that the capacity estimation result is accurate.

Figure 14:
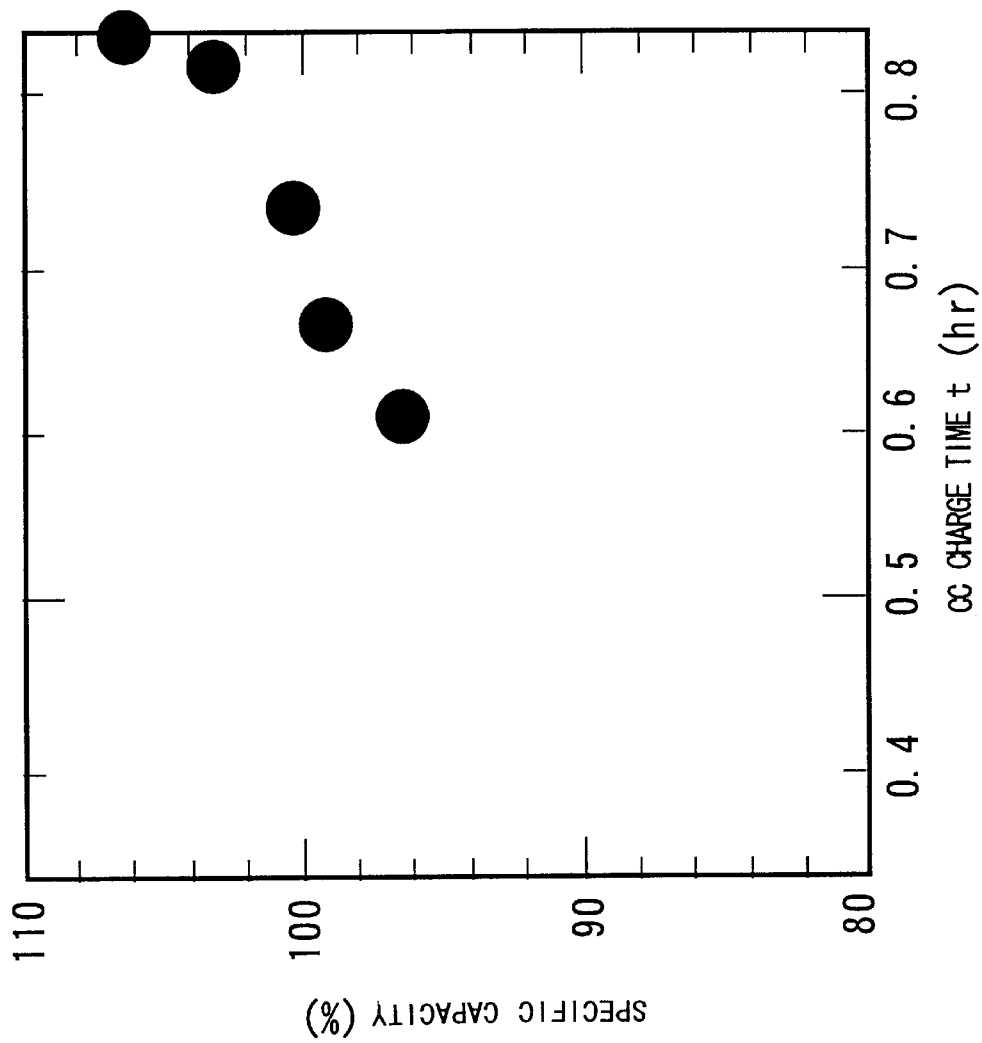
FIG. 14 shows relationship between specific capacity and the elapsed time t of CC mode charge obtained in charge and discharge cycles at 0.1 CmA of charge current, which is a comparison example for an example 2-1.

In order to make a comparison, another experiment was performed for preparing an equation under the same condition as the above mentioned experiment except that the charge current of this experiment was 135 mA (0.1 CmA). FIG. 14 shows relationship between obtained specific capacity C/Co and the time t elapsed until the CC mode charge ended. "●" in this figure shows obtained data. As is evident from FIG. 14, when the charge current is larger than 0.05 CmA, the specific capacity C/Co is not linearly related to the time t, which means that accurate equation can not be prepared.

Example 2—2

Charge and discharge cycle experiment was performed in which the cycle was repeated up to five times at the maximum under the same conditions as the example 2-1 except that four prismatic Li-ion cells (the nominal capacity is 600 mAh) were used, the charge current was 20 mA (0.033 CmA), the discharge current was 600 mA (1.0 CmA) and the charge periods were 2.5 days, 3 days, 30 days and 35 days. Then, equations for each charge period were prepared for 153 days by the same procedure as was shown in the example 2-1.

As a result, an equation which was prepared in the case where the charge period was 2.5 days was $$Ce/Co = 0.00961 \times t + 0.704 \quad (9),$$

an equation which was prepared in the case where the charge period was 3 days was $$Ce/Co=0.0167 \times t+0.485 \quad (10),\text{ and}$$

an equation which was prepared in the case where the charge period was 30 days was $$Ce/Co=0.0180 \times t+0.447 \quad (11).$$

In the case where the charge period was 35 days, the charge and discharge cycle was repeated two times. An equation prepared by using data of the two cycles was $$Ce/Co=0.00627 \times t+0.801 \quad (12).$$

In order to evaluate estimation accuracy of the obtained equations, following experiment was performed.

A prismatic cell (the nominal capacity was 600 mAh) was removed from a cellular phone and set in the cell charge and discharge automatic test apparatus by connecting each of the cathode terminal and anode terminal to the apparatus. Then, the cell was charged in CC-CV mode at 20 mA (0.033 CmA) to 4.1V for one day. After one hour rest, the cell was discharged at 600 mA (1.0 CmA) to 2.75V. Then, the time t (hr) taken for the CC charge and ratio of the discharge capacity C to the nominal capacity, that is, the specific capacity C/Co were obtained. According to this experiment, the time t was 15.31 hours and the specific capacity C/Co was 63.5%.

The CC charge time t=15.31(hr) was substituted into each of the equations (9), (10), (11) and (12). Then, the estimated specific capacity Ce/Co and estimated error Err=C/Co−Ce/Co=0.635−Ce/Co was obtained for each equation.

As a result, the estimated specific capacity Ce/Co for the equation (10) corresponding to 3 day charge is 74.1%, the estimated specific capacity Ce/Co for the equation (11) corresponding to 30 day charge is 72.3%, and the estimated error Err is −10.6% and −8.8% respectively. Both of the errors are within ±20%. Thus, it was revealed that good estimation can be performed by using the equations (10) and (11).

On the other hand, when the equation (9) corresponding to 2.5 day charge is used, the estimated specific capacity becomes 85.1% and the estimated error becomes −21.6%. In addition, when the equation (12) corresponding to 35 day charge is used, the estimated specific capacity becomes 89.7% and the estimated error becomes 26.2%. Therefore, both of them can not be used since the error is too large.

For comparison purposes, following equation was prepared from data of initial two cycles performed in the experiment of 3 day charge, $$Ce/Co=0.00579 \times t+0.819 \quad (13).$$

Then, the estimated specific capacity Ce/Co and the estimated error Err were calculated by substituting t=15.31 into the equation (13). As a result, the estimated specific capacity Ce/Co was 90.8% and the estimated error Err was −27.3%, which revealed that a good equation can not be obtained from data of only two cycles.

Example 2-3

Charge and discharge cycle experiment was performed by under the same conditions as the example 2-1 except that four cylindrical Li-ion cells (18650 type, the nominal capacity is 1350 mAh) were used and four kinds of discharge currents, 135 mA (0.1 CmA), 270 mA (0.2 CmA), 2700 mA (2.0 CmA) and 3000 mA (2.2 CmA) were used. Then, equations for each discharge current were prepared by the same procedure as in the example 2-1.

Figure 15:
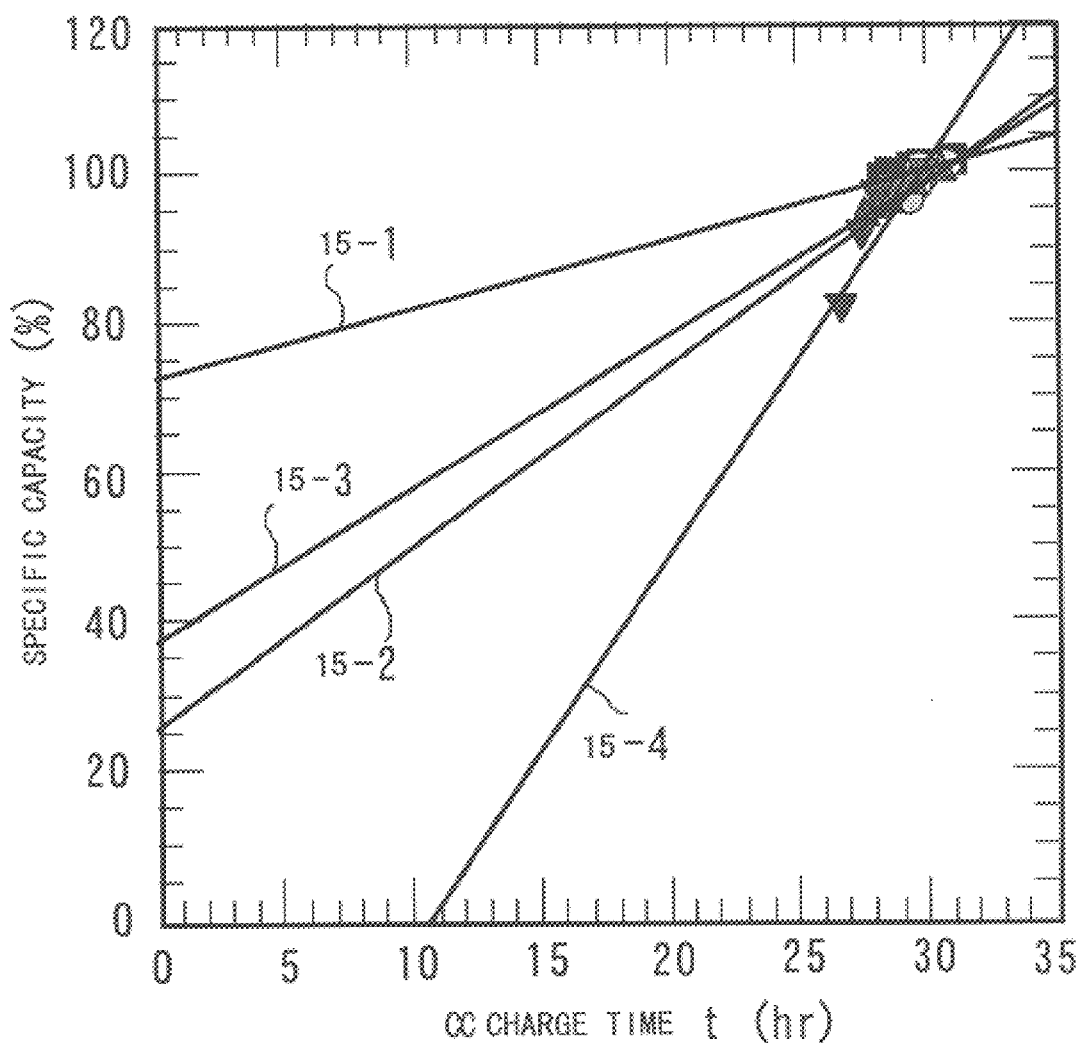
FIG. 15 shows relationship between specific capacity and elapsed time t of CC mode charge in an example 2-3, and obtained equations.

The results are shown in FIG. 15. In FIG. 15, "15-1" indicates a line representing an equation $$Ce/Co=0.00918 \times t+0.727 \quad (14)$$

which was prepared from the experiment in which the discharge current was 0.1 CmA. "15-2" indicates a line representing an equation $$Ce/Co=0.0242 \times t+0.255 \quad (15)$$

which was prepared from the experiment in which the discharge current was 0.2 CmA. "15-3" indicates a line representing an equation $$Ce/Co=0.0205 \times t+0.372 \quad (16)$$

which was prepared from the experiment in which the discharge current was 2.0 CmA. "15-4" indicates a line representing an equation $$Ce/Co=0.0521 \times t-0.552 \quad (17)$$

which was prepared from the experiment in which the discharge current was 2.2 CmA.

In order to evaluate estimation accuracy of the obtained equations, following experiment was performed.

A Li-ion battery which was used in a laptop computer was disassembled and a cylindrical Li-ion cell (18650 type, the nominal capacity was 1350 mAh) was removed. Then, leads are soldered to the cathode terminal and the cell side (anode), and the Li-ion cell was set in the cell charge and discharge automatic test apparatus. Then, the cell was charged in CC-CV mode at 45 mA (0.033 CmA) to 4.1V for one day. After one hour rest, the cell was discharged at 1350 mA (1.0 CmA) to 2.75V. Then, the time t (hr) taken for the CC charge and ratio of the discharge capacity C to the nominal capacity Co, that is, the specific capacity C/Co were obtained. According to this experiment, the time t was 19.34 hours and the specific capacity C/Co was 0.671.

The obtained time t=19.34 (hr) was substituted into each of the equations (14), (15), (16) and (17). Then, the estimated specific capacity Ce/Co and estimated error Err=C/Co−Ce/Co=0.671−Ce/Co was obtained for each equation.

As a result, the estimated specific capacity Ce/Co obtained by the equation (15) corresponding to 0.2 CmA discharge current was 72.3% and the estimated error Err was −5.2%. The estimated specific capacity Ce/Co obtained by the equation (16) corresponding to 2.0 CmA discharge current is 76.8%, and the estimated error Err was 9.7%. Thus, good estimation results were obtained in these cases where the discharge current used for the experiment for obtaining the equation was from 0.2 CmA to 2.0 CmA. On the other hand, as for the equation (14) corresponding to 0.1 CmA discharge current which is not within the above mentioned range, the estimated specific capacity was 90.5% and the estimated error was −23.4%. In addition, as for the equation (17) corresponding to 2.2 CmA discharge current which is not within the above mentioned range, the estimated specific capacity was 45.6% and the estimated error was +21.5%. It revealed that accurate Li-ion cell capacity estimation is difficult by using these equations obtained by experiments where the discharge current was not within the above mentioned range since estimation error becomes large.

Example 2-4

In this example, a charger which charges a battery by using the CC-CV charge method and performs capacity and degradation estimation of the battery was manufactured and will be shown. The battery includes three cylindrical Li-ion cells (18650 type, nominal capacity of each is 1350 mAh) which are connected in series. In the CC-CV charge method used by the charger for charging the battery, the charge limit voltage is 12.3V, the charge current is 45 mA (0.033 CmA) and the total charge period is 3 days.

A configuration of this charger is the same as that shown in FIG. 11. In this embodiment, the equation (8) is used.

As for the charger of this example, since charge is not necessarily performed after complete discharge, the degradation estimation is performed in the following way.

Data of change of charge voltage with respect to time is stored in the charge control microprocessor beforehand. The battery voltage is monitored from the start of charge. Time measuring is started from the time when the charge voltage becomes a voltage which is higher than the start voltage and is nearest to a value in four values between or equal to 8.25V (2.75 V/cell) and 11.7V (3.9 V/cell which is 0.2 V/cell lower than the charge limit voltage 4.1 V/cell) increasing in steps of 1.15V, that is, 8.25V, 9.40V, 10.55V, and 11.70V. Then, an elapsed time t" until the charge voltage reaches the charge limit voltage 12.3V, that is, until the CC mode charge ends is measured. After that, the time t" is converted into the CC mode charge time t elapsing between the time when the voltage is 8.25V and when the voltage is 12.3V by performing comparison calculation using the stored data.

Figure 16:
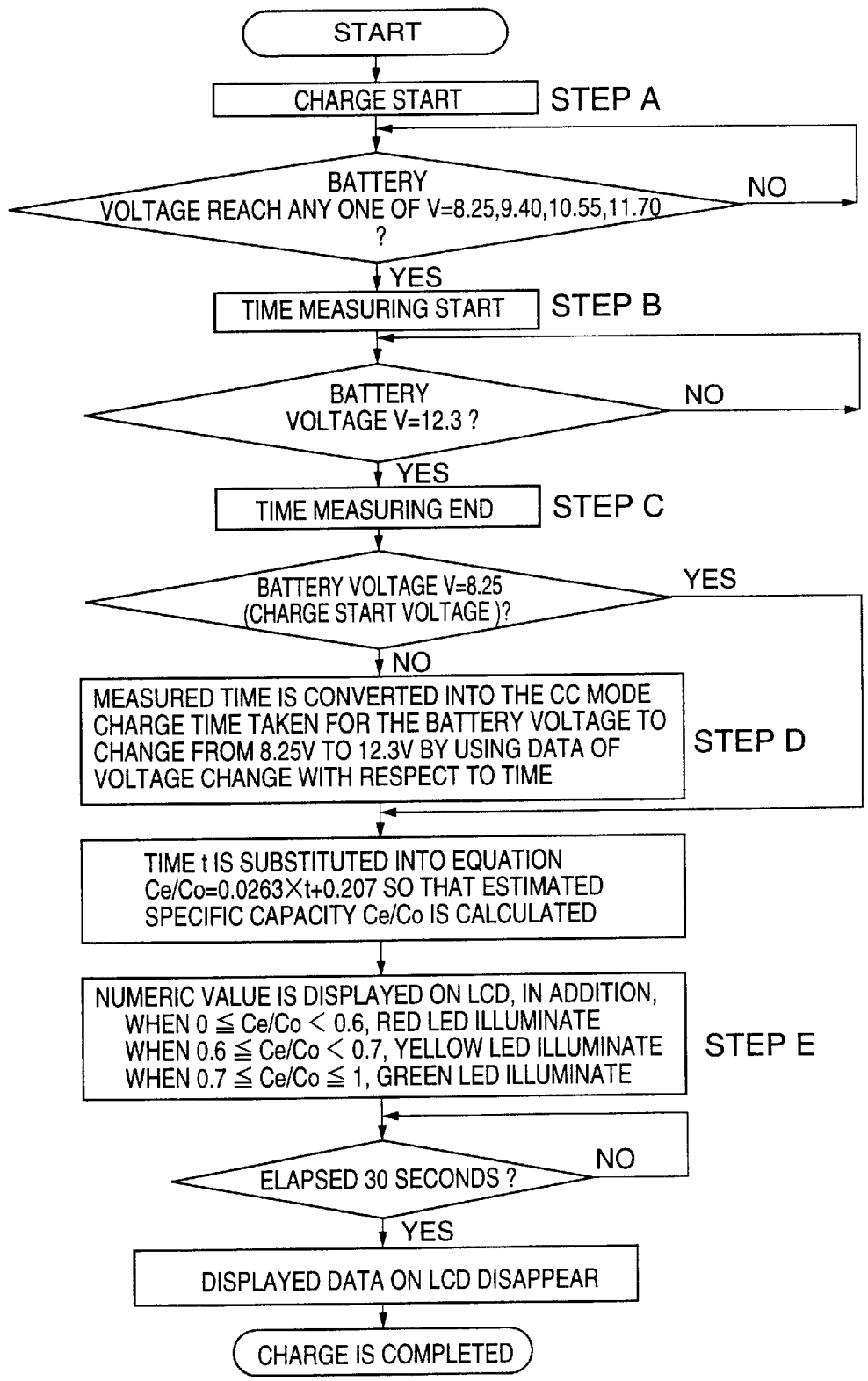
FIG. 16 is a flowchart showing degradation estimation procedures performed in an experiment 2-4.

Next, the procedures for degradation estimation stored in the charge control microprocessor 30 shown in FIG. 16 will be described.

(step A) The charge is started by placing the battery in the charger so that the battery voltage is monitored. It is monitored whether the battery voltage V reaches a value which satisfies V=8.25, 9.40V, 10.55V, or 11.70V.

(step B) When the battery voltage V reaches any one of the values, time measuring is started. The time is counted until the battery voltage reaches the charge limit voltage 12.3V.

(step C) When the battery voltage V reaches the charge limit voltage 12.3V, the time measuring ends. When the charge start voltage is the discharge cut-off voltage 8.25V, the measured time t is used for degradation estimation.

(step D) When the charge start voltage is higher than 8.25V, the measured time is converted into the CC mode charge time required for the battery voltage to change from 8.25V to 12.3V by comparing measured data with data of voltage change with respect to time which is stored beforehand. The converted time t is used for degradation estimation. The time t is substituted into the equation (8) so that the estimated specific capacity Ce/Co is calculated.

(step E) The calculation result is displayed on the LCD and the LED. According to the estimated specific capacity, one of red, yellow and green LEDs illuminates. At the same time, a numeric value is displayed on the LCD. The value is displayed on the LCD for 30 seconds and the LED illuminates while the charger is connected to the utility power source.

By using this charger, a used battery of the same type was charged. The degradation estimation result was displayed 15.7 hours after the start of charge. "62.0%" was displayed on the LCD as the estimated specific capacity and the yellow LED illuminated.

Then, the charged battery was mounted in the battery charge and discharge automatic test apparatus so that constant current discharge was performed wherein the discharge current was set to be 1350 mA (1.0 CmA) and the discharge cut-off voltage was set to be 8.25V. The discharge capacity was 860.0 mAh according to this test. This value is equivalent to 63.7% as specific capacity, which revealed that the error of capacity estimation was about 1.7%.

Accordingly, it becomes evident that the charger having capabilities of the present invention can estimate degradation in high accuracy.

Example 2-5

A Li-ion battery which is mounted in a laptop computer was manufactured. The configuration is the same as that shown in FIG. 3. The Li-ion battery has a capability of performing the CC-CV charge mode charge on condition that the charge limit voltage is 12.3V, charge current is 45 mA (0.033 CmA) and the total charge period is 3 days. The battery includes three cylindrical Li-ion cells (nominal capacity is 1350 mAh) 12-1, 12-2, and 12-3 which are connected in series. The equation (8) and the basic data of change in charge voltage with respect to time as described in the example 2-4 are stored in the IC for protection such that the time of CC mode charging from 8.25V to 12.3V can be calculated even when the battery voltage at the charge start time is higher than the discharge cutoff voltage 8.25V.

In addition, a program is stored in a memory in the IC 13 for protection. According to this program, following process is performed. The voltage across the cells is monitored. Time measuring is started from the time when the charge voltage becomes a voltage which is higher than a charge start voltage Vs and is nearest to a value in 8.25V, 9.40.V, 10.55V, or 11.70V, wherein the charge start voltage Vs which is determined beforehand is equal to or higher than the discharge cut-off voltage Vd and lower than the charge limit voltage Vc. Then, an elapsed time t" until the charge voltage reaches the charge limit voltage 12.3V is measured. After that, the time t" is converted into the CC mode charge time t required for the voltage to change from 8.25V to 12.3V. The time t is substituted into the equation (8) so that the estimated specific capacity Ce/Co is calculated.

The battery is configured such that the result is output to the body of the laptop computer in order to be displayed on an LCD of the laptop computer via the terminal 19.

On the LCD, a numerical value indicating the estimation result is displayed as % and a bar in which a part of the bar corresponding to the % value ratio is colored is displayed.

A command for doing degradation estimation is provided from the body of the laptop computer concurrently with the start of charge. Procedures for performing the degradation estimation are the same as those shown in FIG. 16 except for the result to be sent to the body since the result is displayed on the display of the laptop computer.

The battery was mounted in the laptop computer and used for one hour. After that, charge of the battery was started by connecting the computer to the utility power source. The estimation result of the battery was displayed as 73% after the start of the charge. After checking that a sign of charge completion was displayed, the laptop computer was powered off and the battery was removed from the laptop computer. Then, the battery was connected to the battery charge and discharge automatic test apparatus by using proper codes and the discharge capacity was measured by discharging the battery at 1350 mA (1.0 CmA) to 8.25V. As a result, the discharge capacity was 1093.5 mAh, which means that the specific capacity was 81.0%. Thus, the error of estimation was −8.0%.

Therefore, it became evident that the degradation estimation capability of the battery of the present invention can provide estimation result with high accuracy.

(Third Embodiment)

In the following, a third embodiment will be described. In the third embodiment, the capacity estimation method and the degradation estimation method using the current value after a lapse of a predetermined time in the constant voltage mode (in the following, the constant voltage mode will be called as CV mode) and the time taken for charge current to decrease to a predetermined current will be described, wherein ½ can be used as the predetermined time and 5 minutes can be used as the predetermined current. In addition, the Li-ion battery and apparatuses which include these capabilities will be described.

(Outline of the Third Embodiment)

In the third embodiment, the capacity estimation method and the degradation estimation method, a Li-ion battery and apparatuses which can estimate capacity and degradation according to these methods will be described. In these methods, charge of a Li-ion cell or a Li-ion battery is performed in which the CC-CV charge method is used. As mentioned before, in the constant current and constant voltage (CC-CV) method, the Li-ion cell or the Li-ion battery is charged at a constant current until the cell voltage becomes a predetermined charge limit voltage, after that, the Li-ion cell or the Li-ion battery is charged while the voltage is kept constant.

For estimating capacity and degradation according to methods of the present embodiment, after the charge mode is changed to the CV mode from the constant current mode (in the following, the constant current mode will be called as CC mode), required time for the charge current to decrease to a value, for example ½ of the initial current of the CV mode, is measured. Or, the charge voltage after a lapse of a predetermined time, for example 5 minuets, since the CV mode charge starts is measured. The measured time or voltage is used for the estimation.

In the following, the capacity estimation method and the degradation estimation method of the present invention will be described more precisely.

Figure 17:
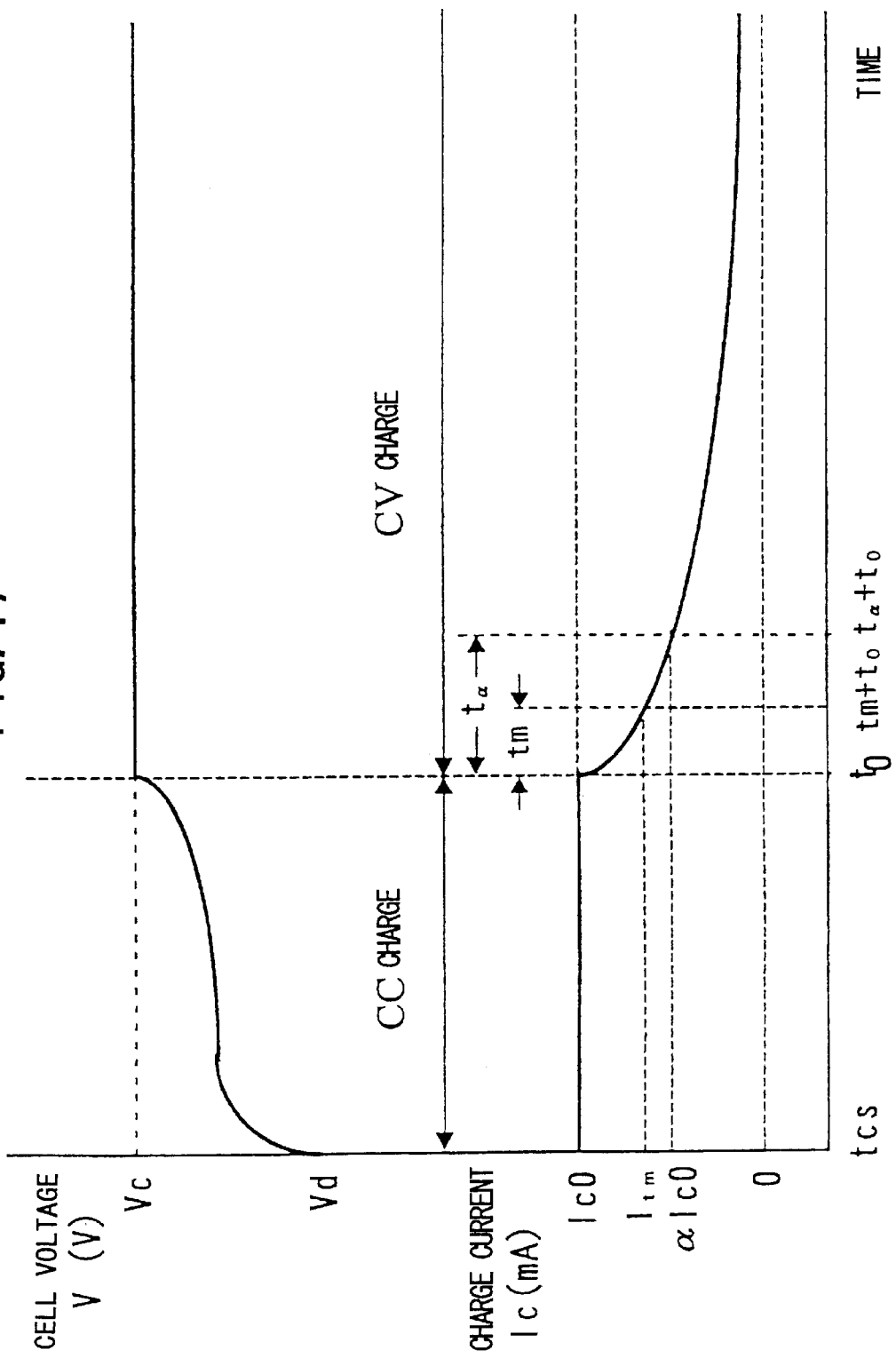
FIG. 17 is a figure for explaining capacity estimation method of the Li-ion cell according to a third embodiment of the present invention.

FIG. 17 shows change of the cell voltage V and the charge current Ic with respect to time when the Li-ion cell is charged by the CC-CV charge method.

In FIG. 17, when the Li-ion cell or the Li-ion battery (these will be collectively called Li-ion cell in the following) is charged by the CC-CV charge method, first, in the CC mode, the Li-ion cell is charged at a constant charge current Ic0 until the cell voltage reaches a predetermined charge limit voltage Vc, that is, from the time tcs to $t_0$. After that, in the CV mode, the Li-ion cell is charged while the cell voltage is kept constant in which the charge current Ic decreases with time.

Normally, the charge limit voltage Vc is from 4.1 V/cell to 4.2 V/cell (/cell means per once cell), the charge current is from 0.033 CmA to 1.0 CmA, the discharge cut-off voltage is from 2.75 V/cell to 3.0 V/cell The inventors repeated charge and discharge cycle several times in which each cycle included one charge process and one discharge process. In the charge process, the Li-ion cell was charged at the constant current Ic0 until the cell voltage reached the predetermined charge limit voltage Vc. In the discharge process, the Li-ion cell after the charge process was discharged, which corresponds to a process in which the cell is used for a power source. Then, the inventors conducted a close study of correlations between the discharge capacity Cd (will be called capacity in the following) which was obtained by integrating discharge current with respect to time and variations of charge current in the CV mode (will be called CV charge in the following). As a result, the inventors discovered that decreasing pattern of charge current in the CV charge varied as the charge and discharge cycle was repeated. The characteristics of the variation of the charge current decreasing pattern are shown in FIG. 18.

Figure 18:
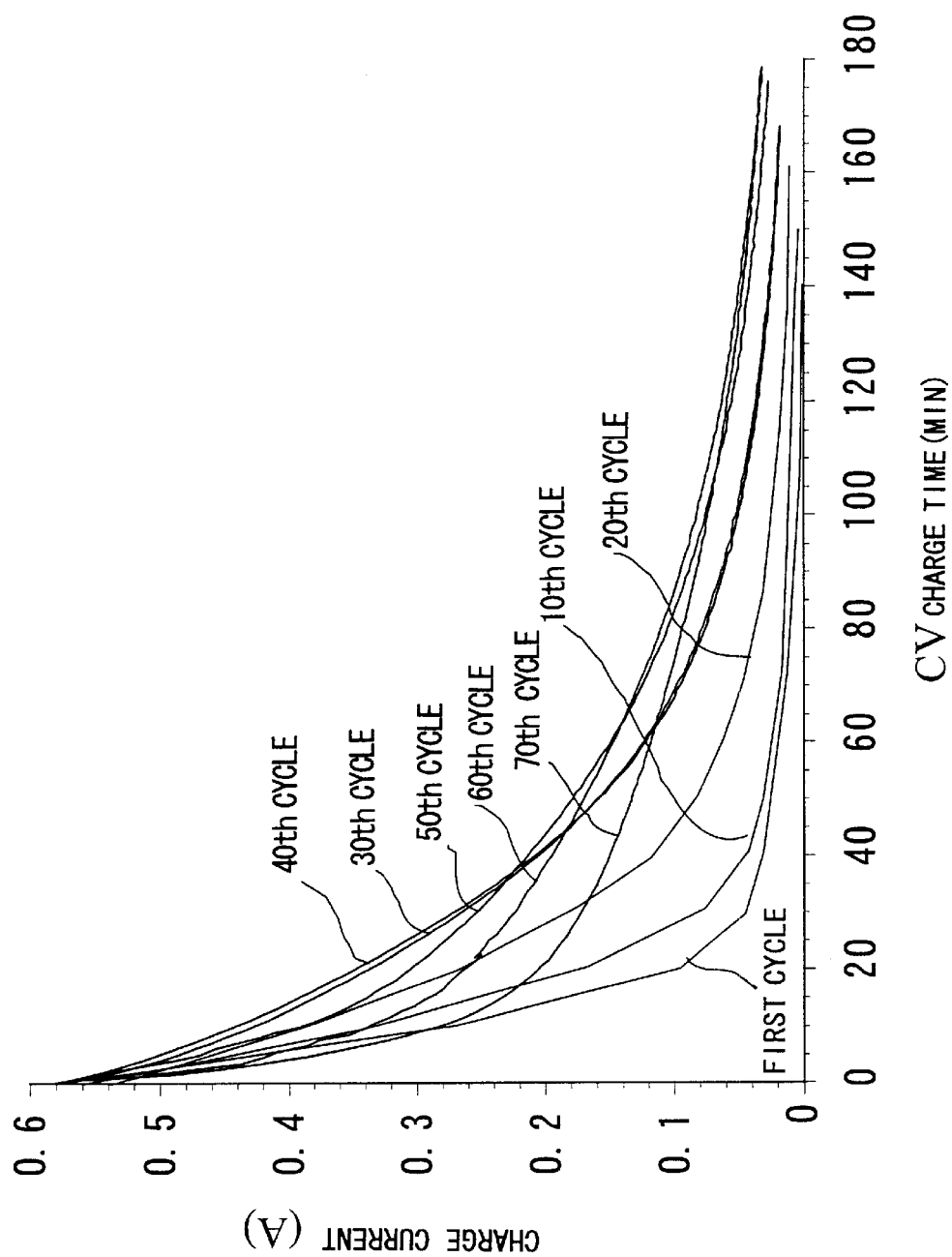
FIG. 18 shows variations of CV mode charge current profiles on which the capacity estimation method and the degradation estimation method of the present invention are based according to the third embodiment.

FIG. 18 shows variations of the charge current in the CV charge with time per one cycle. In FIG. 18, the charge current decreases with time in any cycle, and, the decreasing speed simply descends until 40th cycle. However, in cycles after the 40th cycle, decreasing of charge current is faster than that of 40th cycle in initial stage of CV charge process, after the initial stage, decreasing of charge current becomes slower with time. That is, as shown in FIG. 18, the decreasing pattern in a cycle after the 40th cycle is different from that before the 40th cycle.

Figure 19:
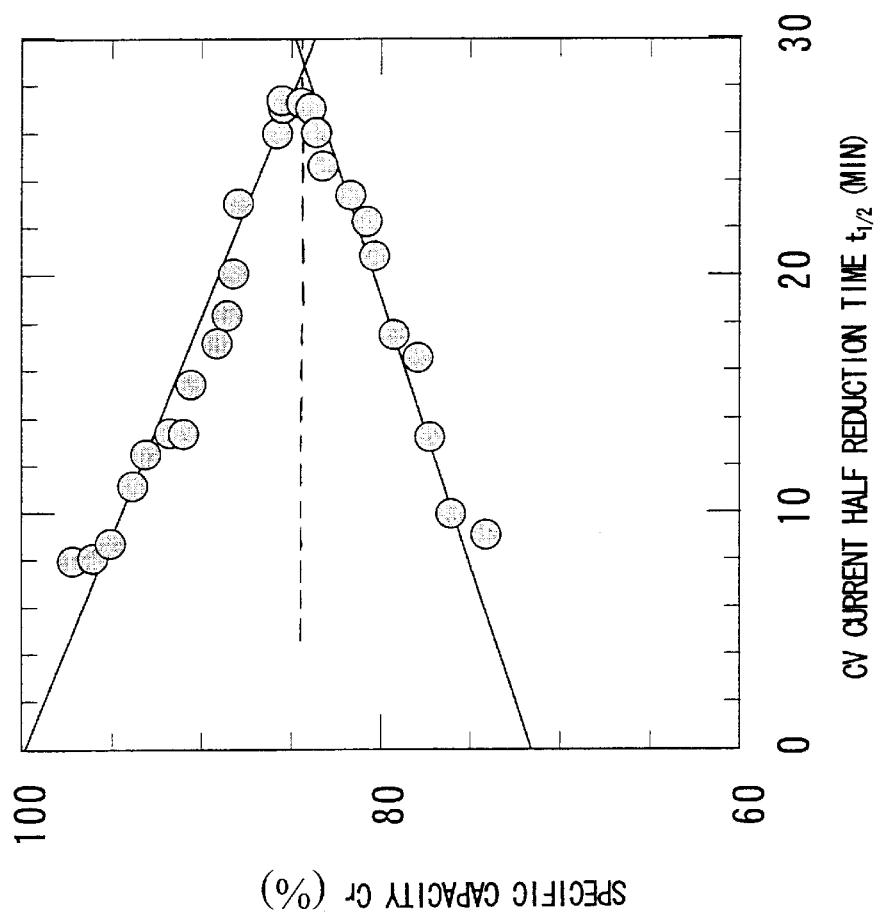
FIG. 19 shows relationship between elapsed time since the CV charge starts until the charge current becomes half (charge current half reduction time) and specific capacity for explaining the capacity estimation method and the degradation estimation method of the present invention according to the third embodiment.

FIG. 19 shows relationships between elapsed time since the CV charge starts until the charge current becomes half and specific capacity percentage Cr=100×(C/Co), that is, ratio of the cell capacity C to the nominal capacity, in which the time at which CV current becomes half is shown as $t_{1/2}$.

As shown FIG. 19, as the specific capacity Cr decreases as the number of repetitions of the cycle increases, the elapsed time $t_{1/2}$ for the current to decrease to half increases. However, in the neighborhood where the specific capacity Cr becomes 85(%), the time $t_{1/2}$ starts to decrease as the specific capacity Cr decreases. This trend of variation forms symmetric shape with respect to a line (indicated by dotted line in the figure) passing through the cusp and indicating Cr=constant, wherein the cusp is a point at which the gradient of a curve changes discontiguously and corresponds to the peak of $t_{1/2}$. In addition, this variation trend is approximated into two lines which are symmetric with respect to the above mentioned dotted line. When $t_{1/2}$ increases or does not change as the number of repetitions of the cycle increases, the trend can be approximated into an equation $$Cr=-At_{1/2}+B \tag{18'}$$

wherein A and B are positive constants. When $t_{1/2}$ decreases as the number of repetitions of the cycle increases, the trend can be approximated into an equation $$Cr=+At_{1/2}+B \tag{19'}$$

wherein B' is a positive constant.

Since the absolute values are the same and signs are opposite as for the coefficient −A of $t_{1/2}$ in the equation (18) and the coefficient +A of $t_{1/2}$ in the equation (19), an equation B'=2Cc−B can be obtained wherein Cc represents the specific capacity Cr at the cusp.

Figure 20:
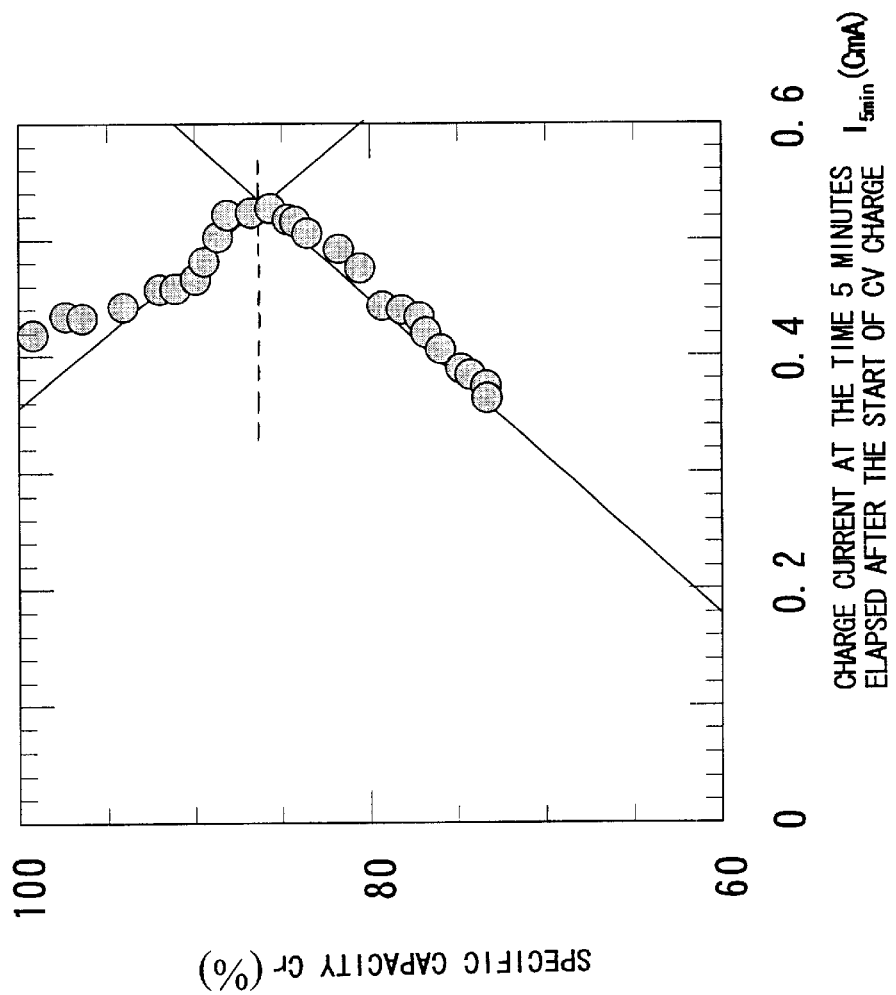
FIG. 20 shows relationship between charge current after a lapse of 5 minutes from the instant when charge mode is changed from CC mode to CV mode and specific capacity.

FIG. 20 shows relationship between charge current $I_{5min}$ at the instant when a predetermined time (5 minutes in the figure) elapses since CV charge starts and the specific capacity Cr.

As shown FIG. 20, as the specific capacity Cr decreases as the number of repetitions of the cycle increases, the charge current $I_{5min}$ increases linearly. Like the case shown in FIG. 19, in the neighborhood where the specific capacity Cr becomes 85(%), the charge current $I_{5min}$ starts to decrease linearly as the specific capacity Cr decreases. Like the case shown in FIG. 19, the trend of variation forms symmetric shape with respect to a line (indicated by dotted line in the figure) passing through the cusp corresponding to the peak of $I_{5min}$ and indicating Cr=constant.

This variation trend is approximated into two lines which are symmetric with respect to the above mentioned line. When $I_{5min}$ increases or does not change as the number of repetitions of the cycle increases, the trend can be approximated into an equation $$Cr=-MI_{5min}+N \qquad (20')$$

wherein M and N are positive constants. When $I_{5min}$ decreases as the number of repetitions of the cycle increases, the trend can be approximated into an equation $$Cr=+MI_{5min}+N' \qquad (21')$$

wherein N' is a positive constant.

Since the absolute values are the same and signs are opposite as for the coefficient −M of $I_{5min}$ in the equation (20') and the coefficient +M of $I_{5min}$ in the equation (21'), an equation N'=2Cc−N can be obtained wherein Cc represents the specific capacity Cr at the cusp.

(First Method for Capacity Estimation and Degradation Estimation in the Third Embodiment)

In the first method for capacity estimation and degradation estimation of the Li-ion cell according to the present invention, capacity estimation and degradation estimation are performed by using equations generalized from the equations (18') and (19').

More specifically, as shown in FIG. 17, in the CC-CV charge, the time $t_\alpha$ elapsed until the charge current Ic becomes $\alpha$ times of Ic0 ($\alpha$Ic0) since the charge mode is changed to the CV mode when the cell voltage V reaches the charge limit voltage Vc is monitored, wherein $\alpha$ is a constant and 0<$\alpha$<1. In the early stage in using the cell, that is, when the number n of repetitions of charge and discharge cycle is relatively small so that $t_\alpha$ increases or does not change as n increases, the specific capacity Cr is estimated by using an equation $$Cr=-At_\alpha+B \qquad (18)$$

which is a linear function of $t_\alpha$, wherein A and B are positive constants. When the number n of repetitions of charge and discharge cycle increases so that $t_\alpha$ decreases as n increases, the specific capacity Cr is estimated by-using an equation $$Cr=+At_\alpha+B' \qquad (19)$$

which is a linear function of $t_\alpha$, wherein B' is positive constants. By using the estimated value, the nominal capacity Co and an equation Ce=(Cr/100)×Co, the capacity Ce of the Li-ion cell which is the target of the capacity estimation can be estimated.

When the estimated capacity Ce is smaller than a predetermined value, the Li-ion cell is estimated to be degraded.

In order to make this method effective, it is necessary that the constant $\alpha$ satisfies 0<$\alpha$<1. In addition, there is a favorable range of $\alpha$ in order to perform accurate estimation. As is evident from FIG. 19, ½ is within the favorable range of $\alpha$.

(Second Method for Capacity Estimation and Degradation Estimation in the Third Embodiment)

In the second method for capacity estimation and degradation estimation of the Li-ion cell according to the present invention, capacity estimation and degradation estimation are performed by using equations generalized from the equations (20') and (21').

More specifically, as shown in FIG. 17, in the CC-CV charge, the charge current $I_{tm}$ at the time when a predetermined time tm elapses since the charge mode is changed to the CV mode when the cell voltage V reaches the charge limit voltage Vc is measured, wherein 0<tm≦0.8Co/Ic0 and Co is the nominal capacity of the cell. In the early stage in using the cell, that is, when the number n of repetitions of charge and discharge cycle is relatively small so that $I_{tm}$ increases or does not change as n increases, the specific capacity Cr is estimated by using an equation $$Cr=-MI_{tm}+N \qquad (20)$$

which is a linear function of $I_{tm}$, wherein M and N are positive constants. After the number n of repetitions of charge and discharge cycle increases, and, then, when $I_{tm}$ decreases as n increases, the specific capacity Cr is estimated by using an equation $$Cr=+MI_{tm}+N' \qquad (21)$$

which is a linear function of $I_{tm}$, wherein N' is positive constants. By using the estimated value, the nominal capacity Co and an equation Ce=(Cr/100)×Co, the capacity Ce of the Li-ion cell which is the target of the capacity estimation can be estimated.

When the estimated capacity Ce is smaller than a predetermined value, the Li-ion cell is estimated to be degraded.

There is a favorable range of tm in order to perform accurate estimation. As is evident from FIG. 20, 5 minute is within the favorable range of tm. As will be described in following examples, for example, in the example 3-5, the favorable range is from 1 minute to 15 minute. As mentioned above, tm should satisfy an inequality 0<tm≦0.8Co/Ic0. As described later, the maximum value of Ic0 is 1.0 CmA. Even when Ic0 is the maximum, the inequality becomes 0<tm≦48 minutes. Thus, the above mentioned favorable range of tm satisfies this inequality.

In either of the first and second methods, there are two equations used for performing capacity estimation. Thus, judgment as to which equation should be used is necessary. The judgment is performed according to whether $t_\alpha$ increases, does not change or decreases by comparing $t_\alpha$ with that of previous charge and discharge cycle. The judgment is also performed according to whether $I_{tm}$ increases, does not change or decreases by comparing $I_{tm}$ with that of previous charge and discharge cycle. If it is insured that increase, unchanged and increase of $t_\alpha$ compared with that of previous cycle agree with increase, unchanged and increase of $I_{tm}$ compared with that of previous cycle, the judgement can be performed by monitoring one of $t_\alpha$ and $I_{tm}$.

There may be cases where, due to a trouble of the apparatus or something, even when $t_\alpha$ (or $I_{tm}$) decreases comparing with that of the previous cycle, the state goes back such that $t_\alpha$ (or $I_{tm}$) increases again. In such a case, the equation (18) (or (20) ) is used again.

As mentioned above, as for decrease of charge current in the CV charge mode, $t_\alpha$, for example $t_{1/2}$ becomes longer and $I_{tm}$ becomes larger as the number of repetitions of the charge and discharge cycle increases, and, $t_\alpha$ and $I_{tm}$ become smaller after a number of repetitions of the cycle. This reason is not necessarily clear, however, it can be interpreted as follows.

In the Li-ion cell, metal oxide of cathode active material is dissolved in the electrolyte and partially deposited on the anode. And, electrolyte is decomposed by reacting with $Li^+$ ion and the product generates a passive film on the anode surface. As a result, ohmic resistance and charge-transfer resistance increase so that deintercalation of $Li^+$ ions from the cathode active material and diffusion of intercalated $Li^+$ ions in anode solid delays. Thus, decrease in CV charge current becomes slow. However, after a predetermined number of repetitions of charge and discharge cycle, the number of Li intercalation sites in the cathode and anode active materials decreases due to growth of surface film, collapse of active material crystal and the like. As a result, charge current per the intercalation site increases so that rate of decrease in charge current in the early stage of CV charge becomes high comparing with previous cycles. After the stage, since ohmic resistance and charge-transfer resistance further increase, rate of decrease in charge current becomes lower than the previous cycles.

In order to make the equations (18), (19), (20) and (21) effective for capacity estimation and degradation estimation of Li-ion cell, the Li-ion cell needs to be charged by current from 0.033 CmA to 1.0 CmA. When the current is smaller than 0.033 CmA, charge is not fully performed and an effect of self-discharge can not be neglected so that the specific capacity calculated by the equations (18), (19), (20) and (21) becomes different from an actual specific capacity, which is not favorable for capacity estimation and degradation estimation. When the charge current is larger than 1.0 CmA, the necessary time for charge is short so that measured time may include large error and variations of charge time due to degradation may differ, which is also not favorable for capacity estimation and degradation estimation of the present invention. Thus, charge current values which are applied to almost all apparatuses mounting the Li-ion cell and chargers are within the above mentioned range.

Apparatuses and chargers which adopt a current value which is out of the range are used only for very limited use such as in a case when very high rate charge is required in an emergency. These apparatuses and chargers hardly requires the capacity estimation method of the present invention.

The equations (18), (19), (20) and (21) represent relationship between the necessary time $t_\alpha$ for the charge current to become a times from the start of the CV mode charge in a charge condition of an apparatus using Li-ion cell to which the equations are applied and the specific capacity Cr under the condition, or, represent relationship between the charge current $I_{tm}$ after a lapse of a predetermined time from the start of CV charge and the specific capacity Cr.

When the charge current at the start of the CV mode charge for obtaining the equations (18) and (20) is different from the charge current at the start of the CV mode charge of apparatuses mounting the cell or chargers, following processes need to be performed (the equations (19) and (21) can be prepared based on the specific capacity at the cusp and the equations (18) and (20)).

That is, the necessary time $t_\alpha$ for the charge current to become α times from the start of the CV mode charge or the charge current $I_{tm}$ after a lapse of a predetermined time from the start of CV charge is obtained under each charge condition beforehand. Then, after obtaining a ratio te/tf wherein the time te is under the condition for preparing the equation (18) and the time tf is under the condition which corresponds to the apparatus or the charger, $t_\alpha$ is multiplied by the ratio te/tf for conversion, or, after obtaining a ratio Icf/Ic wherein the charge current Ic is under the condition for preparing the equation (20) and the charge current Icf is under the condition which corresponds to the apparatus or the charger, $I_{tm}$ is multiplied by the ratio Icf/Ic for conversion.

Because, the smaller the current value is, the larger the charge ratio in the CC mode charge (ratio of the CC mode charge to full charge period) is. Thus, charge time in the CV mode changes depending on the charge ratio in the CC mode charge, in addition, necessary time for charge current to decrease to half is affected. Since the effect varies according to cell size, cell shape, manufacturer, cell component material and the like, it is necessary to grasp effects of the current value by performing experiments.

As mentioned before, it is appropriate that the charge current $I_{tm}$ in the equations (20) and (21) used for capacity estimation and degradation estimation of the Li-ion cell is monitored after a laps of the time tm from 1 minute to 15 minuets since the CV mode charge starts. When tm is shorter than 1 minute, variation of the charge current is very susceptible to the state in the cell so that error may occur in measuring current. When tm is longer than 15 minutes, the relationship between the charge current $I_{tm}$ and the specific capacity Cr hardly become the symmetric shape with respect to the cusp so that error in estimation becomes large, which is not favorable.

(Method of Determining Constants A, B, B', M, N and N')

For preparing the equations (18) and (20), it is necessary to determine the constants A and B in the equation (18) and the constants M and N in the equation (20). For this purpose, it is most appropriate to determine the constants A, B, M and N by using a cell or a battery which is the same kind and the same nominal capacity as the Li-ion cell or the battery which is the target of the capacity estimation. Because, in commercial Li-ion cells, many kinds of cathode active materials, anode carbons and electrolytes are used so that initial charge behaviors as well as variations of charge voltage behaviors due to cell degradation differ.

In this embodiment, a method of preparing the equations which can be realized in a very short time will be also proposed in order to generate the equations in which the constants A, B, M and N are determined.

That is, the method includes the steps of:

repeating a charge and discharge cycle-equal to or more than 5 times for the same kind of cell as Li-ion cell which is a target of capacity estimation, wherein the same charge limit voltage Vc, CC mode charge current Ic0, discharge cut-off voltage Vd as those of Li-ion cell or battery which is a target of capacity estimation by equations (18) and (20) are set, charge period per one cycle is from 3 hours to 10 days or from 3 days to 10 days favorably, discharge current Id is from 0.2 CmA to 2.0 CmA, ambient temperature is from 0° C. to 45° C. or from 15° C. to 30° C. which is more favorable;

obtaining an elapsed time $t_\alpha$ from the instant when charge condition is changed from a CC mode to a CV mode to the instant when charge current becomes α (0<α<1) times of charge current Ic0 in the CC mode;

obtaining a charge current $I_{tm}$ after a lapse of a predetermined time tm from the instant when charge condition is changed from a CC mode to a CV mode, wherein tm is from one minutes to 15 minutes;

obtaining specific capacity percentage Cr(Cr=100×(C/Co)) which is a ratio of discharge capacity C (obtained by integrating discharge current with respect to time) to the nominal capacity Co;

recording $t_\alpha$ and Cr obtained in nth cycle (n is a positive integer) as functions of n $t_\alpha(n)$ and Cr(n);

determining the constants A, B and B' such that the equation (18) approximately represents correlation between $t_\alpha(n)$ and Cr(n) when assuming that $t_\alpha=t_\alpha(n)$ and Cr=Cr(n);

recording $I_{tm}$ and Cr obtained in nth cycle (n is a positive integer) as functions of n which are $I_{tm}(n)$ and Cr(n); and determining the constants M, N and N' such that the equation (20) approximately represents correlation between $I_{tm}(n)$ and Cr(n) when assuming that $I_{tm}=I_{tm}(n)$ and Cr=Cr(n).

In the method of determining the constants, as for the equation (18), it is favorable that the charge and discharge cycle is repeated equal to or more than 6 times, and, data of the necessary time $t_\alpha$ for the charge current to decrease to a times of Ic0 from the start of the CV mode charge is used wherein the data is obtained in the cycles after the 4th cycle.

In addition, as for determining the constants B' and N' in the equation (19) and (21), the same method as mentioned above can be used by increasing the number of repetitions of the charge and discharge cycle for bringing about a state in which $t_\alpha(n)$ or $I_{tm}(n)$ decreases as n increases. When the specific capacity Cr at the time when a state in which $t_\alpha(n)$ or $I_{tm}(n)$ increases as n increases changes to a state in which $t_\alpha(n)$ or $I_{tm}(n)$ decreases as n increases is obtained, that is, when the specific capacity Cc at the cusp in which $t_\alpha(n)$ or $I_{tm}(n)$ is the maximum is obtained, B' and N' are determined by equations B'=2Cc−B and N'=2Cc−N.

The reason why the experiment is performed in temperatures from 0° C. to 45° C. is that Li-ion cells are normally used in temperatures in the range. Thus, accurate degradation estimation can be performed by grasping relationship between the necessary time $t_\alpha$ and the specific capacity Cr which reflect progress of cell degradation in the range of temperatures. In addition, it is more favorable to perform the experiment in temperatures from 15° C. to 30° C. since relationship between the necessary time $t_\alpha$ and the specific capacity Cr can be grasped reflecting more real degradation since almost all temperature conditions for actual use are within this range.

The charge period per one cycle is set to be from 3 hours to 10 days. Accordingly, cell degradation per cycle progresses properly so that data for preparing the equation (18) or (20) accurately can be obtained effectively. Particularly, it is favorable that the charge period is set to be from 3 days to 10 days since, by using this range, capacity decrease can be recognized clearly so that data for preparing the equation (18) or (20) can be collected effectively, in addition, an equation by which accurate estimation is realized can be obtained as shown in an example 3-2.

When the charge period is shorter than 3 hours, the progress of degradation of the Li-ion cell becomes slow so that several hundred cycles are required for obtaining data for preparing the equation (18) or (20) in which accurate estimation can be performed. As a result, large amount of time may be consumed. In addition, in some cases, charge ends insufficiently so that it becomes impossible to grasp proper degradation and characteristics since degradation and insufficient charge are mixed. These are unfavorable.

When the charge period per one cycle is longer than 10 days, elapsed time per one cycle becomes long so that it takes much time to obtain necessary data, which is also not favorable.

The discharge current in the charge and discharge cycle experiment is set to be from 0.2 CmA to 2.0 CmA. When the lower limit of the charge current is change to 1.0 CmA, that is, when the charge current is set to be from 1.0 CmA to 2.0 CmA, data can be obtained more effectively. It is not favorable that the charge current is smaller than 0.2 CmA since it take much time to be discharge completely. In addition, when the discharge current is larger than 2.0 CmA, the time required for the discharge becomes so short that measured values of discharge capacity C may vary, in addition, the capacity C decreases suddenly when degradation progresses. Thus, it is not favorable that it becomes impossible to generate the equation (18) and (20) accurately.

When the charge and discharge cycle experiment is performed, a rest of a predetermined time can be included between charge and discharge as necessary due to limitation of settings of the apparatus.

More particularly, in order to obtain the constants A and B in the equation (18), the necessary time $t_\alpha$ for the charge current to decrease to a times (0<α<1) from the time when the CC mode changes to the CV mode and specific capacity percentage Cr which is a ratio of the discharge capacity Cd to the nominal capacity Co are measured for each charge and discharge cycle, wherein the discharge capacity Cd is obtained by integrating discharge current with respect to time. Then, relationship between the measured time $t_\alpha$ and the specific capacity Cr is plotted. Then, the constants A and B are determined such that the equation (18) approximates the relationship accurately.

The reason why $t_\alpha$ and Cr of cycles after the 4th cycle are adopted for determining the constants A and B of the equation (18) is as follows. In many cases, capacity variation until third cycle from the time when the charge and discharge cycle experiment starts is different from that after the cycle due to decomposition reaction on anode carbon which is impurity in the electrolyte. Thus, when data until third cycle is used, an equation in which estimation error is large may be prepared. It is not favorable.

As for above mentioned charge and discharge cycle experiment, more than 5 cycles are performed in order to obtain data necessary for achieving high accuracy in degradation estimation such that error of estimation result becomes within ±20% of real capacity.

When only data of only 4th cycle is used, the constants A and B can not be determined so that the equation (18) can not be prepared. It is favorable to use data of equal to or more than 6 cycles for preparing the equation (18) which can perform capacity estimation and degradation estimation more accurately.

In addition, in the charge and discharge cycle experiment for preparing the equation (20), the charge current $I_{tm}$ after a lapse of a predetermined time tm ranging from 1 minute to 15 minutes from the instant when the CC mode changes to the CV mode and specific capacity percentage Cr which is a ratio of the discharge capacity Cd to the nominal capacity Co are measured for each charge and discharge cycle, wherein the discharge capacity Cd is obtained by integrating discharge current with respect to time. Then, relationship between the measured charge current $I_{tm}$ and the specific capacity Cr are plotted. Then, the constants M and N are determined.

As for above mentioned charge and discharge cycle experiment, equal to or more than 5 cycles are performed in order to obtain data necessary for achieving high accuracy in degradation estimation such that error of estimation result becomes within ±20% of real capacity.

The capacity estimation method and the degradation estimation method for the Li-ion cell using the equations (18), (19), (20) and (21) can be applied to various apparatuses which have a function for charging mounted cells by the CC-CV charge method wherein the apparatuses mount the Li-ion cells as a power source or a backup power source.

As the apparatuses to which the capacity estimation method and the degradation estimation method are applied, for example, the apparatus described in the first embodiment with reference to FIG. 2 can be used. In the configuration shown in FIG. 2, the equations (18') and (19') are input in an available memory in the CPU 7 and the like beforehand, or, in an IC memory which is added as necessary. The CPU 7 provide instructions for measuring the time $t_{1/2}$ for the charge current to decrease to half from the instant when the charge mode changes from the CC mode to the CV mode. In addition, the CPU 7 receives and stores the time $t_{1/2}$ measured by the control part 5. The CPU 7 substitute the time $t_{1/2}$ into the equation (18') or (19') to perform capacity estimation and degradation estimation according to the first method of capacity estimation and degradation estimation and calculate the result.

The result is stored in the memory 8 as necessary. The result of degradation estimation is applied to the body of the apparatus via the line 10 such as a system management bus. The body of the apparatus displays the estimation result to a display part of the apparatus and sounds an alert by using a beep as necessary.

In this way, the apparatus which includes capabilities for performing the capacity estimation method and the degradation estimation method for the Li-ion cell according to the present invention. For example, as in the above mentioned case, the Li-ion cell power source apparatus which includes capacity estimation capability and degradation estimation capability can be realized. The configuration is not limited to the above mentioned one as long as the capacity estimation and the degradation estimation of the Li-ion cell can be performed according to the present invention. For example, the Li-ion cell power source apparatus which performs capacity estimation and degradation estimation by using the equations (18) and (19) or equations (20) and (21) can be realized by modifying calculation way in the CPU 7 and measurement targets in the control part 5 in the configuration shown in FIG. 2.

In addition, the capacity estimation method and the degradation estimation method for the Li-ion cell in the third embodiment can be also applied to a battery by providing a control microprocessor and additional memory as necessary. An example of such a battery is shown in FIG. 3. As for this embodiment, in the configuration shown in FIG. 3, a timer is provided in the IC 13 for protection of safety mechanism and the equations (18') and (19') are input in an available memory. The IC 13 for protection monitors the voltage across the Li-ion cells 12-1, 12-2, and 12-3. The time $t_{1/2}$ for the charge current to decrease to half from the instant when the charge mode changes from the CC mode to the CV mode is counted and stored. Then, the time $t_{1/2}$ is substituted into the equations (18') and (19') to calculate the specific capacity Cr. An additional IC can be provided other than the IC 13 for protection at a proper position in the battery as necessary.

The result of degradation estimation is output to the body of the apparatus which mounts the battery 11. The body of the apparatus displays the estimation result to a display or sounds an alert by using a beep.

In this way, the Li-ion battery which includes the degradation estimation capability of the present invention can be realized from an existing Li-ion battery with a minimum modification. The configuration is not limited to the above mentioned one as long as the capacity estimation and the degradation estimation of the Li-ion cell can be performed according to the present invention. For example, the Li-ion cell battery which performs capacity estimation and degradation estimation by using the equations (18) and (19) or equations (20) and (21) can be realized by modifying calculation way in the IC for protection and measurement targets for performing capacity estimation and degradation estimation of the cell.

Like the embodiments described so far, the capacity estimation method and the degradation estimation method and the Li-ion battery which includes the capacity estimation capability and the degradation estimation capability of the present invention can be applied to apparatuses for which high reliability is required. By applying the present invention to the apparatuses, degradation status of cells can be grasped properly and the cells can be exchanged in a timely fashion so that troubles of the apparatuses can be avoided. There is no problem in that any apparatus which use Li-ion cells adopts the degradation estimation method or the Li-ion battery which has the degradation estimation capability. Accordingly, cells can be exchanged with minimum waste so that the present invention can be used very advantageously.

EXAMPLES

In the following, the capacity estimation method, the degradation estimation method, the capacity estimation apparatus and the degradation estimation apparatus for the Li-ion cell and the Li-ion battery will be described in more detail. However, the present invention is not limited to the following examples.

Example 3-1

An experiment was performed in which a prismatic Li-ion cell (the nominal capacity was 600 mAh) was placed in an oven at a constant temperature of 25° C. and connected to a cell charge and discharge automatic test apparatus which has data collection and data storing capability in order to obtain an equation for the Li-ion cell. In the experiment, the test cell was cycled 10 times by discharging at 600 mA (1.0 CmA) to 2.75V and charging in CC-CV mode at 600 mA (1.0 CmA) to 4.1V for 7 days with intervals of one hour between charge and discharge.

In each cycle of charge and discharge, an elapsed time $t_{1/2}$ (hr) from the start of the constant voltage (CV) mode charge until the charge current decreases to ½ of that at the start time and a specific capacity percentage Cr(%) which is a ratio of discharge capacity C to the nominal capacity Co were measured, wherein the discharge capacity C was calculated by integrating the discharge current with respect to time, and Cr=100×(C/Co).

A following equation (22) was obtained from relationship between the time $t_{1/2}$ (hr) and the specific capacity Cr which was obtained from 4th cycle till 10th cycle.

$$Cr=-33.7t_{1/2}+101 \qquad (22)$$

Another experiment was performed as follows.

In this experiment, a used prismatic Li-ion cell (the nominal capacity was 600 mAh) was used. The used cell was cycled by discharging at 600 mA (1.0 CmA) to 2.75V and charging in CC-CV mode at 600 mA (1.0 CmA) to 4.1V for 3 hours with intervals of 10 minutes between charge and discharge.

In each cycle of charge and discharge, the elapsed time $t_{1/2}$ (hr) from the instant when the CV mode charge started to the instant when the charge current decreased to ½ of that at the start time and the specific capacity percentage Cr(%) which was a ratio of discharge capacity C to the nominal capacity 600 mAh were measured and recorded, wherein the discharge capacity C was calculated by integrating the discharge current with respect to time.

As the specific capacity Cr decreased, the time $t_{1/2}$ increased. However, from 9th cycle, as the specific capacity Cr decreased, the time $t_{1/2}$ decreased. Therefore, the relationship between the time $t_{1/2}$ and the specific capacity Cr from the 9th cycle can be approximated by the equation $$Cr = At_{1/2} + B' \quad (19')$$

Thus, it is necessary to determine the constants A and B' in the equation (19'). The constant A is the same as A, which is 33.7(1/hr), in the equation (22). The constant B' can be obtained as B'=70.67(%) by using Cc=85.835(%) and B'=2Cc−B, wherein Cc=85.835 is obtained as Cr by substituting $t_{1/2}$ at the 9th cycle, which is 0.45(hr), into the equation (22). Accordingly, the equation (19') becomes the following equation (23).

$$Cr = 33.7 t_{1/2} + 70.67 \quad (23)$$

Validity of the equations (22) and (23) obtained like this was evaluated. The result is shown in FIG. 21.

Figure 21:
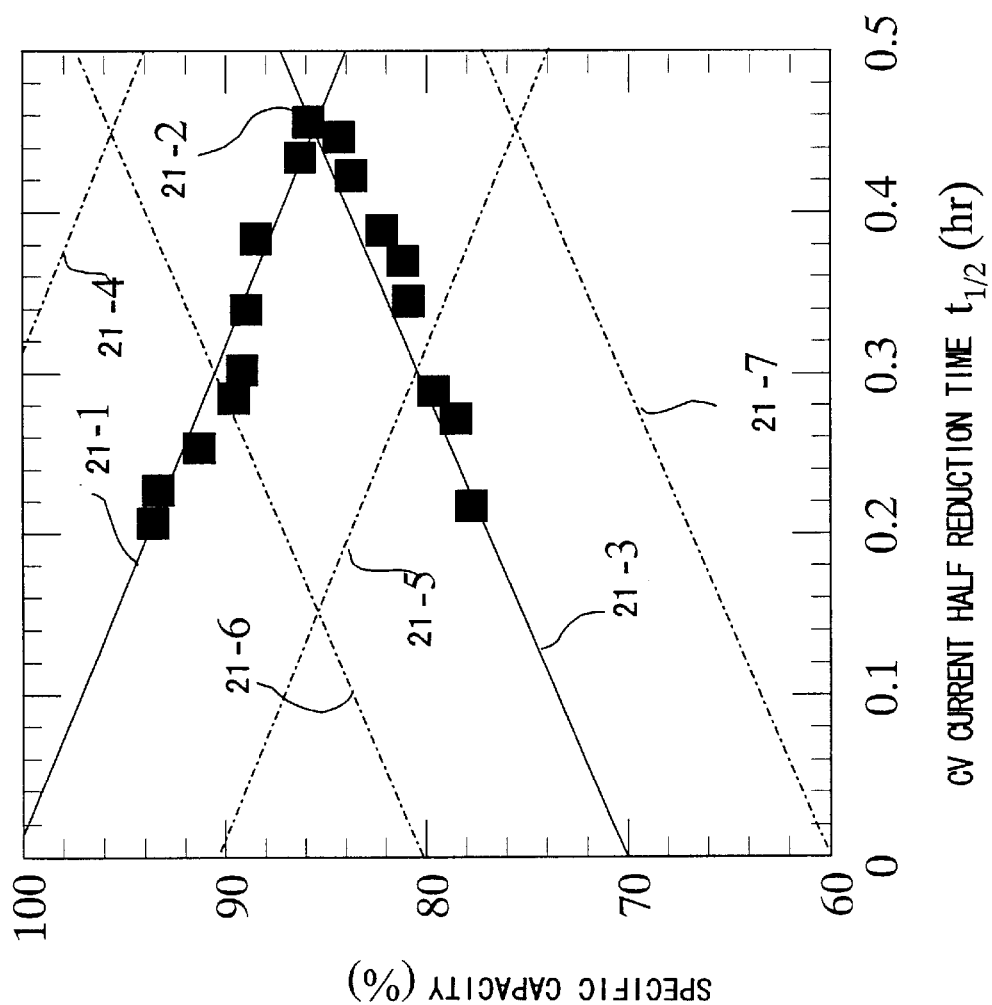
FIG. 21 shows relationship between time $t_{1/2}$ and specific capacity Cr which are results of charge and discharge cycling tests in an example 3-1.

FIG. 21 shows relationship between the time $t_{1/2}$ and the specific capacity Cr. In the figure, 21-1 indicates a line which represents the equation (22), 21-2 indicates data (measurement point) of the 9th cycle and 21-3 indicates a line which represents the equation (23).

In addition, in FIG. 21, 21-4 and 21-5 indicate lines which represent ±10% (that is, error of ±10%) of the estimated capacity obtained by the equation (22). 21-6 and 21-7 are lines which represent ±10% of the estimated capacity obtained by the equation (23).

As shown in FIG. 21, every point of the measured data is within the error of ±10%. In addition, these points are very close to the lines 21-1 and 21-3 which represent the equations (22) and (23). This reveals that the capacity estimation method and the degradation estimation method of the present invention provides accurate results of capacity estimation and degradation estimation.

Example 3-2

An experiment was performed in which 6 prismatic Li-ion cells (the nominal capacity was 600 mAh) were placed in an oven at a constant temperature of 25° C. and each of the cells was separately connected to a cell charge and discharge automatic test apparatus which has data collection and data storing capability in order to obtain an equation for the Li-ion cell. In the experiment, the 6 test cells were cycled 10 times by discharging at 600 mA (1.0 CmA) to 2.75V and charging in CC-CV mode at 600 mA (1.0 CmA) to 4.1V with intervals of one hour between charge and discharge. The charge period for the 6 cells was 2 hours, 3 hours, 3 days, 7 days, 10 days, and 11 days, respectively.

In each cycle of charge and discharge, the elapsed time $t_{1/2}$ (hr) from the start of the CV mode charge to the instant when the charge current decreased to ½ of that at the CV mode charge start time and the specific capacity Cr(%) which was a ratio of discharge capacity C to the nominal capacity Co were measured, wherein the discharge capacity C was calculated by integrating the discharge current with respect to time.

Equations I shown in FIG. 22 were obtained from data of the time $t_{1/2}$ (hr) and the specific capacity Cr which was obtained from 4th cycle till 10th cycle. In this figure, "t" is used as "$t_{1/2}$" and "C" is used as "Cr". In addition, symbols shown in FIG. 23 which represent measurement points used for obtaining the equations I are indicated.

Another experiment was performed as follows.

In this experiment, a used prismatic Li-ion cell (the nominal capacity was 600 mAh) was used. The used cell was cycled 45 times by discharging at 600 mA (1.0 CmA) to 2.75V and charging in CC-CV mode at 600 mA (1.0 CmA) to 4.1V for 3 hours with intervals of 10 minutes between charge and discharge. The test was done at ambient temperature.

In each cycle of charge and discharge, the elapsed time $t_{1/2}$ (hr) from the instant when the CV mode charge started to the instant when the charge current decreased to ½ of that at the CV mode start time and the specific capacity percentage Cr(%) which was a ratio of discharge capacity C to the nominal capacity 600 mAh were recorded. Then, the validity of the equations I shown in FIG. 22 was evaluated.

In this experiment, the time $t_{1/2}$ for the CV charge current to decrease to half at 30th cycle indicated the maximum value 0.455. After that, the time $t_{1/2}$ decreased as the number of repetition increased. Equations II corresponding to the equations I were prepared by using the maximum value of the time $t_{1/2}$, the specific capacity Cc=91.8% and the equation B'=2Cc−B. The validity of the equations II was also evaluated.

Figure 23:
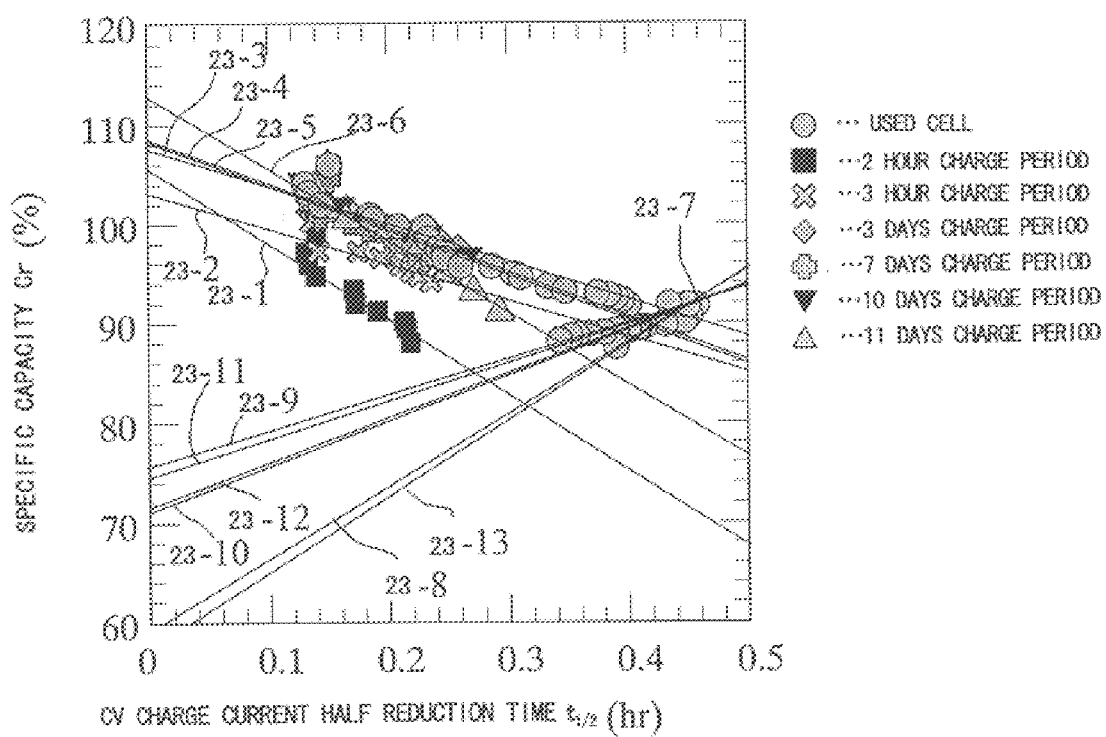
FIG. 23 shows relationship between the time $t_{1/2}$ elapsed from the instant when the CV mode charge starts to the instant when charge current decreases to half and the specific capacity Cr, and each equation obtained in an example 3-2 of the present invention.

FIG. 23 shows relationship between the time $t_{1/2}$ and the specific capacity Cr. In the figure, points of measurement data until 45th cycle are indicated by closed circles (gray circles).

In addition, in FIG. 23, points of experiment data for preparing the equations I shown in FIG. 22 and lines representing the equations I are shown in which the points of experiment data are indicated by symbols shown in FIG. 22. 23-1 indicates a line which represents the equation I prepared by data of 2 hour charge period, 23-2 indicates a line which represents the equation I prepared by data of 3 hour charge period, 23-3 indicates a line which represents the equation I prepared by data of 3 day charge period, 23-4 indicates a line which represents the equation I prepared by data of 7 day charge period, 23-5 indicates a line which represents the equation I prepared by data of 10 day charge period, 23-6 indicates a line which represents the equation I prepared by data of 11 day charge period.

In addition, in FIG. 23, 23-7 indicates a measurement point (corresponding to the cusp) in which the time $t_{1/2}$ is the maximum, and lines representing the equations II which were prepared by using the maximum value are shown. 23-8 indicates a line which represents the equation II prepared by data of 2 hour charge period, 23-9 indicates a line which represents the equation II prepared by data of 3 hour charge period, 23-10 indicates a line which represents the equation II prepared by data of 3 day charge period, 23-11 indicates a line which represents the equation II prepared by data of 7 day charge period, 23-12 indicates a line which represents the equation II prepared by data of 10 day charge period, 23-12 indicates a line which represents the equation II prepared by data of 11 day charge period, In addition, the estimated specific capacity was calculated by substituting the time $t_{1/2}$ into each equation I and maximum error between the estimated specific capacity and actual measurement specific capacity was obtained. The maximum error for each equation I is shown in FIG. 22. As shown in FIG. 22, when the charge period was 7 days, the maximum error was minimum. In addition, estimated specific capacity was calculated from the equation II when the time $t_{1/2}$ was 0.1 hr and difference in the estimated specific capacity with reference to the equation II corresponding to 7 day charge period is shown as maximum error for each equation II in FIG. 22.

As shown in FIGS. 22 and 23, for each of the specific capacities obtained by equations I corresponding to the charge periods ranging from 3 hours to 10 days, the error is within ±10% which is a good estimation result. Especially, as shown in FIG. 22, when the charge period is set from 3 days to 10 days, the estimation error becomes within ±5%. Thus, it is revealed that estimation of very high accuracy can be performed.

Also, as for the equations II, when the charge period is set to be from 3 days to 10 days, the estimation error becomes within ±10%. Thus, it is revealed that estimation of high accuracy can be performed.

On the other hand, according to equations I and II prepared by experiments in which the charge period was set to be 2 hours or 11 days, it is revealed that accurate degradation estimation is difficult.

Example 3—3

An experiment was performed in which 4 prismatic Li-ion cells (the nominal capacity was 600 mAh) were placed in ambient temperature and each of the cells was-separately connected to a cell charge and discharge automatic test apparatus which has data collection and data storing capability in order to obtain equations for the Li-ion cell. In the experiment, the 4 test cells were cycled 10 times by discharging at 600 mA (1.0 CmA) to 2.75V and charging in CC-CV mode at 600 mA (1.0 CmA) to 4.1V for 7 days with intervals of one hour between charge and discharge.

In each cycle of charge and discharge, the elapsed time $t_{1/2}$ (hr) from the start of the constant voltage (CV) mode charge until the charge current decreases to ½ of that at the CV mode charge start time and the specific capacity Cr(%) which is a ratio of discharge capacity C to the nominal capacity Co were measured.

Four equations were obtained from the time $t_{1/2}$ and the specific capacity Cr from first cycle till 4th cycle, the time $t_{1/2}$ and the specific capacity Cr of 4th and 5th cycles, the time $t_{1/2}$ and the specific capacity Cr from 4th cycle till 6th cycle, the time $t_{1/2}$ and the specific capacity Cr from first cycle till 10th cycle, respectively.

The specific capacities calculated by the equations and actual measurement specific capacities were compared in which actual measurement data for the used prismatic Li-ion cell (the nominal capacity was 600 mAh) used in the example 3-2 was used, wherein the actual measurement data was data of the elapsed time $t_{1/2}$ (hr) from the start of the constant voltage (CV) mode until the charge current decreases to half and the specific capacity Cr which was a ratio of discharge capacity C to the nominal capacity 600 mAh for 45 cycles.

Figure 24:
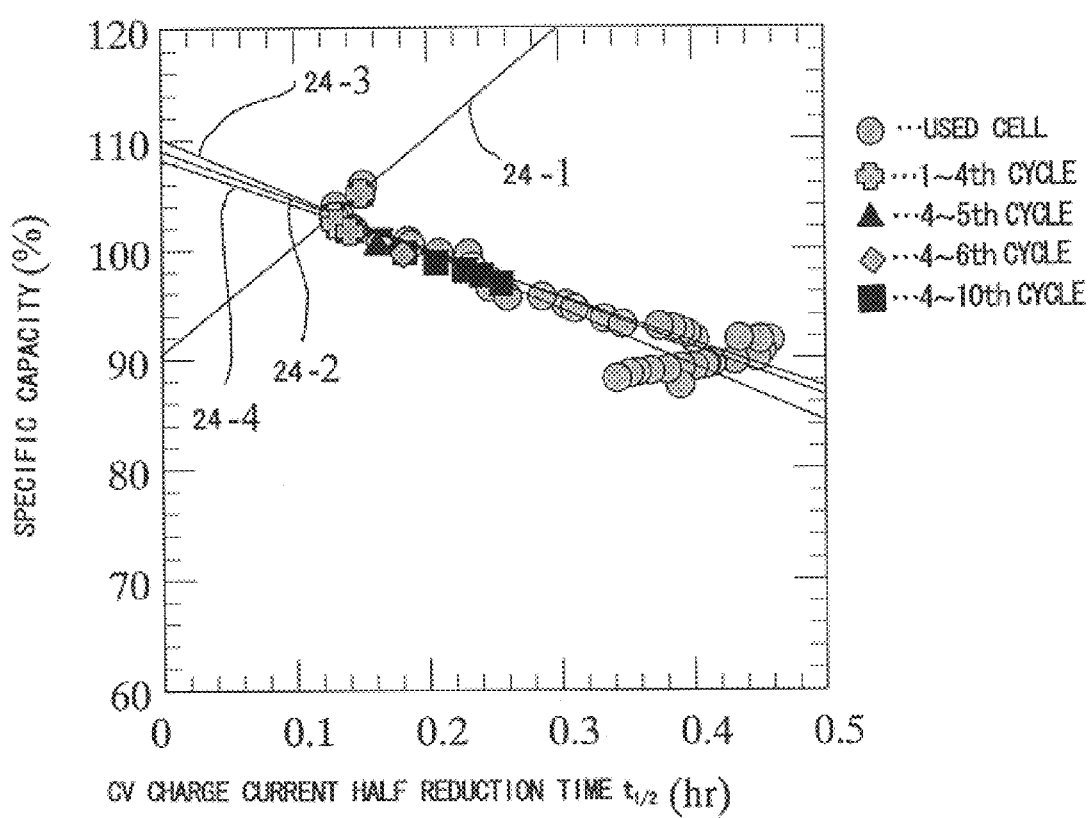
FIG. 24 shows data of relationship between the time $t_{1/2}$ elapsed from the instant when the CV mode charge starts to the instant when charge current decreases to half and the specific capacity Cr, and each equation obtained in an example 3—3 of the present invention.

The result is shown in FIG. 24.

FIG. 24 shows the relationship between the necessary time $t_{1/2}$(hr) from the start of the CV charge mode until the charge current decreases to half and the specific capacity Cr. In the figure, the closed circles (gray circles) indicate actual measurement data for the used prismatic cell obtained in the example 3-2, 24-1 indicates a line which represents the equation prepared by measurement data from first cycle to 4th cycle, 24-2 indicates a line which represents the equation prepared by measurement data of 4th cycle and 5th cycle, 24-3 indicates a line which represents the equation prepared by measurement data from 4th cycle to 6th cycle, 24-4 indicates a line which represents the equation prepared by measurement data from 4th cycle to 10th cycle. In the right side of FIG. 24, symbols of measurement data which were used for obtaining the equations and cycles corresponding to the symbols are shown.

As is evident from FIG. 24, according to the method of preparing the equation of the present invention, accurate estimation becomes possible. That is, the maximum error of the specific capacity calculated by the equation prepared from data of 4th cycle and 5th cycle against actual measurement data is 3.2%, the maximum error of the specific capacity calculated by the equation prepared from data from 4th cycle till 6th cycle against actual measurement data is 5.4%, the maximum error of the specific capacity calculated by the equation prepared from data from 4th cycle till 10th cycle against actual measurement data is 2.1%, which shows good estimation accuracy.

On the other hand, the maximum error of the specific capacity calculated by the equation prepared from data from first cycle till 4th cycle against actual measurement data is 43.5%, which is not favorable since it exceeds ±20%.

Example 3-4

An experiment was performed in which 5 prismatic Li-ion cells (the nominal capacity was 600 mAh) were placed in an oven at a constant temperature of 5° C. and each of the cells was separately connected to a cell charge and discharge automatic test apparatus which has data collection and data storing capability in order to obtain equations for the Li-ion cell. In the experiment, the 5 test cells were cycled 10 times by discharging at 600 mA (1.0 CmA) to 2.75V and charging in CC-CV mode at 600 mA (1.0 CmA) to 4.1V for 7 days with intervals of one hour between charge and discharge.

In each cycle of charge and discharge, the charge current $I_{5min}$ (expressed in the unit of 1.0 CmA) after a lapse of 5 minutes from the start of the CV mode charge and the specific capacity Cr(%) which was a ratio of discharge capacity C to the nominal capacity were measured.

A following equation (24) was obtained from data of the charge current $I_{5min}$ (CmA) after a lapse of 5 minutes from the start of the CV mode charge and the specific capacity Cr(%) obtained by the cycles from 4th cycle to 10th cycle.

$$Cr=-58.6I_{5min}+143 \qquad (24)$$

The specific capacities calculated by the equations and actual measurement specific capacities were compared in which actual measurement data for the used prismatic Li-ion cell (the nominal capacity was 600 mAh) used in the example 3-2 for 45 cycles was used as the actual measurement specific capacities, wherein the actual measurement data was the charge current $I_{5min}$ (CmA) after a lapse of 5 minutes from the start of the CV mode charge and the specific capacity Cr(%) which was a ratio of discharge capacity C to the nominal capacity 600 mAh for 45 cycles.

In addition, $I_{5min}$ indicates the maximum value at 30th cycle. After that, $I_{5min}$ decreased as the number of repetitions of the cycle increased. Thus, an equation $$Cr=58.6I_{5min}+40.5 \qquad (25)$$

was prepared from the capacity Cc=91.8(%) at the time when $I_{5min}$ was the maximum and the equation N' =2Cc−N, wherein the equation (25) is applied to data of cycles after the 30th cycle. Then, the specific capacities calculated by this equation and actual measurement specific capacities were compared.

Figure 25:
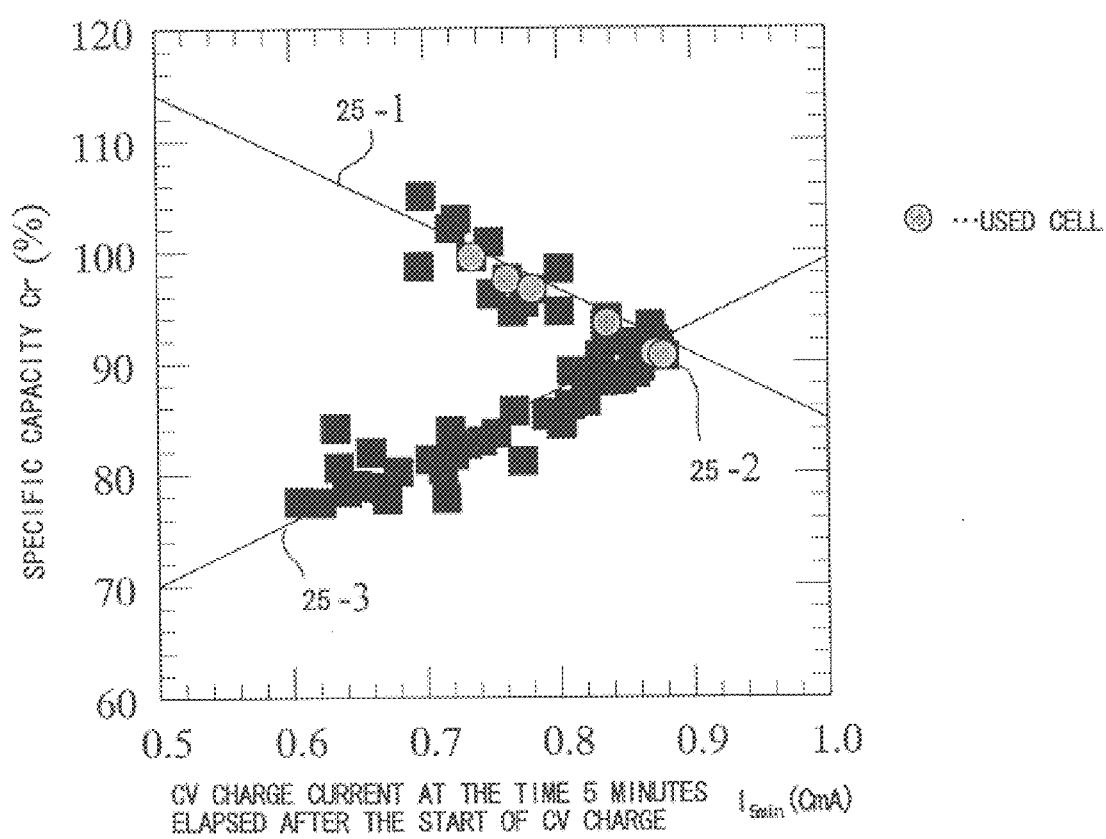
FIG. 25 shows data of relationship between the charge current $I_{5min}$ after a lapse of 5 minutes from the start of the CV mode charge and the specific capacity Cr, and each equation in an example 3-4 of the present invention.

The result is shown in FIG. 25.

FIG. 25 shows the relationship between the charge current $I_{5min}$ (CmA) after a lapse of 5 minutes from the start of the CV mode charge and the specific capacity Cr(%). In the figure, the closed circles (gray circles) indicate actual measurement data for the used prismatic cell. Closed (black) rectangles indicate measurement data points obtained by cycles for preparing the equations (24) and (25). In the figure, 25-1 indicates a line which represents the equation (24), 25-3 indicates a line which represents the equation (25) which was prepared by deciding the constants from the cusp 25-2 (a point in which $I_{5min}$ takes the maximum value) in measurement data.

As shown in FIG. 25, every point of the measured data is within the error of ±20%. This reveals that the capacity estimation method and the degradation estimation method of the present invention provides accurate results of capacity estimation and degradation estimation.

Example 3-5

An experiment was performed in which 6 prismatic Li-ion cells (the nominal capacity was 600 mAh) were placed in an oven at a constant temperature of 25° C. and each of the cells was separately connected to a cell charge and discharge automatic test apparatus which has data collection and data storing capability in order to obtain equations for the Li-ion cell. In the experiment, the 6 test cells were cycled 10 times by discharging at 600 mA (1.0 CmA) to 2.75V and charging in CC-CV mode at 600 mA (1.0 CmA) to 4.1V for 7 days with intervals of one hour between charge and discharge.

In each cycle of charge and discharge, the charge current $I_{30sec}$, $I_{1min}$, $I_{5min}$, $I_{15min}$, and $I_{20min}$ (1.0 CmA) after a lapse of 30 seconds, 1 minute, 5 minutes, 15 minutes, and 20 minutes respectively from the start of the CV mode charge and the specific capacity Cr(%) which was a ratio of discharge capacity C to the nominal capacity were measured.

Figure 26:
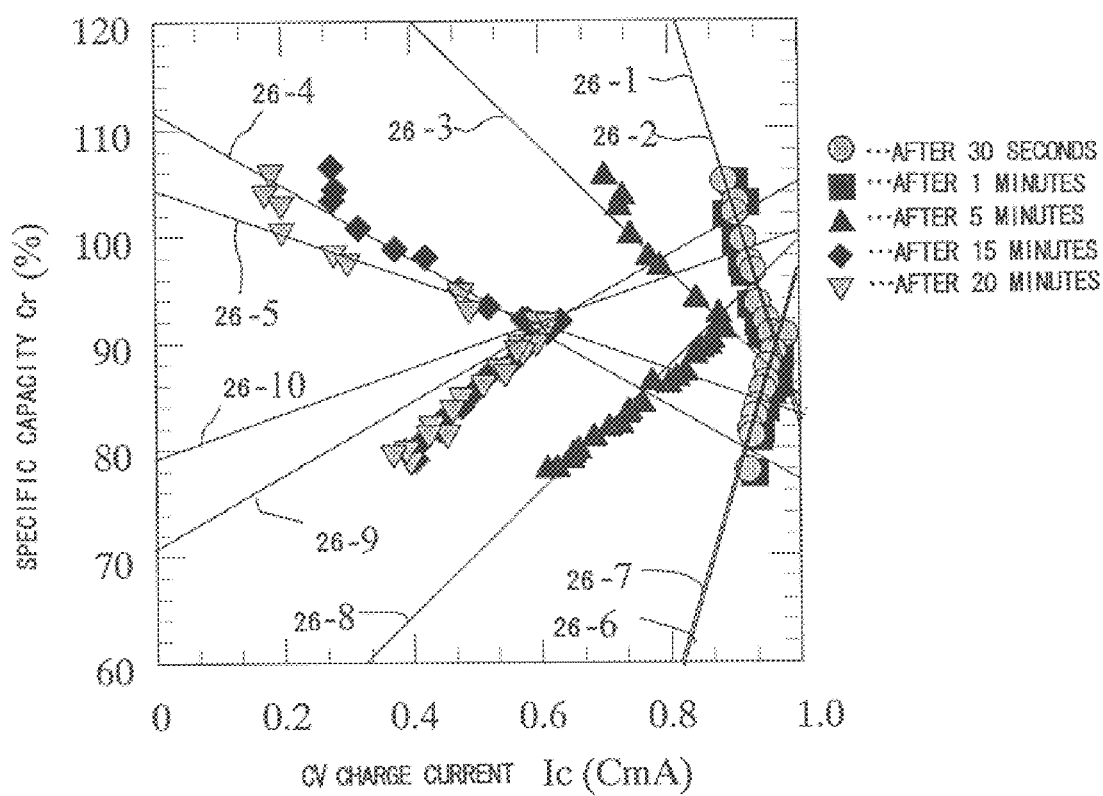
FIG. 26 shows data of relationship between charge current after a lapse of a predetermined time from the start of the CV mode charge and the specific capacity Cr, and each equation in an example 3-5 of the present invention.

The result is shown in FIG. 26.

FIG. 26 shows measurement data obtained by the experiment and lines representing equations prepared from the charge currents ($I_{30sec}$, $I_{1min}$, $I_{5min}$, $I_{15min}$, and $I_{20min}$) from 4th cycle till 10th cycle and the specific capacities Cr. In the figure, 26-1 indicates a line prepared from the charge current $I_{30sec}$ after 30 seconds from the start of CV charge, 26-2 indicates a line prepared from the charge current $I_{1min}$ after 1 minute from the start of CV charge, 26-3 indicates a line prepared from the charge current $I_{5min}$ after 5 minute from the start of CV charge, 26-4 indicates a line prepared from the charge current $I_{15min}$ after 15 minute from the start of CV charge, 26-5 indicates a line prepared from the charge current $I_{20min}$ after 20 minute from the start of CV charge. In addition, in the right side of the figure, the lapse time from the start of the CV charge to the charge current measuring time, and the corresponding measurement data symbols are shown.

As shown in FIG. 26, when the specific capacity is 91.8%, the charge current becomes maximum and the charge current decreases as the number of repetitions of the cycle increases after the cycle corresponding to the maximum specific capacity. Thus, the point corresponding to the maximum specific capacity is a cusp.

Other equations were prepared in which signs of the above mentioned equations were reversed with respect to the value at the cusp. The prepared equations are indicated by 26-6, 26-7, 26-8, 26-9, and 26-10 in which the lapse time is 30 seconds, 1 minute, 5 minutes, 15 minutes, and 20 minutes, respectively.

As is evident from FIG. 26, good capacity estimation and good degradation estimation can be performed when lapse times ranging from 1 minute to 15 minutes are used. On the other hand, it is not favorable that the lapse time is larger than 20 minutes since error becomes large after the cusp. In addition, when the lapse time is 30 seconds, whole consistency between the equations and the measurement data is good, however, the charge current values varies vary much. Thus, error of capacity estimation may become large by using the varied current values, which is not favorable.

As is evident from the explanation of the examples 3-1 to 3-5, according to the present invention, the accurate capacity estimation method and the accurate degradation estimation method can be provided.

Example 3-6

In this example, a charger which charges a battery by using the CC-CV charge method was manufactured and will be shown. The battery includes three prismatic Li-ion cells (nominal capacity of each is 600 mAh) which are connected in series. In the CC-CV charge method used by the charger for charging the battery, the charge limit voltage is 12.3V, the charge current is 600 mA (1.0 CmA) and charge-end current which is a threshold for ending charge is 60 mA (0.05 CmA). The charger has capabilities for performing capacity estimation and degradation estimation in which cell life estimation criterion Ck is 360 mAh (60% of the nominal capacity) according to the present invention. That is, the charger includes the degradation estimation apparatus for the Li-ion cell of the present invention. The configuration of the battery is the same as that shown in FIG. 11.

Figure 27:
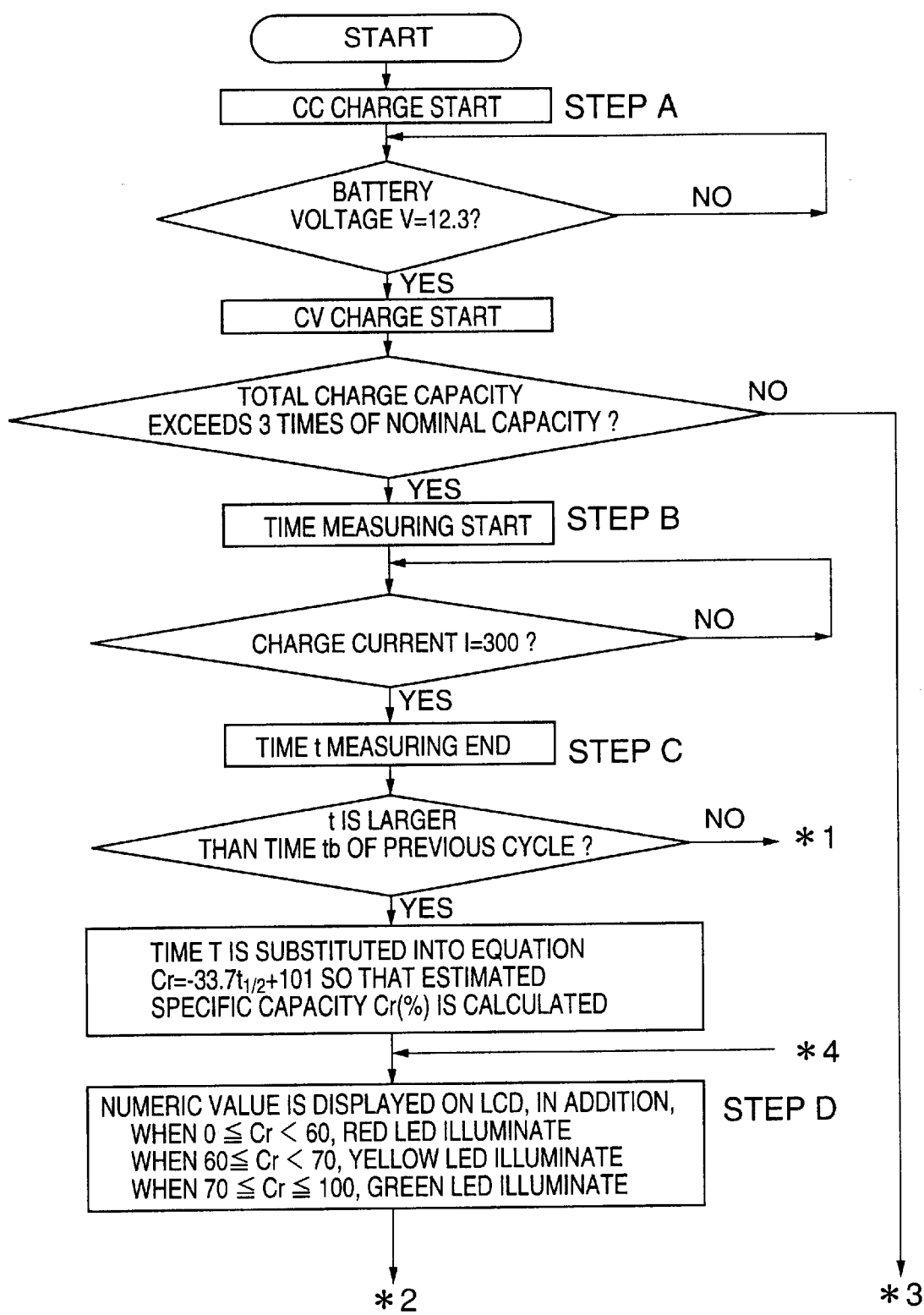
FIG. 27 is a flowchart showing degradation estimation procedures performed in an experiment 3-6 of the present invention.
Figure 28:
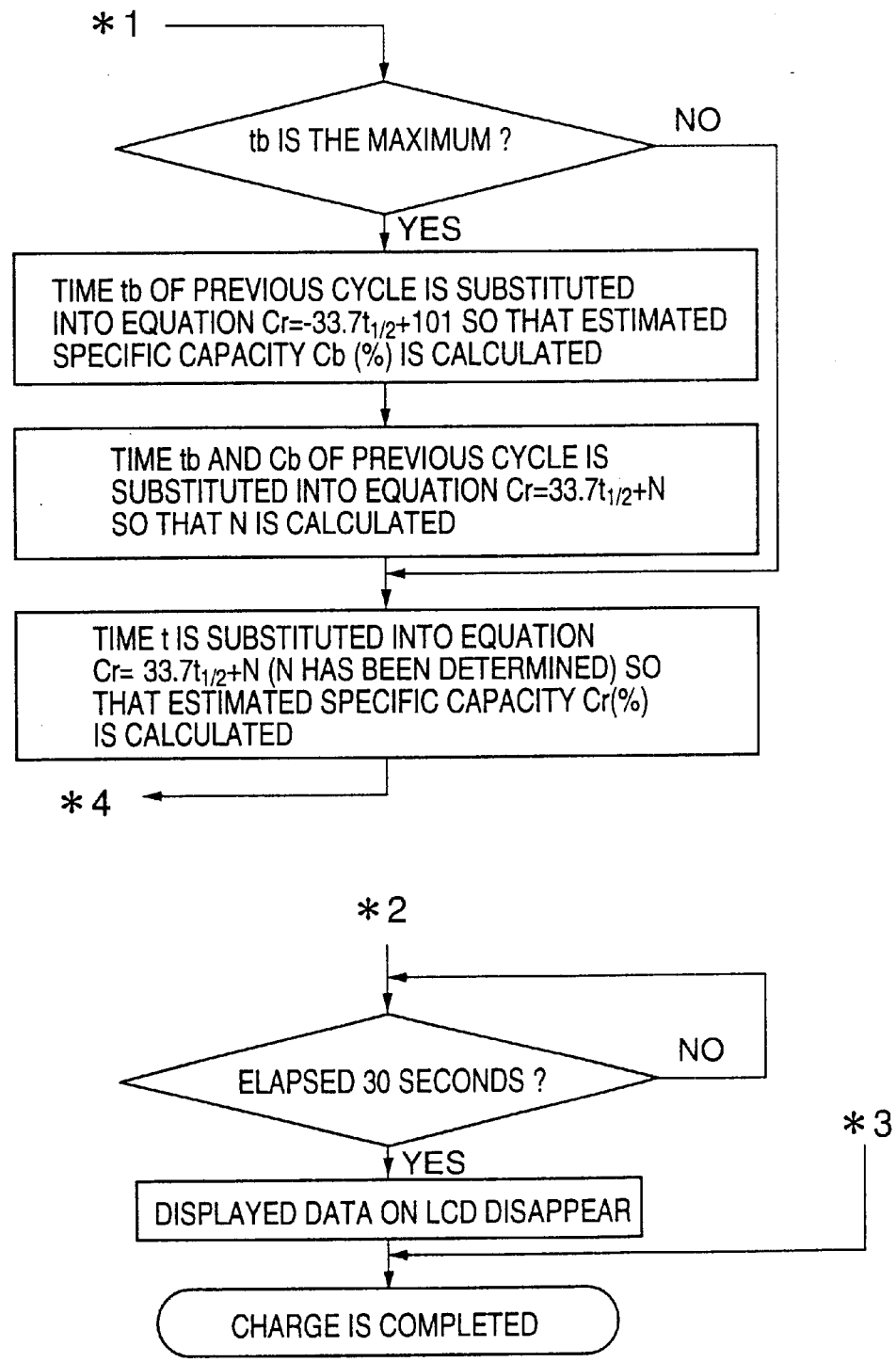
FIG. 28 is a continuation of FIG. 27.

Next, the procedures for degradation estimation of the charger will be described with reference to FIGS. 27 and 28 (FIG. 28 is continuation of FIG. 27).

(step A) The CC charge is started by placing the battery in the charger so that the battery voltage is monitored. The charge mode is changed to the CV mode at the time when the battery voltage reaches the charge limit voltage 12.3V (4.1 V/cell). Then, when total charge capacity exceeds three times of the nominal capacity, time measuring for capacity estimation and degradation estimation is started. At the same time, the charge current is monitored.

(step B) When the charge current reaches 300 mA (0.5 CmA), the time measuring ends. The elapsed time $t_{1/2}$(hr) from the instant when the charge voltage reaches the charge limit voltage to the instant when the charge current reaches 300 mA is recorded.

(step C) The elapsed time $t_{1/2}$(hr) is substituted into the equation Cr=−33.7$t_{1/2}$+101 (22) so that the specific capacity Cr (%) is calculated. When the elapsed time $t_{1/2}$b of previous cycle is recorded and $t_{1/2}$<$t_{1/2}$b is satisfied and when this inequality is satisfied for the first time, the specific capacity Cr(%) (this is indicated by Cb) is obtained by substituting $t_{1/2}$b into the equation (22). In other cases, the specific capacity Cr(%) is obtained by substituting $t_{1/2}$ into the equation Cr=33.7$t_{1/2}$+N' (23') (N' is a positive constant) instead of the equation (22). The constant N' can be obtained by substituting the maximum $t_{1/2}$ and the specific capacity Cr (the above mentioned Cb) at the point of the cusp into the equation (23'). This method of obtaining the constant N' is equivalent to the method of using the equation N'=2Cc−N. In FIG. 28 (continuation of FIG. 27), N' is represented as simply N.

(step D) The calculation result is displayed on the LCD and the LED. According to the estimated specific capacity, one of red, yellow and green LEDs illuminates. At the same time, a numeric value is displayed on the LCD. The value is displayed on the LCD for 30 seconds and the LED illuminates while the charger is connected to the utility power source.

The capacity estimation and degradation estimation of the present invention is performed in the following way.

A program including the equation (22) prepared in the example 3-1 and the steps shown in FIGS. 27 and 28 are stored in the charge be control microprocessor 30 beforehand. While monitoring of the battery voltage and the charge current, the internal timer measures the time $t_{1/2}$ elapsed from the time the battery voltage reaches 12.3 V, that is, from the time the charge mode changes from the CC mode to the CV mode until the charge current decreases to ½ (300 mA). Then, capacity estimation and degradation estimation of the Li-ion battery is performed by applying the time $t_{1/2}$ to the equation (22) or (23') so that the estimated capacity and the result of degradation estimation are displayed on the display part 32.

The charger of this embodiment displays a timer on the LCD such that the charge time of the battery can be recognized.

By using this charger, a used battery of the same type was placed in this charger and was charged. The degradation estimation result was displayed 27 minutes after the time when the charge mode was changed from the CC mode to the CV mode. The charge completed 3 hours and 6 minutes after the time of the mode change. "86%" was displayed on the LCD as the estimated specific capacity and the green LED illuminated.

Then, the charged battery was mounted in the battery charge and discharge automatic test apparatus so that constant current discharge was performed wherein the discharge current was set to be 600 mA (1.0 CmA) and the discharge cut-off voltage was set to be 8.25V. The discharge capacity was 534 mAh according to this test. This value is equivalent to 89% as specific capacity, which revealed that the error of capacity estimation was about 3%.

Accordingly, it becomes evident that the charger having capabilities of capacity estimation and degradation estimation of the present invention can estimate capacity with high accuracy, thus, can estimate degradation with high accuracy. In this embodiment, the charge control microprocessor forms the degradation estimation apparatus of the Li-ion battery of the present invention.

As is evident from the above description, according to the present invention, an degradation estimation apparatus which can perform the degradation estimation of the Li-ion battery with high accuracy.

Example 3-7

A Li-ion battery which can be mounted in a portable information terminal was manufactured. The configuration is the same as that shown in FIG. 3. The Li-ion battery has a capability of performing the CC-CV method charge on condition that the charge limit voltage is 12.3V, charge current is 600 mA (1.0 CmA) and the charge end current is 60 mA. The battery includes three prismatic Li-ion cells (nominal capacity is 600 mAh) 12-1, 12-2, and 12-3 which are connected in series. The equation (22) is stored in the IC for protection beforehand.

In addition, a program is stored in a memory in the IC 13 for protection. According to this program, following process is performed. The voltage across the cells 12-1, 12-2, and 12-3 is monitored by Vcc and Vss. The charge voltage is monitored and the elapsed time $t_{1/2}$ from the time when the voltage becomes the charge limit voltage 12.3V (4.1 V/cell), that is, from the time when the charge mode changes from the CC mode to the CV mode to the time the charge current decreases to ½ (300 mA (0.5 CmA)) is measured. According to the procedure shown in FIGS. 27 and 28 except for steps of displaying, the time $t_{1/2}$ is substituted into the equation (22). Or, when $t_{1/2}$ becomes smaller than $t_{1/2}b$ of previous cycle, the equation (23') described in the example 3-6 is prepared and $t_{1/2}$ is substituted into the equation (23'). Then, the specific capacity Cr is calculated.

The battery is configured such that the result is output to the body of the portable terminal in order to be displayed on an LCD of the portable terminal via the terminal 19.

On the LCD, a numerical value indicating the degradation estimation result is displayed as % and a bar in which a part of the bar corresponding to the % value ratio is-colored is displayed.

A command for doing degradation estimation is provided from the body of the portable terminal concurrently with the start of charge. Procedures for performing the degradation estimation are the same as those shown in FIGS. 27 and 28 except for the result to be sent to the body since the result is displayed on the display of the portable terminal.

The battery was mounted in the portable information terminal and used for one hour. After that, charge of the battery was started by connecting the terminal to the utility power source. The estimated specific capacity of the battery was displayed as 86% after the start of the charge. After checking that a sign of charge completion was displayed, the information terminal was powered off and the battery was removed from the terminal. Then, the battery was connected to the battery charge and discharge automatic test apparatus by using proper codes and the discharge capacity was measured by discharging the battery at 600 mA (1.0 CmA) to 8.25V (2.75 V/cell). As a result, the discharge capacity was 501 mAh, which means that the specific capacity was 83.5%.

Thus, the error of estimation was −2.5%, which means estimation was performed accurately. This battery is also the Li-ion battery which includes the degradation estimation capability of the present invention. Since degradation estimation by the degradation estimation capability is performed on the basis of the capacity estimation capability having high accuracy, this battery can be the to be a Li-ion battery having accurate degradation estimation capability.

In the third embodiment, the charge current after a lapse of a time in the CV charge mode may not indicate the maximum value with respect to capacity variation depending on the charge current, the discharge current, cell use period and the like, or, the time for the charge current to become half may not indicate the maximum value. In the following, simpler capacity estimation methods and degradation estimation methods for such cases will be described as the fourth embodiment and the fifth embodiment in the following.

(Fourth Embodiment)

In the following, fourth embodiment will be described. In the fourth embodiment, current value after a lapse of a predetermined time in the CV mode is used.

Figure 29:
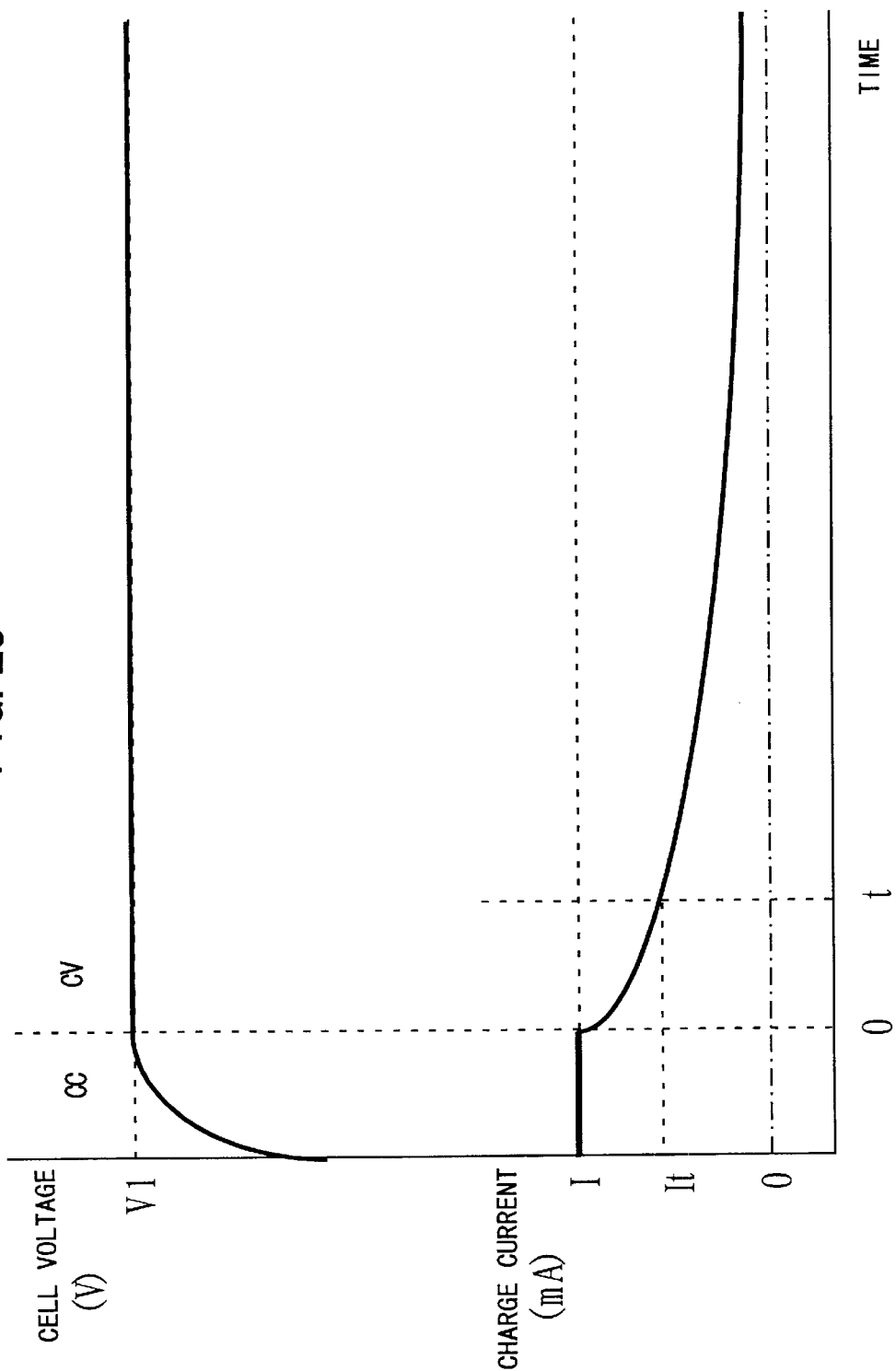
FIG. 29 is a figure for explaining profiles of cell voltage and charge current by the CC-CV charge method according to a fourth embodiment.

FIG. 29 is a figure similar to FIG. 17. As described in the third embodiment, in the case where a Li-ion cell is charged by the constant current and constant voltage charge method (in the following, the constant current and constant voltage charge method will be called as the CC-CV charge method), the current It obtained after a lapse of a predetermined time t from the time when the charge mode is changed from the constant current mode (in the following, the constant current mode will be called as the CC mode) to the constant voltage mode (in the following, the constant voltage mode will be called as the CV mode) is constant if the capacity of the cell is constant. However, when the time t is within a range, the current It increases as the capacity decreases. By using such a correlation between decrease of capacity and increase of current, capacity estimation and degradation estimation are performed. In the following, outline of the fourth embodiment will be described.

(Outline of the Fourth Embodiment)

In this embodiment, capacity is estimated by the method including the steps of:

obtaining, when the Li-ion cell is charged by a CC-CV charge method, a charge current after a lapse of a predetermined time from the instant when charge condition is changed from a CC mode to a CV mode; and calculating an estimated capacity of the Li-ion cell by using the charge current.

In order to enable this estimation, it is necessary to obtain correlation between the capacity of the cell and the charge current beforehand by performing following experiment.

A plurality of Li-ion cells which are same kind as a Li-ion cell which is target of capacity estimation are prepared in which a plurality of the Li-ion cells have different capacities due to repetition of use. By using the Li-ion cells, charge and discharge cycle is repeated in which the charge current at the above mentioned time is measured. From the result, correlation between the capacity of the cell and the charge current is obtained.

The correlation is not necessarily represented as an analytic equation. For example, it may be represented as a line graph in which measured values in a correlation diagram are connected by lines.

When linear relationship (a linear equation) is adopted as representation of the correlation, there is a favorable range in the time t. As described in the example 4-2 later (especially FIG. 32), the favorable range such that error becomes small is from 30 seconds to 30 minutes. The more favorable range is from 30 seconds to 20 minutes.

When the predetermined time t is from 30 seconds to 30 minutes, a following equation (26) which represents linear relationship between the estimated capacity Ce and the charge current It can be obtained, $$Ce/Co = -a \times It + b \quad (26)$$

wherein Co is the nominal capacity of the Li-ion cell, a and b are constants determined by the Li-ion cell and the time t). As described in the example 4-2 later (especially FIG. 32), the favorable range such that error becomes small is from 30 seconds to 30 minutes. The more favorable range is from 30 seconds to 20 minutes.

When the time is shorter than 30 seconds after the start of the CV mode, variation of charge current may become large, thus, accurate capacity estimation can not be necessarily performed. When the time is longer than 30 minutes, relationship between the charge current and the capacity varies so that the relationship does not become linear and equation becomes complex.

Monitoring for obtaining the current It is performed several times per $10\mu$ second for example and an intermediate value or a mean value is selected. This monitoring method is favorable since improper recognition due to noise can be avoided. However, monitoring method is not limited to this as long as the capacity estimation method of the present invention is possible.

The estimation capacity Ce of the cell is calculated by the equation (26) by using the current It. For this purpose, it is necessary to determine a and b. In order to determine a and b, a following method can be used for example.

For estimating degradation of the cell from the estimated capacity Ce, degradation degree Deg(%) is calculated by an equation $$Deg(\%) = 100 \times (1 - Ce/Co) \quad (29)$$

including the nominal capacity Co. Then, when the degradation degree Deg(%) becomes larger than a predetermined limit value, the cell can be estimated as degraded.

The constants a and b in the equation (26) can be calculated by equations (27) and (28)

$$a = d \times t^e \quad (27)$$

$$b = f \times t^h \quad (28)$$

wherein d, e, f, and h are constants determined by the Li-ion cell and $0<d$, $e<0$, $0<f$, and $h<0$.

The constants d, e, f, and h can be obtained by the following method for example.

Obtaining values of d, e, f, and h in many cases, it was revealed that $1.4 \leq d \leq 2.2$ $-0.7 \leq e \leq -0.3$ $1.4 \leq f \leq 2.2$ $-0.25 \leq h \leq -0.15$ are satisfied wherein the unit of It is A and the unit of t is minute.

In the equation (26), the charge current It decreases monotonously as the time t increases.

The reason why the coefficients a and b become functions of the measured time t is the following.

It is known that the charge current depends on diffusion of intercalated Li into inner site of active material when charge of the CV mode is performed. If the diffusion of intercalated Li into inner site of active material follows Fick's first law, the current I with respect to the time t after the start of the CV mode can be represented by $$I = KnF[(\Delta c)/t^{\frac{1}{2}}]$$

wherein K is a constant, $\Delta c$ is a value corresponding to concentration gradient of Li in solid, n is electrochemical equivalent, F is Faraday constant.

However, in actuality, since various factors exist, the function may become more complex. Considering the effect of the diffusion within solid, the constants a and b in the degradation estimation equation (26) in this embodiment become high-order functions with respect to the measured time t such that the capacity Ce of the estimation target cell can be obtained by measuring the current value It after a lapse of the time t satisfying $0.5 \leq t \leq 30$, wherein the capacity Ce does not depend on the measured time t.

When constants which do not satisfy the above mentioned condition are used, there are cases where the charge current It takes a minus value within very short time such as one minutes or the charge current It takes a maximum value at a time within the elapsed time t. Thus, charge current variation of the Li-ion cell can not always be represented as a concrete equation in such cases.

The estimated capacity Ce shown in the equation (26) is a capacity when complete discharge is carried out in which the complete discharge is to discharge the cell from the full charge state to a predetermined lower limit voltage. The estimated capacity Ce is not a discharge capacity when the cell is discharged halfway.

The constants a and b in the equation (26) or the constants d, e, f, and h in the equations (27) and (28) are determined in the following way for example.

That is, the positive constants d, e, f, and h are determined by steps of:

repeating a charge and discharge cycle at least equal to or more than 5 times by using a Li-ion cell which is a capacity estimation target or the same kind of Li-ion cell as the Li-ion cell, wherein the charge and discharge cycle includes a charge period from 3 hours to one month in which charge is performed by a CC-CV charge method, a discharge period, a rest period provided between the charge period and the discharge period as necessary;

obtaining, in each cycle, charge currents $It_{ni}$ after a lapse of times $t_{ni}$ which are between 30 seconds and 30 minutes from the instant when charge condition is changed from a CC mode to a CV mode, wherein n is a number which is assigned to each cycle and i is a number assigned to each time $t_{ni}$ in each cycle;

obtaining discharge capacity Cn in each cycle;

recording $t_{ni}$, $It_{ni}$, and Cn;

determining the constants a and b in the equation (26) and d, e, f, and h in equations (27), (28) by using the time $t_{ni}$, the charge current $It_{ni}$ and the discharge capacity Cn.

Successive approximation method or least square approximation method or the like can be used for determining the constants.

As an example, a following charge and discharge cycle can be used in which the Li-ion cell of the target of capacity estimation or the same kind of Li-ion cell is used, the charge current is a value such that the charge ratio becomes from 0.5 C to 2C, or, the charge period is from 3 hours to one month for the CC-CV charge method using charge limit voltage which is recommended as charge condition or which is determined by a charger or an apparatus mounting the cell, and the discharge current is a value such that the discharge ratio becomes from 0.2C to 2C, or, the discharge period is determined by using discharge cut-off voltage which is recommended as discharge condition or which is determined by a charger or an apparatus mounting the cell. In addition, the charge and discharge cycle includes a rest between the charge period and the discharge period as necessary.

When the charge current is larger than 2C which exceeds a normally used current, the cell is damaged and an accurate degradation equation can not be obtained. It is not favorable that the charge current is smaller than 0.5C since it takes to much time to preparing the degradation equation.

When the charge period for each cycle is shorter than 3 hours, the charge may become insufficient if the Li-ion cell is degraded. Thus, a degradation equation in which accurate degradation estimation is difficult may be provided, which is not favorable.

It is not favorable that the charge period is longer than one month since it takes much time to prepare the degradation equation.

The charge and discharge cycle is repeated at least 5 times in order to determine coefficients of the degradation equation. Since the degradation equation (26) of the present invention is a linear function, the coefficients can be determined by using data of at least two cycles. However, in actuality, when using data of equal to or smaller than 4 cycles, estimation error exceeds ±20% due to error of reading current values. Thus, in order to secure degradation estimation accuracy within ±20%, it is favorable to obtain data of at least 5 cycles.

In addition, in each cycle after or at third cycle in which data is obtained, when the current value It is measured at only two points of times elapsed after the instant of the change of charge mode from CC mode to CV mode, it becomes difficult to determine the coefficients d, e, f, and h describing the constants a and b.

It is favorable that the equation (26) is prepared at temperatures between 10° C. and 45° C. When the temperature is lower than 10° C., the relationship between the capacity Ct and the charge current It does not become linear as the equation (26). The temperature higher than 45° C. does not suit the range of use temperature of the Li-ion cell. In addition, it is favorable that the capacity estimation is performed at temperatures within ±10° C. of the temperate at which the equation (26) is prepared, and between 10° C. and 45° C. When the capacity estimation is performed at a temperature 10° C. or more higher, or, 10° C. or more lower than the temperature at which the equation is obtained, it becomes difficult to estimation capacity accurately since charge current values become different.

The above method can be applied to a Li-ion battery shown in FIG. 3 for example. The Li-ion battery includes a safety securing part which has an IC, a memory for storing numeric data used for calculating an estimated capacity of the Li-ion battery in the IC or an IC added to the IC, and a circuit for calculating the estimated capacity by using the numeric data and charge current while charging the Li-ion battery.

In such a Li-ion battery, when Li-ion cells in the battery are charged, an estimated capacity value of the cells is calculated. The value can be read via an external connection terminal of the IC, or, a part for outputting an alarm can be provided in the battery in which the part outputs the alarm which represents capacity degradation when the estimated capacity becomes smaller than a predetermined capacity. As the alarm, displaying characters or an image, or sounding beep tones or a voice can be used.

In addition, for calculating an estimated capacity of the Li-ion cell from the charge current during charge and other values, the above mentioned capacity estimation method for the Li-ion cell can be used.

As is evident from the above descriptions, the capacity estimation method for the Li-ion cell of the present invention is a simple method and degradation of the Li-ion cell can be performed easily and simply by using this method. Thus, remarkable effect can be obtained in actual use.

In addition, according to the Li-ion battery of the present invention, the capacity of the cells in the battery can be estimated only by using then battery. Accordingly, capacity degradation of the cells can be estimated automatically. Thus, remarkable effect can be obtained in actual use.

In the following, an example is shown in which the capacity estimation method for the Li-ion cell according to the present invention is concretely performed.

Figure 30:
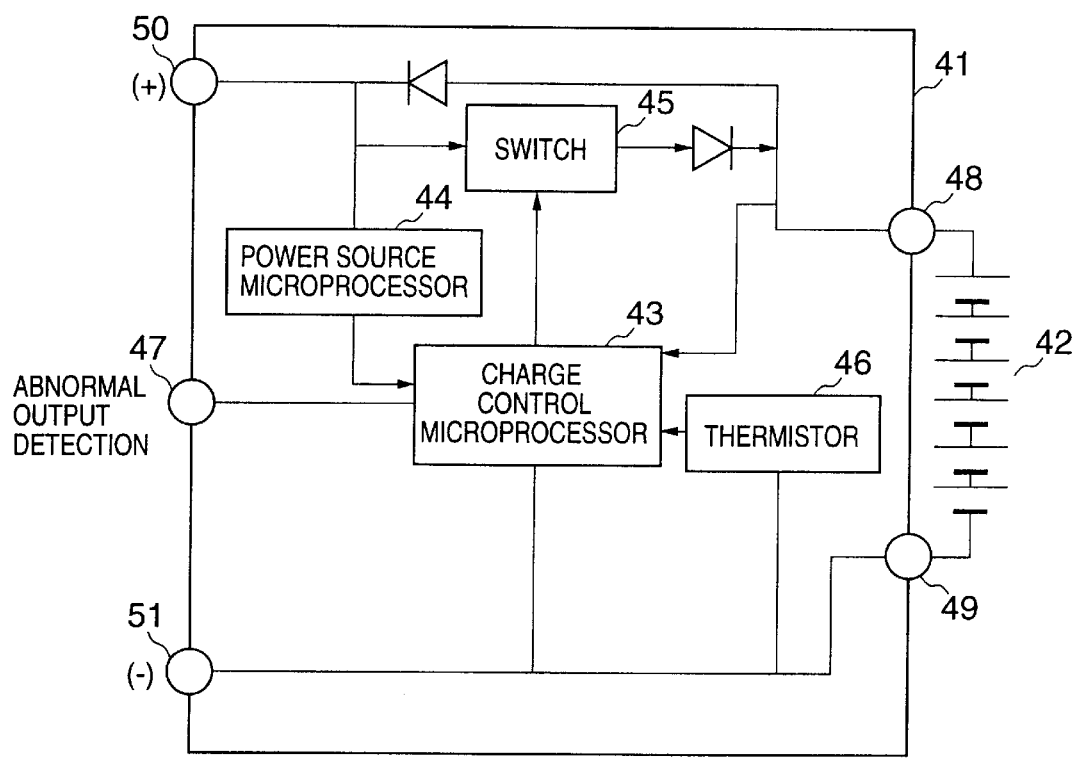
FIG. 30 shows a configuration of a charge control circuit to which the capacity estimation method is applied according to the fourth embodiment of the present invention.

FIG. 30 shows a configuration of a charge control circuit which performs the above mentioned method. In this figure, 41 indicates the charge control circuit, 42 indicates Li-ion cells which are the target of estimation, 43 indicates a charge control microprocessor, 44 indicates a power source microprocessor, 45 indicates a switch, 46 indicates a thermistor, 47 indicates an abnormal output detection terminal, 48 indicates a cell connection plus terminal, 49 indicates a cell connection minus terminal, 50 indicates a power source connection plus terminal, 51 indicates a power source connection minus terminal.

In order to realize the capacity estimation method of the present invention, it is necessary to measure time by a timer and to measure the charge current It. The timer is originally included in the charge control microprocessor 43, and the charge current It can be monitored by using the abnormal output detection terminal 47. Thus, without any additional parts, the capacity estimation of the present invention can be performed in which calculation of the equations (26), (27) or (28) is performed by using an available memory in the charge control microprocessor 43. The circuit is not limited to this configuration as long as the capacity estimation can be performed.

While the capacity estimation method of the present invention can be performed by adding additional capability to the body of the apparatus as mentioned above, the capability can also be provided in the safety mechanism of the battery such as shown in FIG. 3.

Accordingly, it becomes possible to provide the Li-ion battery which includes means of performing capacity estimation according to the present invention by modifying an existing Li-ion battery minimally. The configuration is not limited to that of the above mentioned Li-ion battery as long as the capacity estimation of the present invention is performed.

The degradation estimation method and the Li-ion battery which includes the capacity estimation capability of the present invention can be applied to apparatuses for which high reliability is required. By applying the present invention to the apparatuses, degradation status of cells can be grasped properly and the cells can be exchanged in a timely fashion so that troubles of the apparatuses can be avoided. There is no problem in that any apparatuses which mount Li-ion cells adopts the capacity estimation method or the Li-ion battery which has the degradation estimation capability. Accordingly, cells can be exchanged with minimum waste so that the present invention can be used very advantageously.

EXAMPLES IN THE FORTH EMBODIMENT

In the following, the capacity estimation method of the present invention for the Li-ion cell will be described by using more concrete examples. However, the present invention is not limited to the examples.

Example 4-1

An experiment was performed in which a prismatic Li-ion cell (the nominal capacity was 600 mAh) was connected to a cell charge and discharge automatic test apparatus which has data collection and data storing capability in order to obtain equations for the Li-ion cell. In the experiment, the test cell was cycled 10 times by discharging at 600 mA (1.0 CmA) to 2.75V and charging in CC-CV mode at 600 mA (1.0 CmA) to 4.1V for 3 hours with intervals of one hour between charge and discharge.

In each cycle of charge and discharge, the charge currents It (A) after a lapse of times t (minute) from the time when the mode changed from the CC mode to the CV mode and the discharge capacity were measured, wherein the times t were from 30 seconds to 30 minutes.

As a result, the coefficient a was obtained as $$a = 1.92 \times t^{-0.5} \quad (30),$$

the coefficient b was obtained as $$b = 1.92 \times t^{-0.2} \quad (31).$$

Accordingly, the equation $$Ce/Co = -a \times It + b \quad (32)$$

was obtained wherein Co is the nominal capacity of the cell.

When the equations (30) and (31) were prepared by using data of initial 5 cycles, the same values as the above shown constants were obtained However, when using data of only initial 4 cycles, variation of data became large so that the equations could not be obtained.

When the experiment was performed in which only the charge period was changed to 2 hours in the above mentioned charge condition, relationship between the charge current It and the discharge capacity did not become linear so that the equation (32) could not be obtained.

Another experiment was performed as follows.

In this experiment, a used prismatic Li-ion cell (the nominal capacity was 600 mAh) was used. The cell was cycled by discharging at 600 mA (1.0 CmA) to 2.75V and charging in CC-CV mode at 600 mA (1.0 CmA) to 4.1V for 7 days (168 hours) with intervals of one hour between charge and discharge.

In each cycle of charge and discharge, the capacity Cn and the charge current It after a lapse of a time t from the instant when the mode was changed to the CV mode were measured. Then, the validity of the equation (32) was evaluated.

Figure 31:
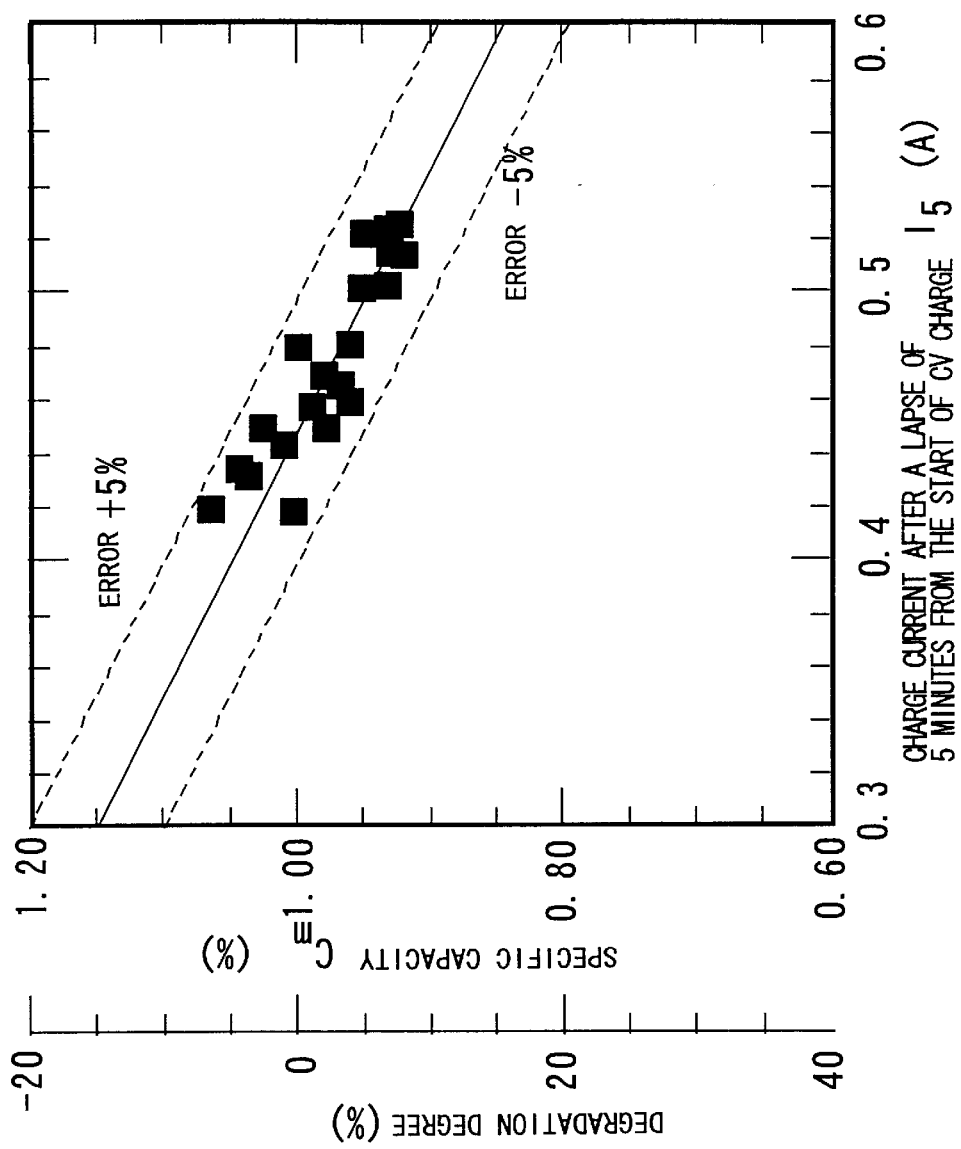
FIG. 31 shows relationship between charge current and discharge capacity according to results of experiment of an example 4-1 of the present invention.

The result is shown in FIG. 31. FIG. 31 shows relationship between the ratio (Cn/Co) of the discharge capacity (Cn) to the nominal capacity (Co) and the charge current It after a lapse of 5 minutes from the start of CV mode charge in which the ratio Cn/Co is indicated as nominal capacity ratio Cm in FIG. 31 and It is indicated as $I_5$. In addition, a criterion of degradation degree which is obtained from the measured capacity Cn and the nominal capacity Co is also shown in FIG. 31. The solid line in the figure indicates the equation (32).

Since t=5, a of (30) is 0.86, b of (31) is 1.39. Thus, the capacity estimation equation becomes $$C_5 = -0.86 \times I_5 + 1.39 \quad (33)$$

wherein Ce/Co is indicated as $C_5$.

The two dotted lines in FIG. 31 indicate estimated capacities corresponding to ±5% of the estimated capacity $C_5$ obtained by the degradation equation (33), in which error is obtained by $$Err(\%) = 100 \times (C_5 - Cm) \quad (34)$$

wherein Cm is the actual capacity.

As is evident from the result shown in FIG. 31, according to the capacity estimation method of the present invention, degradation state of the Li-ion cell can be estimated very accurately such that the error become within ±5%.

Example 4-2

An experiment was performed in which the same kind of prismatic Li-ion cells (the nominal capacity was 600 mAh) as used in the example 4-1 which was used in a cellular phone was collected and connected to a cell charge and discharge automatic test apparatus which has data collection and data storing capability in order to obtain equations for the Li-ion cell. In the experiment, the test cell was cycled twice by discharging at 600 mA (1.0 CmA) to 2.75V and charging in CC-CV mode at 600 mA (1.0 CmA) to 4.1V for 3 hours with intervals of one hour between charge and discharge.

In the second cycle, a plurality of charge currents It (A) after a lapse of a plurality of times equal to or smaller than 35 minutes from the time when the mode changed from the CC mode to the CV mode and the discharge capacity were measured. Then, values Cm were obtained by dividing the discharge capacity by the nominal capacity Co. Then, degradation accuracy was evaluated by comparing Cm and Ce/Co which was calculated by using the equation (32) shown in the example 4-1, wherein Ce/Co (represented by Cr) is a value obtained by dividing the estimated capacity Ce by the nominal capacity Co. The estimation accuracy was evaluated by the amount of error which was calculated by $$Err(\%) = 100 \times (Cr - Cm) \quad (34')$$

which indicated a gap between the estimated value Cr and the real measurement value Cm.

Figure 32:
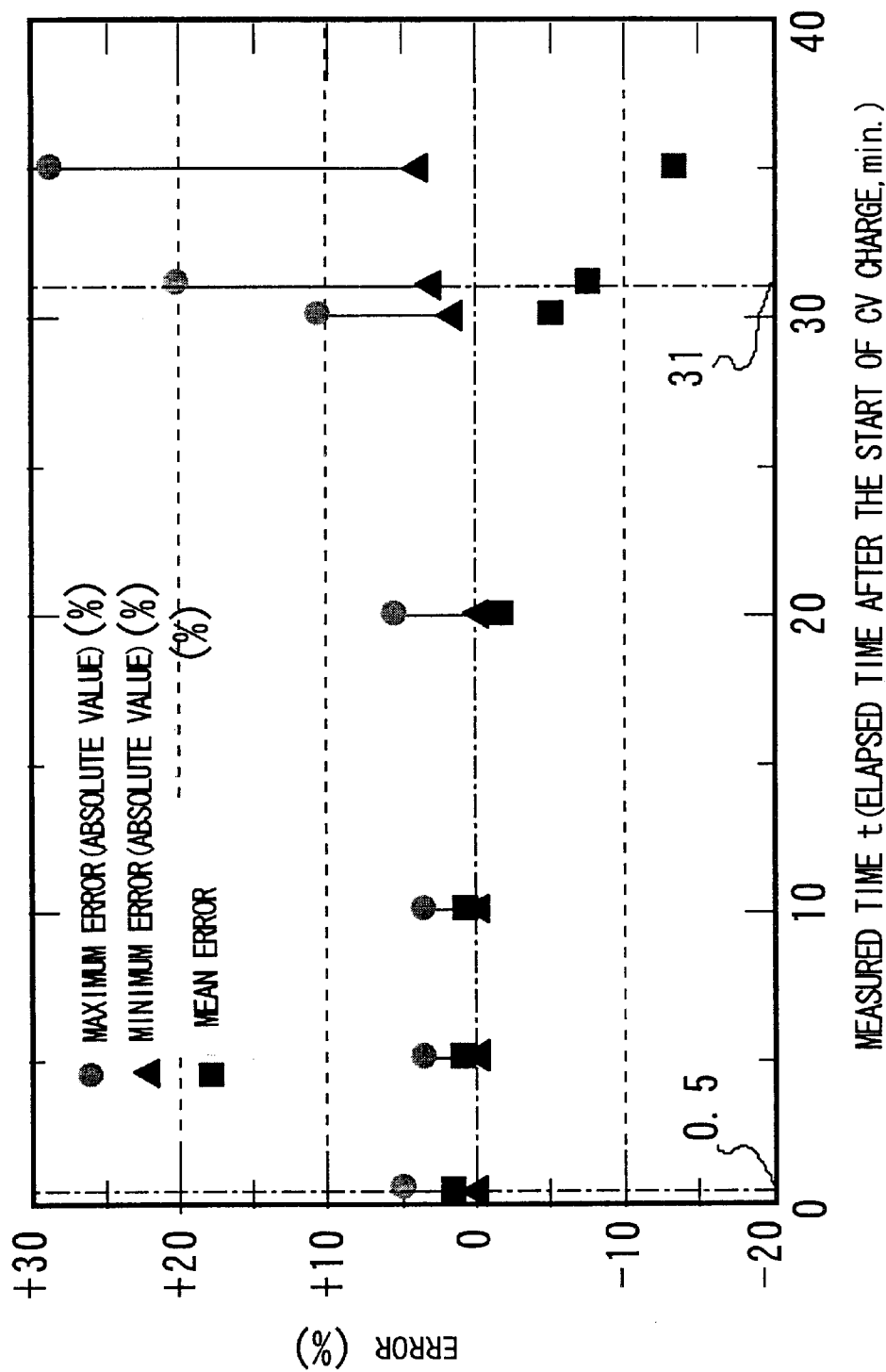
FIG. 32 shows relationship between time when the charge current was measured after CV mode charge starting and estimated error according to results of experiment of an example 4-2 of the present invention.

The result is shown in FIG. 32. FIG. 32 shows relationship between a plurality of charge currents It after a lapse of each time equal to or smaller than 35 minutes from the time when the mode changed from the CC mode to the CV mode, and, each mean value of error, absolute value of maximum error and absolute value of minimum error.

As is evident from FIG. 32, the error is within ±20% when the time after the start of the CV charge is from 0.5 minute to 30 minutes, which becomes no problem in actual use. Further, the error is within ±6% when the time is from 0.5 minute to 20 minutes, which indicates that the capacity estimation method of the present invention realizes accurate estimation.

When the time is shorter than 0.5 minute, the estimation accuracy becomes outside of the range of ±20%, which becomes a problem in actual use since error becomes large. For example, when the time was 0.33 minute (20 seconds), according to the result on the basis of the capacity estimation equation (32) and the equation (34') for obtaining error, the maximum error (absolute value) was 29%, the minimum error (absolute value) was 0.19% and the mean error was +26%. Therefore, it is revealed that it is not favorable that the time is shorter 0.5 minute as long as the calculation method is used.

When the time is longer than 30 minutes, the estimation accuracy becomes outside of the range of ±20%, which becomes a problem in actual use since error becomes large.

The reason is that, after a lapse of a time longer than 30 minutes from the start of the CV mode, relationship between the capacity and the charge current does not become linear. As an example, the result in the case when the time is 31 minutes is shown in FIG. 33 in which this data was obtained in the charge and discharge cycle experiment performed for obtaining the equations (30), (31), and (32) in the example 4-1 for reference purposes.

Figure 33:
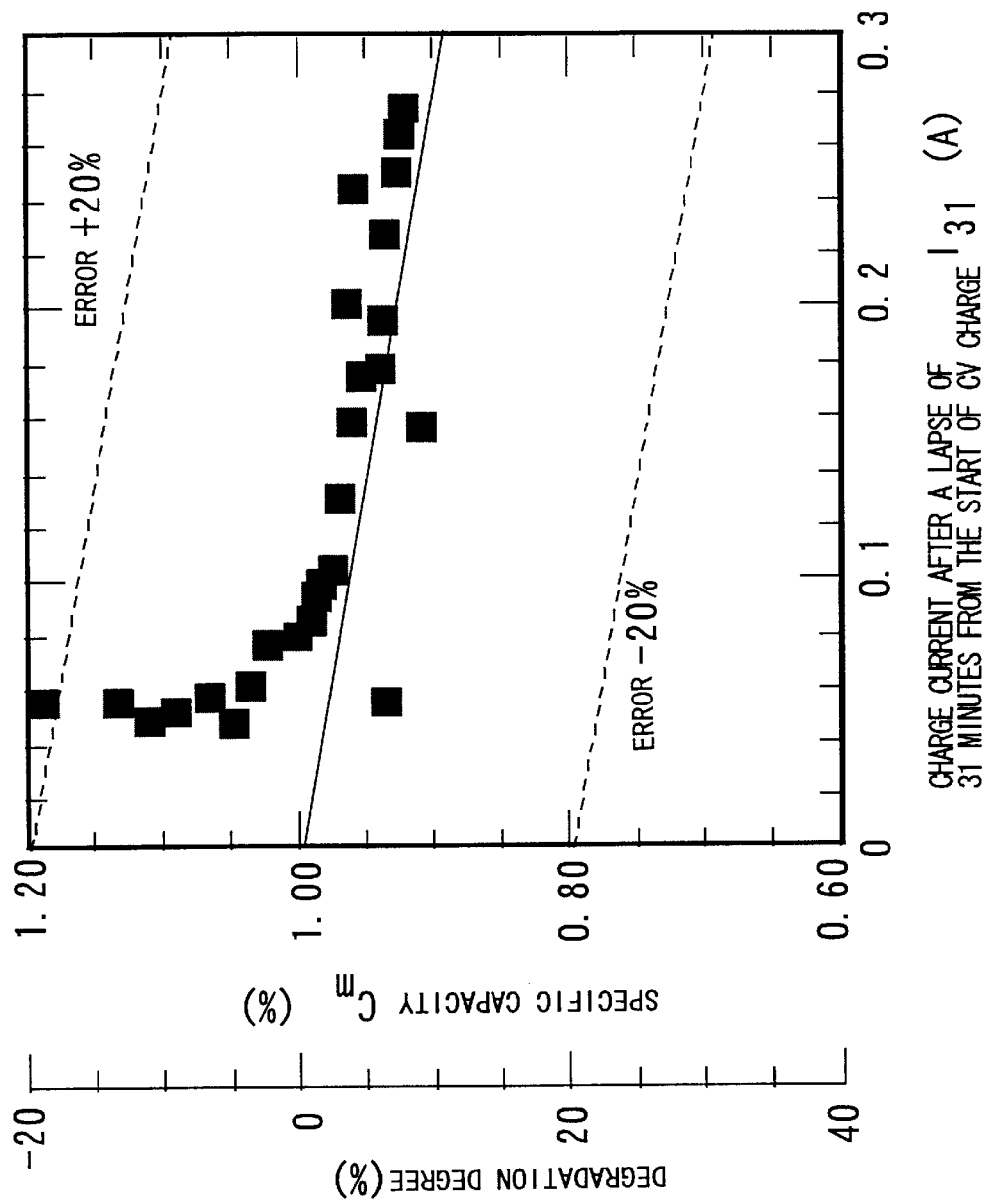
FIG. 33 shows relationship between charge current after a lapse of 31 minutes from the start of CV charging and specific capacity according to results of experiment of an example 4-2 of the present invention.

FIG. 33 shows the relationship between the charge current $I_{31}(A)$ and the discharge capacity Cm in which the charge current $I_{31}(A)$ is a value obtained after a lapse of 31 minutes from the start of the CV mode. In this figure, the solid line indicates the capacity estimation equation (32) when t=31, and the two dotted lines indicate estimated capacity $C_{31}$ when error which is calculated by the equation (34') is ±20%.

As shown in FIG. 33, when the time is longer than 30 minutes, the relationship between the discharge capacity Cm and the charge current It does not become linear so that the relationship can not be represented by the simple capacity estimation equation of the present invention, instead, a complex high-order equation become necessary so that prices of parts and apparatuses relating to capacity estimation of the Li-ion cell may rise.

Example 4-3

A Li-ion battery having the same configuration shown in FIG. 3 was manufactured. The Li-ion battery includes three of the same kind of Li-ion cells (nominal capacity is 600 mAh) as those in the example 4-1, a safety securing mechanism, and an IC for protection in which a timer, the equations (30), (31), and (32) and the calculation mechanism are input beforehand.

The IC 13 is set such that it monitors the charge current $I_{10}(A)$ after a lapse of 10 minutes from the time of the change of the mode from CC to CV. It was recognized that the capacity estimation equation of the present invention for the charge current $I_{10}$ was $C_{10}=-0.61\times I_{10}+1.21$ (35).

The battery was placed in a cell charge and discharge automatic test apparatus which has data collection and data storing capability. The battery was cycled 15 times by discharging at 600 mA (1.0 CmA) to 2.75V and charging in CC-CV mode at 600 mA (1.0 CmA) to 4.1V for 10 days (240 hours) with intervals of one hour between charge and discharge.

In each cycle of charge and discharge, the charge current value $I_{10}$ after a lapse of 10 minutes from the time when the mode was changed to the CV mode and the real measurement capacity Cn of discharge were measured. Then, Cn was divided by the nominal capacity Co and the result was represented as Cm.

Figure 34:
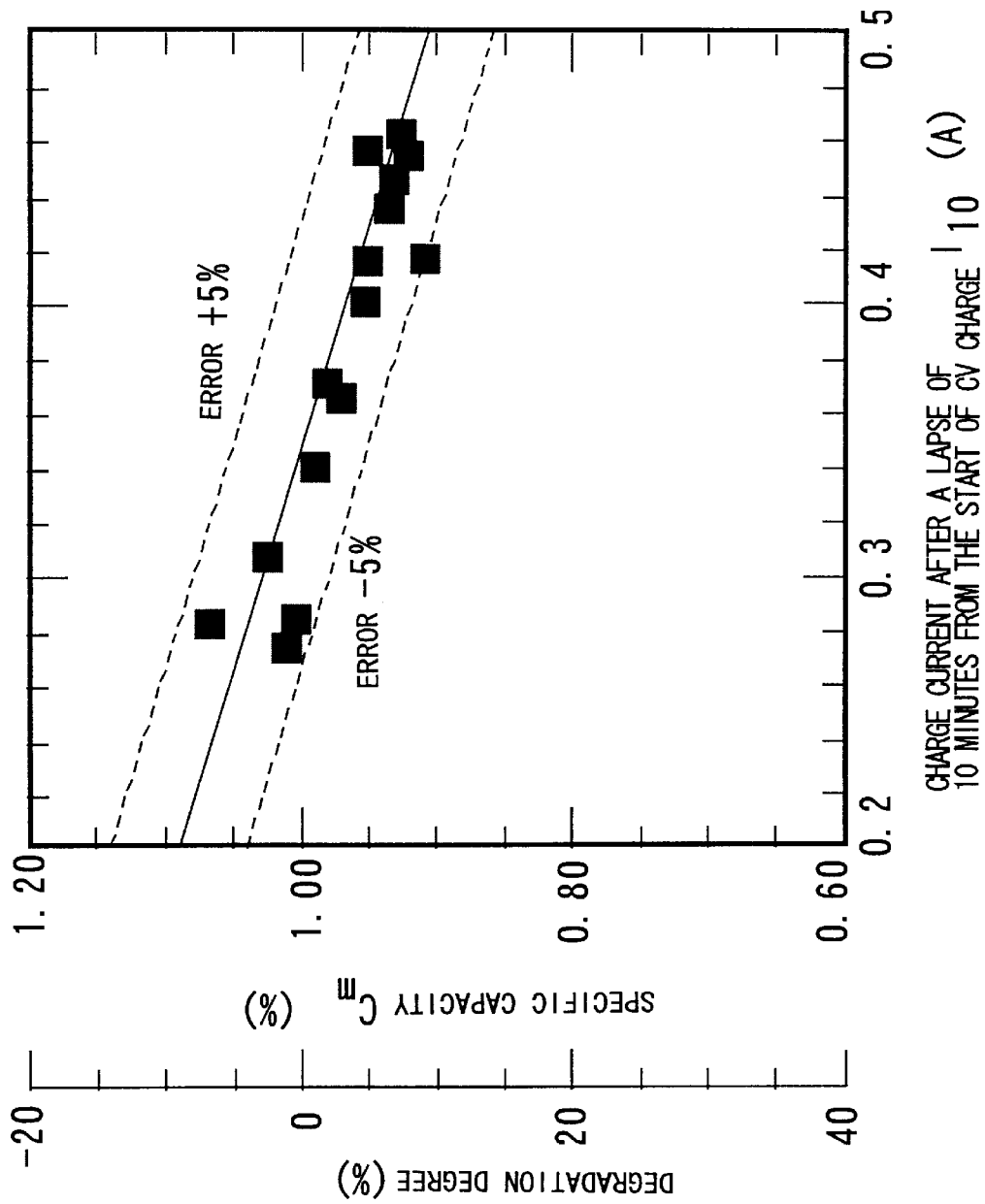
FIG. 34 shows relationship between charge current after a lapse of 10 minutes from the start of CV charging and specific capacity according to results of experiment of an example 4-3 of the present invention.

The result is shown in FIG. 34. FIG. 34 shows relationship between the charge current $I_{10}$ and the discharge capacity Cm. In the figure, the solid line indicates the relationship between $I_{10}$ and $C_{10}$ in the estimation equation (35) and the two dotted line indicate relationship between $I_{10}$ and $C_{10}$ when error of t=10 based on the equation (34') is ±5%.

As is evident from the result shown in FIG. 34, according to the Li-ion battery having the capacity estimation capability of the present invention, the error of the capacity Cm is within ±5%. Thus, according to the present invention, the Li-ion battery which realize accurate capacity estimation can be provided.

(Fifth Embodiment)

In the following, the fifth embodiment will be described. In the fifth embodiment, the capacity estimation method and the degradation estimation method using the time taken for charge current in the constant voltage mode (in the following, the constant voltage mode will be called as the CV mode) to decrease to a predetermined current will be described.

Figure 35:
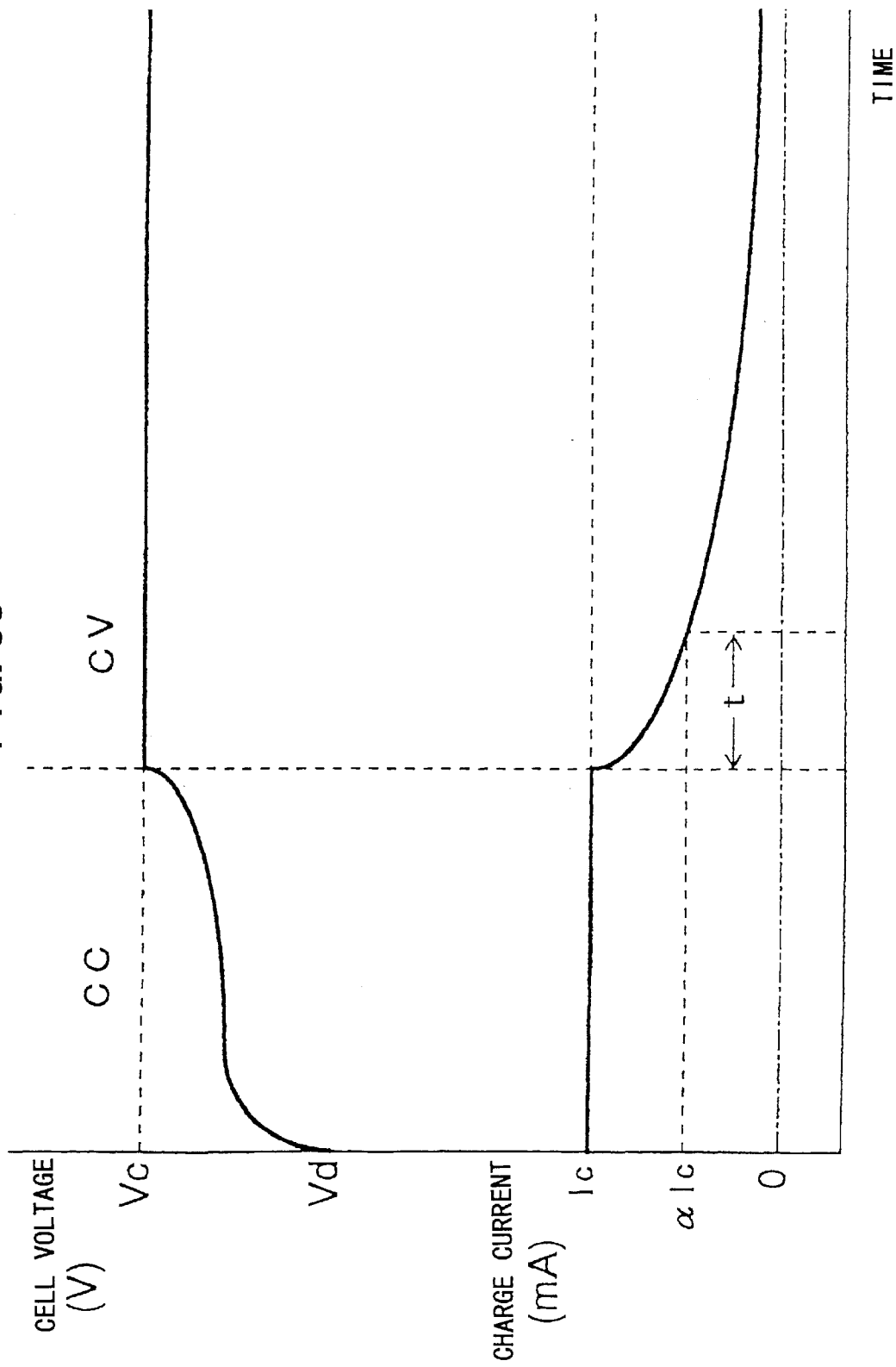
FIG. 35 is a figure for explaining profiles of cell voltage and charge current by the CC-CV charge method according to a fifth embodiment.

FIG. 35 is a figure like FIG. 17.

The capacity estimation method in this embodiment includes the steps of:

monitoring, when the Li-ion cell is charged by a constant current and constant voltage charge method (in the following, the constant current and constant voltage charge method will be called as the CC-CV charge method), an elapsed time t from the instant when charge condition is changed from a constant current mode (in the following, the constant current mode will be called as the CC mode) to a CV mode to the instant when charge current becomes α (α is a constant, 0<α<1) times of charge current in the CC mode;

obtaining an estimated capacity Ce of the Li-ion cell by using the elapsed time t.

The reason why such estimation becomes possible is the same as described in the first embodiment.

(Outline of the Fifth Embodiment)

In the following, the outline of the fifth embodiment will be described.

In the fifth embodiment, when the Li-ion cell is charged by a constant current and constant voltage method, an elapsed time t from the instant when charge condition is changed from a CC mode to a CV mode to the instant when charge current becomes α (0<α<1) times of charge current in the CC mode is obtained, and an estimated capacity Ce of the Li-ion cell by using the elapsed time t is obtained.

In order to enable this estimation, it is necessary to obtain correlation between the estimated capacity Ce and the time t beforehand. For example, there is a following method to obtain the correlation.

Charge and discharge cycle is repeated for the same kind of Li-ion cell as a Li-ion cell which is the target of capacity estimation. Then, correlation between the time tn of each cycle and discharge capacity which is obtained by integrating discharge current with respect to time (n is a number which is assigned to each cycle). In this case, since it is favorable that the value of the discharge capacity Cn ranges widely, it is favorable to perform the above method for a plurality of Li-ion cells which are the same kind and have different capacities when discharge capacity Cn does not range widely.

The correlation is not necessarily represented as an analytic equation. For example, it may be represented as a line graph in which measured values in a correlation diagram are connected by lines.

As mentioned later, when the analytic equation is adopted as representation of the correlation, there is a favorable range in the charge current Ic when the CC charge is performed.

In addition, if relationship between the estimated capacities Ce and the number of charge is obtained by recording the estimated capacities Ce which are calculated in each charge, the life-span of the cell can be estimated, that is, it can be estimated how many times the cell can be recharged and reused before degradation. When the Li-ion cell is used by repeating charge and discharge under usage condition which is the same as or similar to that used in the estimation, accuracy of the cell lifetime estimation becomes high.

½ can be used as the constant $\alpha$ for example. The estimated capacity Ce of the Li-ion cell is calculated by the equation $$Ce/Co = At + B \quad (36)$$

by obtaining the time t when the charge current becomes ½ wherein Co is the nominal capacity of the Li-ion cell, A and B are positive constants which are determined by the Li-ion cell and the charge current Ic. By setting $\alpha$ to be ½, the equation (36) approximately holds. By using the equation and the time t, the estimated capacity Ce can be calculated.

In order that the equation (36) becomes effective for capacity estimation of the cell, the favorable range of the charge current Ic is $$Co/(5 \text{ hours}) \leq Ic \leq Co/(0.5 \text{ hour}),$$

wherein Co is the nominal capacity of the Li-ion cell which is the target of capacity estimation. This condition will be represented as from 0.2 CmA to 2.0 CmA in the following description.

When the charge current Ic does not satisfy the above condition, it is not favorable to calculate the estimated capacity Ce by using the equation (36). That is, when the charge current Ic is smaller than the above limitation range, a calculated capacity by the equation (36) becomes different from an actual capacity for reasons that the cell is not fully charged, effect of self-discharge can not be neglected and the like. When the charge current Ic is larger than 1.0 CmA, since the time taken for charging cell becomes short, the measured value of the time t may includes large error and variations of charge time due to degradation becomes different to each other, also which is not favorable when performing degradation estimation.

Thus, charge current values which are applied to almost all apparatuses mounting the Li-ion cell and chargers are within the range of the above condition. Apparatuses and chargers which adopt a current value which is out-of-the range are used only for very limited use such as in a case when very high speed charge is required in an emergency. These apparatuses and chargers hardly requires the capacity estimation method of the present invention.

The equation (36) represents relationship between the elapsed time t from the start of CV mode charge until the charge current decreases to half in a charge condition of an apparatus using Li-ion cell to which the equation is applied and an estimated specific capacity Ce/Co under the charge condition. When initial charge current value for obtaining the equation (36) is different from the initial charge current value at CV mode charge start time of the apparatus mounting the cell or the charger, following processes need to be performed.

That is, the elapsed time t from the start of CV mode until the current becomes half is obtained under each charge condition beforehand. Then, after obtaining a ratio te/tm wherein the time te is obtained under the condition for preparing the equation (36) and the time tm is obtained under a condition which corresponds to the apparatus or the charger, a result of multiplying measured time by the ratio te/tm is substituted into the equation (36).

Because the smaller the current value is, the larger the charge ratio in the CC mode charge (charge ratio is ratio of the CC mode charge in full charge period) is. Thus, the charge time of CV mode varies depending on the charge ratio of the CC mode, in addition, the time necessary for the current to decrease to half is effected. In addition, since the effect varies according to cell size, cell shape, manufacturer, cell component material and the like, it is necessary to grasp effects of the current value by performing experiments.

For preparing the equation (36), it is necessary to determine the constants A and B in the equation (36). For this purpose, it is most appropriate to determine the constants A and B by using a cell or a battery which is the same kind as the Li-ion cell or battery which is the target of the capacity estimation. Because, in commercial Li-ion cells, many kinds of cathode active materials, anode carbons and electrolytes are used so that initial charge behaviors as well as variations of charge voltage behaviors due to cell degradation differ.

Next, the method for determining the constants A and B will be described in detail.

In the present invention, the positive constants A and B are calculated by steps of:

repeating a charge and discharge cycle at least equal to or more than 2 times by using a Li-ion cell which is a capacity estimation target or the same kind of Li-ion cell as the Li-ion cell, wherein the charge and discharge cycle includes a charge period from 3 hours to 10 days in which charge is performed by the CC-CV charge method, a discharge period, a rest period provided between the charge period and the discharge period as necessary;

obtaining and recording an elapsed time tn from the instant when charge condition is changed from a CC mode to a CV mode to the instant when charge current becomes $\alpha$ ($0 \leq \alpha < 1$) times of charge current in the CC mode and discharge capacity Cn in each cycle; and determining values of the constants A and B in the equation (36) from the elapsed time tn and the discharge capacity Cn.

In the following, the determining method of the constants A and B will be described more precisely.

An experiment is performed for a Li-ion cell or a battery. In the experiment, charge and discharge cycles are repeated equal to or more than 5 times or 6 times, which is more favorable. The charge limit voltage Vc, the charge current Ic, and the discharge cut-off voltage Vd are set to be the same as those of a Li-ion cell or a battery which is the target of capacity estimation. The charge period is set from 3 hours to 10 days or from 3 days to 10 days, which is more favorable. Discharge current is set from 0.2 CmA to 2.0 CmA and the temperature is set from 0° C. to 45° C., or from 15° C. to 30° C., which is more favorable.

In each cycle of charge, an elapsed time tn (n is a number assigned to each cycle) from the CV mode charge start until the charge current decreases to α (0<α<1) times of the charge current of the start time and the discharge capacity Cn are recorded wherein the discharge capacity Cn is obtained by integrating the discharge current with respect to time. Then, the constants A and B are determined such that the equation (36) represents relationship between Cn/Co and t most appropriately.

For example, an elapsed time tn from the CV mode charge start until the charge current decreases to ½ and the discharge capacity Cn are recorded. Then, the constants A and B are determined such that the equation (36) represents relationship between Cn/Co and t most appropriately.

The reason why the experiment is performed at temperatures from 0° C. to 45° C. is that this range is a temperature range normally used for the Li-ion cell, and, it realizes more accurate capacity estimation to grasp the relationship between the time t and the specific capacity Cn/Co which reflect progress of degradation at the temperatures.

It is more favorable that the experiment is performed at temperatures from 15° C. to 30° C. since almost all temperature conditions are within this range. Thus, the relationship between the time t and the specific capacity Cn/Co which reflect actual degradation can be grasped.

The charge period per one cycle is set to be from 3 hours to 10 days. By setting the charge period per one cycle to be from 3 hours to 10 days, the cell degrades moderately per one cycle so that data necessary for preparing the accurate equation (36) can be obtained efficiently. Especially, when the charge period per one cycle is set to be from 3 days to 10 days, degradation of capacity associated with the charge and discharge cycle can be clearly recognized so that data necessary for preparing the accurate equation (36) can be obtained efficiently, which is more favorable.

When the charge period is shorter than 3 hours, the Li-ion cell degrades slowly. Thus, several hundred cycles are necessary for obtaining the equation (36) accurately so that enormous time is consumed. In some cases, charge is performed insufficiently so that degradation and insufficient charge are mixed. As a result, degradation status and characteristics of the Li-ion cell can not be obtained properly, which is not favorable.

When the charge period is longer than 10 days, the time necessary for performing one cycle becomes long so that it takes much time for obtaining necessary data, which is also not favorable.

The discharge current value in the charge and discharge cycle is set to be from 0.2 CmA to 2.0 CmA. When the lower limit is set to be from 1.0 CmA to 2.0 CmA, data can be obtained more efficiently. When the discharge current is smaller than 0.2 CmA, it takes much time to discharge completely, which is not favorable. When the discharge current is larger than 2.0 CmA, discharge period becomes too short. Thus, measurement values of discharge capacity may vary. In addition, when degradation proceeds, the capacity may decrease abruptly so that the equation (36) can not be prepared accurately. This is not favorable.

When the charge and discharge cycle experiment is performed, a rest is included between charge and discharge as necessary due to limitation of settings of the apparatus and the like.

In the charge and discharge cycle experiment performed in order to obtain the equation (36), the elapsed time tn from the instant when the CC mode changes to the CV mode to the instant when the charge current decreases to α times (0<α<1) of the charge current at the time of mode change and the specific capacity Cn/Co of following discharge are measured for each charge and discharge cycle on and after the fourth cycle. Then, relationship between the measured time tn and the specific capacity Cn/Co are plotted. Then, the constants A and B of the equation (36) are determined.

The reason why tn and Cn/Co of cycles on and after the 4th cycle are adopted for determining the constants A and B of the equation (36) is as follows. In many cases, capacity variation until third cycle from the time when the charge and discharge cycle experiment starts is different from that after the cycle due to decomposition reaction of impurity in the electrolyte on anode carbon. Thus, when data until third cycle is used, an equation in which estimation error is large may be prepared. It is not favorable.

As for above mentioned charge and discharge cycle experiment, equal to or more than 5 cycles are performed in order to obtain data necessary for achieving high accuracy in degradation estimation such that error of estimation result becomes within ±20% of real capacity.

When data of only 4th cycle is used, the constants A and B can not be determined so that the equation (36) can not be prepared. It is favorable to use data of equal to or more than 6 cycles for preparing the equation (36) which can perform capacity estimation and degradation estimation more accurately.

In the following, a method for determining whether the cell degrades will be described.

The estimated capacity Ce of the Li-ion cell is calculated, and it is judged that the Li-ion cell is degraded when the estimated capacity Ce becomes smaller than a predetermined limit capacity Cmin.

In the above method, the estimation may be performed by comparing estimated specific capacity Ce/Co (Co is nominal capacity) and limit specific capacity Cmin/Co.

As the limit capacity Cmin, a value of 60% of the nominal capacity is used for example (in this case, Cmin/Co=0.6).

Next, an apparatus which can estimate degradation by using the above method will be described.

The apparatus includes:

means for obtaining, when the Li-ion cell is charged by a CC-CV charge method, an elapsed time t from the instant when charge condition is changed from a CC mode to a CV mode to the instant when charge current becomes α (0<α<1) times of charge current Ic in the CC mode;

an arithmetic circuit obtaining an estimated capacity Ce of the Li-ion cell by using the elapsed time t; and means for outputting a signal representing that the Li-ion cell is degraded when the estimated capacity Ce (or estimated specific capacity Ce/Co) becomes smaller than a predetermined limit capacity Cmin (or limit specific capacity Cmin/Co).

FIG. 2 shows an configuration example of this apparatus. The equation (36) of the present invention is stored in an available memory in the CPU 7 and the like beforehand. Or, the equation (36) is stored in an memory chip which is added as necessary. The CPU 7 provides the cell control part 3 with an instruction to measure the elapsed time t from the time when the charge mode changes from the CC mode to the CV mode until the time when the charge current decreases to half, and receives data of the time t from the cell control part 3. In addition, the CPU 7 performs calculation by substituting the time t into the equation (36) so that the CPU 7 obtains the estimated capacity Ce(or the estimated specific capacity Ce/Co). The memory 8 stores the estimated capacity Ce(or the estimated specific capacity Ce/Co) if necessary. A result of degradation estimation based on estimated capacity (or estimated specific capacity) is applied to the body of the apparatus via the line 10 such as a system management bus. The body of the apparatus displays the estimation result to a display part of the apparatus and sounds an alert by using a beep or a voice as necessary. Accordingly, the apparatus which has the degradation estimation capability for the Li-ion cells is realized. The configuration is not limited to the above mentioned one as long as the degradation estimation of the present invention is performed.

Further, the method of this embodiment can be applied to the battery as shown in FIG. 3.

In this embodiment, in FIG. 3, a timer is mounted in the IC 13 for protection in the above safety mechanism and the equation (36) is stored in an available memory beforehand. The IC 13 monitories the voltage across the Li-ion cells 12-1, 12-2, and 12-3 by using terminals Vcc and Vss and counts the elapsed time t from the time when the charge mode changes from the CC mode to the CV mode until the time when the charge current decreases to half. Then, the counted time t is substituted into the equation (36) so that the estimated capacity Ce is calculated. An additional IC can be provided at a proper position in the battery if necessary. When the estimated capacity Ce (or estimated specific capacity Ce/Co) becomes smaller than a predetermined limit capacity Cmin (or limit specific capacity Cmin/Co), a warning (by using electronic signal in this case) which represents capacity degradation is output to the body of the apparatus which mounts the battery via the terminal 19 in order to display the warning on a display or sound an alarm.

When the body of the apparatus does not have any means of warning of degradation, it is favorable that the battery itself includes means of outputting the warning, for example, by displaying characters or an image, or sounding beep tones or a voice. Such a battery can be realized by applying the present invention and conventional technologies.

Accordingly, it becomes possible to provide the Li-ion battery which includes means of performing degradation estimation according to the present invention by modifying an existing Li-ion battery minimally. The configuration is not limited to that of the above mentioned Li-ion battery as long as the degradation estimation of the present invention is performed.

Also in this embodiment, the degradation estimation method and the Li-ion battery which includes the degradation estimation capability of the present invention can be applied to apparatuses for which high reliability is required. By applying the present invention to the apparatuses, degradation status of cells can be grasped properly and the cells can be exchanged in a timely fashion so that troubles of the apparatuses can be avoided. However, there is no problem when any apparatus which uses Li-ion cells adopts the degradation estimation method or the Li-ion battery which has the degradation estimation capability. In addition, cells can be exchanged with minimum waste so that the present invention can be used very advantageously.

EXAMPLES IN THE FIFTH EMBODIMENT

In the following, the capacity estimation method, the degradation estimation method and a degradation estimation apparatus for the Li-ion cell and the Li-ion battery will be described in more detail. However, the present invention is not limited to the following examples.

Example 5-1

An experiment was performed in which a prismatic Li-ion cell (the nominal capacity was 600 mAh) was placed in an oven at a constant temperature of 25° C. and connected to a cell charge and discharge automatic test apparatus which has data collection and data storing capability in order to obtain an equation for the Li-ion cell. In the experiment, the test cell was cycled 10 times by discharging at 600 mA (1.0 CmA) to 2.75V and charging in CC-CV mode at 600 mA (1.0 CmA) to 4.1V for 7 days with intervals of one hour between charge and discharge.

In each cycle of charge and discharge, an elapsed time tn from the start of the constant voltage (CV) mode charge to the time when the charge current decreases to ½ of that at the start time and the specific capacity Cn/Co which was a ratio of discharge capacity Cn to the nominal capacity Co were measured, wherein the discharge capacity Cn was calculated by integrating the discharge current with respect to time and n is a number which is assigned to each cycle.

A following equation (37) was obtained from relationship between the time tn and the specific capacity Cn/Co which was obtained from 4th cycle till 10th cycle.

$$Ce/Co = 0.714t + 0.349 \qquad (37)$$

Strictly speaking, "t" in this equation (37) should be represented as (t/1 hour), that is, should be represented as a dimensionless number. However, in the equation (37), it is represented as simply t for the sake of convenience. The same goes for following equations.

Another experiment was performed as follows.

In this experiment, a used prismatic Li-ion cell (the nominal capacity was 1300 mAh) was used. The cell was cycled 3 times by discharging at 1300 mA (1.0 CmA) to 2.75V and charging in CC-CV mode at 1300 mA (1.0 CmA) to 4.1V for 3 hours with intervals of 10 minutes between charge and discharge.

In each cycle of charge and discharge, the elapsed time tn from the start of the CV mode charge until the charge current decreases to ½ of that at the start time and the specific capacity Cn/Co were recorded. Then, validity of the equation (37) was evaluated.

Figure 36:
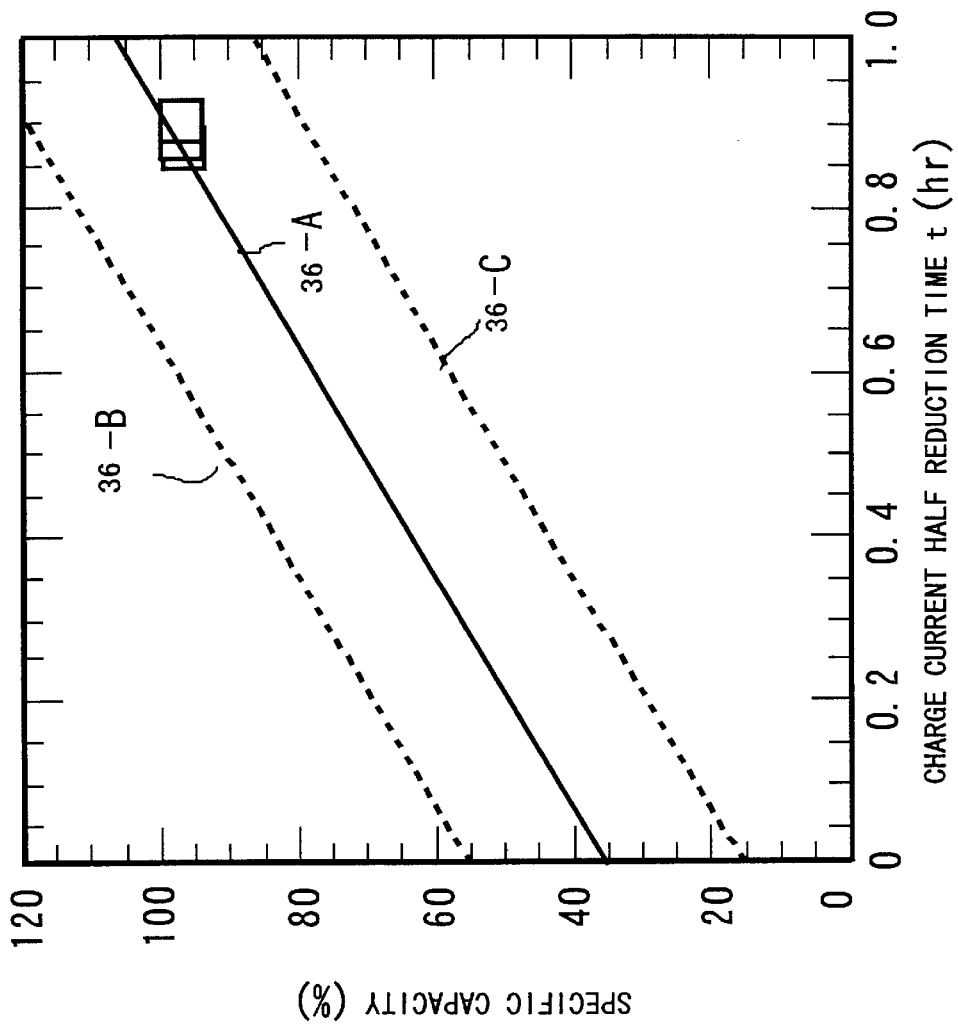
FIG. 36 shows relationship between charge current half reduction time and specific capacity in an example 5-1, and a line representing an equation obtained in an experiment No. 4 shown in FIG. 37.

The result is shown in FIG. 36.

FIG. 36 shows relationship between the time tn obtained in the cycles and the specific capacity Cn/Co. In this figure, data till third cycle is plotted. 36-A indicates a line which represents the equation (37). In addition, 36-B indicates a line representing values 20% higher than values of the equation (37) (that is, error of +20%), and, 36-C indicates a line representing values 20% lower than values of the equation (37) (that is, error of −20%).

As shown in FIG. 36, every point of the measured data is within the error of ±20%. In addition, these points are very close to the line 36-A which represents the equation (37). This reveals that accurate degradation estimation result can be provided.

Example 5-2

An experiment was performed in which 6 prismatic Li-ion cells (the nominal capacity was 600 mAh) were placed in an oven at a constant temperature of 25° C. and each of the cells was separately connected to a cell charge and discharge automatic test apparatus which has data collection and data storing capability in order to obtain equations for the Li-ion cells. In the experiment, the test cell was cycled 10 times by discharging at 600 mA (1.0 CmA) to 2.75V and charging in CC-CV mode at 600 mA (1.0 CmA) to 4.1V with intervals of one hour between charge and discharge. The charge periods for the cells were 2 hours, 3 hours, 3 days, 7 days, 10 days, and 11 days, respectively.

In each cycle of charge and discharge, the elapsed time tn from the start of the CV mode until the charge current decreases to ½ of that at the CV mode charge start time and the specific capacity Cn/Co were measured.

Equations shown in FIG. 37 were obtained from data of the time tn and the specific capacity Cn/Co which was obtained from 4th cycle till 10th cycle.

Another experiment was performed as follows.

In this experiment, a used prismatic Li-ion cell (the nominal capacity was 1300 mAh) was used. The cell was cycled 3 times by discharging at 1300 mA (1.0 CmA) to 2.75V and charging in CC-CV mode at 1300 mA (1.0 CmA) to 4.1V for 3 hours with intervals of 10 minutes between charge and discharge.

In each cycle of charge and discharge, the elapsed time tn from the start of the CV mode charge until the charge current decreases to ½ of that at the CV mode start time and the specific capacity percentage Cn/Co were recorded. Then, the validity of the equation (37) was evaluated.

Figure 38:
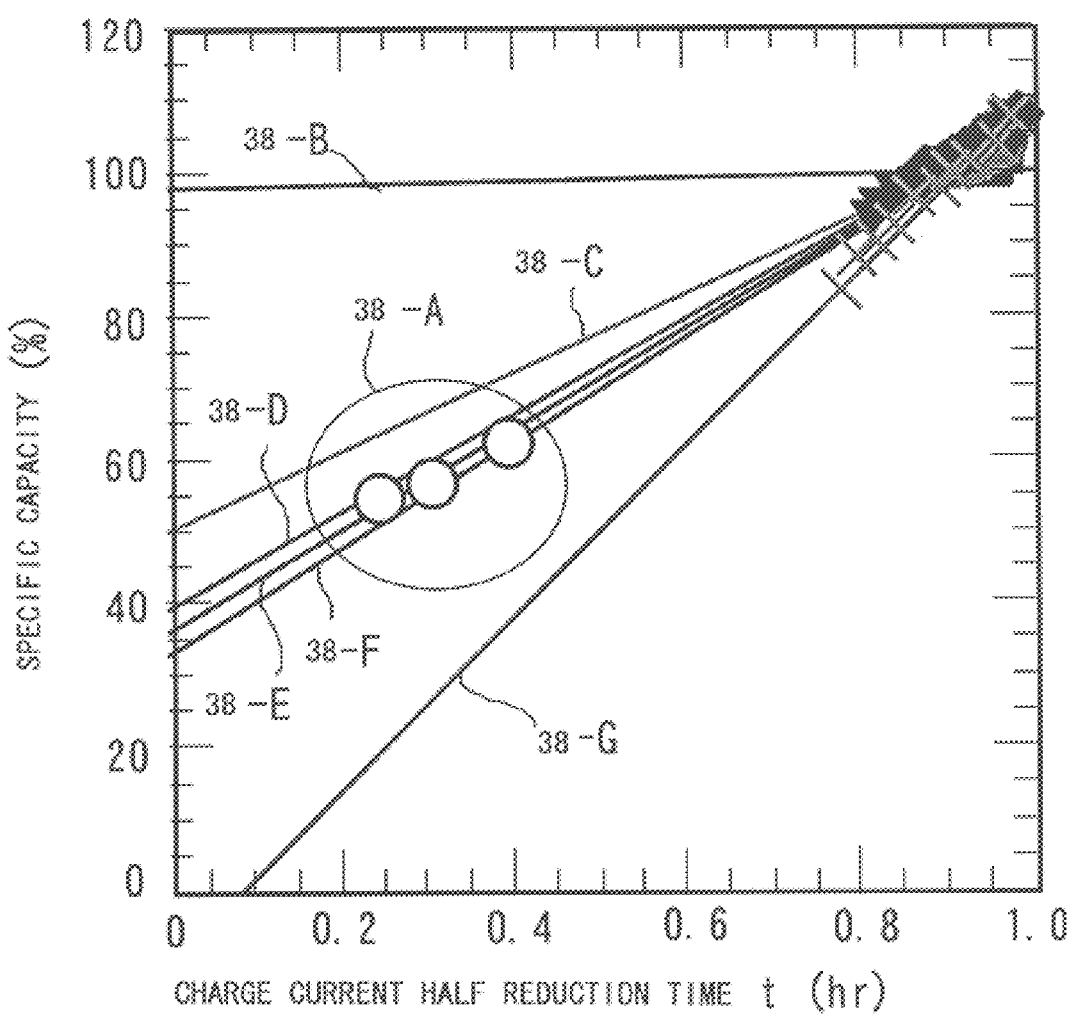
FIG. 38 shows relationship between charge current half reduction time t and specific capacity C/Co in an example 5-2, and lines of each equation.

FIG. 38 shows the result.

FIG. 38 shows relationship between the time tn and the specific capacity Cn/Co. In the figure, 38-A shows measurement data till the third cycle.

In addition, in FIG. 38, points of experiment data for preparing the equations shown in FIG. 37 and lines representing the equations are shown. 38-B indicates a line which represents the equation prepared by data of 2 hour charge period, 38-C indicates a line which represents the equation prepared by data of 3 hour charge period, 38-D indicates a line which represents the equation prepared by data of 3 day charge period, 38-E indicates a line which represents the equation prepared by data of 7 day charge period, 38-F indicates a line which represents the equation prepared by data of 10 day charge period, 38-G indicates a line which represents the equation prepared by data of 11 day charge period.

In addition, error between the estimated specific capacity and actual measurement specific capacity was shown in FIG. 37, wherein the estimated specific capacity was calculated by substituting the time t necessary for the CV charge current to decrease to half into each equation.

As shown in FIG. 38, for each of the specific capacities obtained by equations corresponding to the charge period ranging from 3 hours to 10 days, the error is within ±20% which is a good estimation result. Especially, as shown in FIG. 37, when the charge period is set from 3 days to 10 days, the estimation error becomes within ±10%. Thus, it is revealed that estimation of very high accuracy can be performed.

On the other hand, according to equations prepared by experiments in which the charge period was set to be 2 hours or 11 days, estimation error exceeds ±20% so that it is revealed that accurate degradation estimation is difficult.

Example 5-3

An experiment was performed in which 6 prismatic Li-ion cells (the nominal capacity was 600 mAh) were placed in an oven at a constant temperature of 45° C. and each of the cells was separately connected to a cell charge and discharge automatic test apparatus which has data collection and data storing capability in order to obtain equations for the Li-ion cells. In the experiment, the test cell was cycled 10 times by discharging at 600 mA (1.0 CmA) to 2.75V and charging in CC-CV mode at 600 mA (1.0 CmA) to 4.1V for 7 days with intervals of one hour between charge and discharge.

In each cycle of charge and discharge, the elapsed time tn from the start of the CV mode charge until the charge current decreases to ½ of that at the CV mode charge start time and the specific capacity Cn/Co were measured.

Four equations were obtained, from the time tn and the specific capacity Cn/Co of all cycles, the time tn and the specific capacity Cn/Co of 4th and 5th cycles, the time tn and the specific capacity Cn/Co from 4th cycle till 6th cycle, the time tn and the specific capacity Cn/Co from 4th cycle till 10th cycle, respectively.

The specific capacities calculated by the equations and actual measurement specific capacities were compared by using data of the elapsed time tn from the start of the CV mode until the charge current decreases to half and the specific capacity Cn/Co for three cycles of the used prismatic Li-ion cell (the nominal capacity was 600 mAh) used in the example 5-2.

Figure 39:
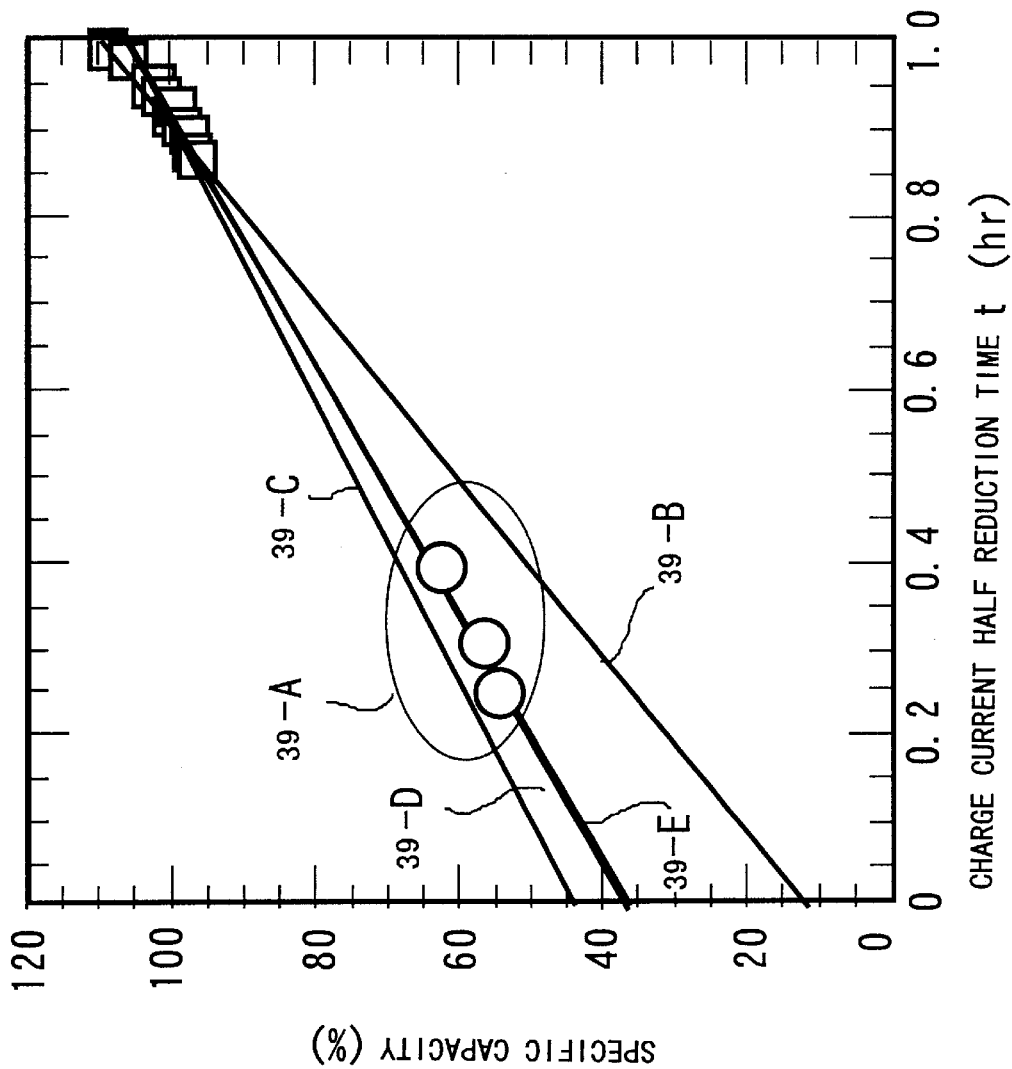
FIG. 39 shows relationship between charge current half reduction time t and specific capacity C/Co in an example 5-3, and lines of each equation.

The result is shown in FIG. 39.

FIG. 39 shows the relationship between the elapsed time tn from the start of the CV charge mode until the charge current decreases to half and the specific capacity Cn/Co. In the figure, 39-A indicates measurement data of the used prismatic cell measured in the example 5-2, 39-B indicates a line which represents the equation prepared by measurement data of all cycles, 39-C indicates a line which represents the equation prepared by measurement data of 4th cycle and 5th cycle, 39-D indicates a line which represents the equation prepared by measurement data from 4th cycle to 6th cycle, 39-E indicates a line which represents the equation prepared by measurement data from 4th cycle to 10th cycle.

As is evident from FIG. 39, according to the method of preparing the equation of the present invention, accurate estimation becomes possible. That is, the maximum error (absolute value) of the specific capacity calculated by the equation prepared from data of 4th cycle and 5th cycle against actual measurement data is 6.1%, the maximum error (absolute value) of the specific capacity calculated by the equation prepared from data from 4th cycle till 6th cycle against actual measurement data is 2.7%, the maximum error (absolute value) of the specific capacity calculated by the equation prepared from data from 4th cycle till 10th cycle against actual measurement data is 2.5%, which shows good estimation accuracy.

On the other hand, the maximum error of the specific capacity calculated by the equation prepared from data of all cycles (from first cycle till 10th cycle) against actual measurement data is 20.4%, which is not favorable since it exceeds ±20%.

Example 5-4

An experiment was performed in which 5 prismatic Li-ion cells (the nominal capacity was 600 mAh) were placed in an oven at a constant temperature of 5° C. and each of the cells was separately connected to a cell charge and discharge automatic test apparatus which has data collection and data storing capability in order to obtain equations for the Li-ion cell. In the experiment, the 5 test cells were cycled 10 times by discharging at 600 mA (1.0 CmA) to 2.75 V and charging in CC-CV mode to 4.1 V for 7 days with intervals of one hour between charge and discharge. Charge current was 90 mA (0.15 CmA), 120 mA (0.2 CmA), 600 mA (1.0 CmA), 1200 mA (2.0 CmA), and 1500 mA (2.5 CmA), respectively.

In each cycle of charge and discharge, the elapsed time tn from the start of the CV mode charge until the charge current decreases to ½ of that at the CV mode charge start time and the specific capacity Cn/Co were measured.

Five equations were obtained from the time tn and the specific capacity Cn/Co of cycles from 4th cycle till 10th cycle.

The specific capacities calculated by the five equations and actual measurement specific capacities were compared by using data of the elapsed time tn from the start of the CV mode until the charge current decreases to half and the specific capacity Cn/Co for three cycles for the used prismatic Li-ion cell (the nominal capacity was 600 mAh) used in the example 5-2.

Figure 40:
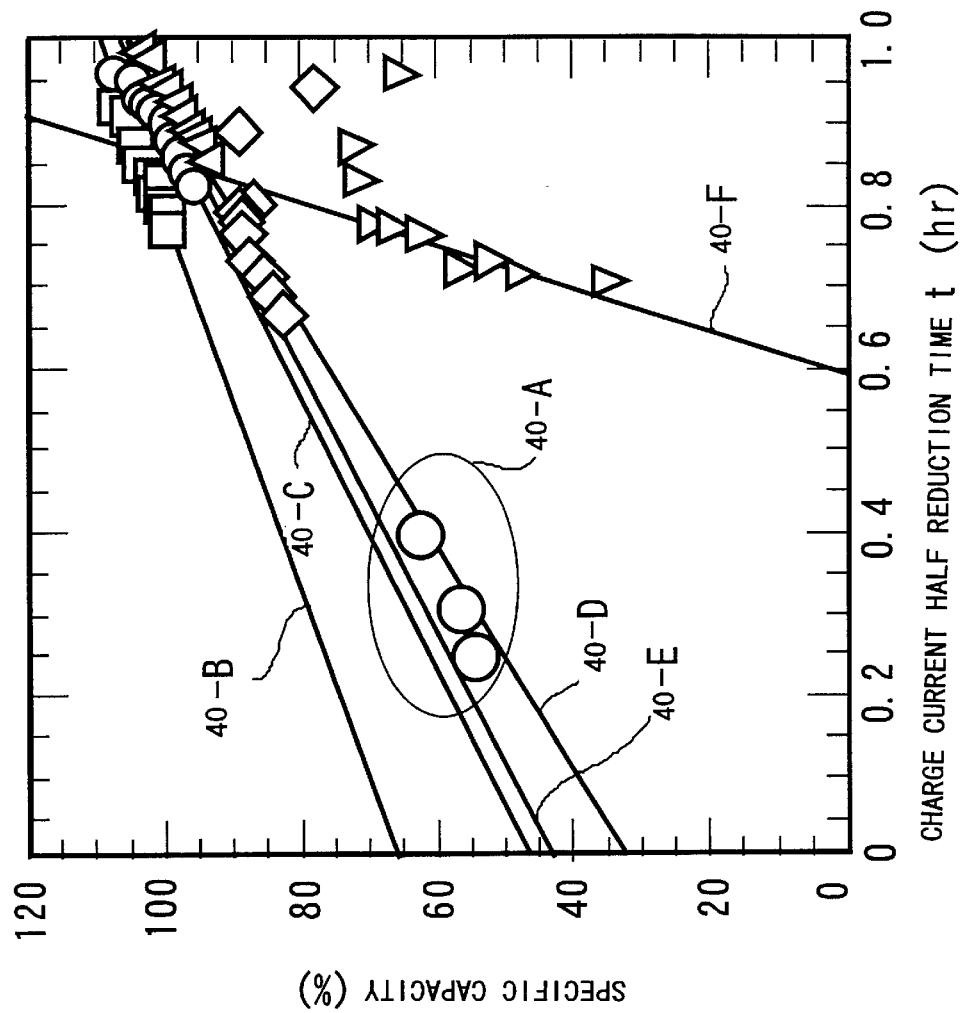
FIG. 40 shows relationship between charge current half reduction time t and specific capacity C/Co in an example 5-4, and lines of each equation.

The result is shown in FIG. 40.

FIG. 40 shows the relationship between the elapsed time tn from the start of the CV charge mode to the instant when the charge current decreases to half and the specific capacity Cn/Co. In the figure, 40-A indicates measurement data of the used prismatic cell measured in the example 5-2, 40-B indicates a line which represents the equation prepared by measurement data of experiment of 0.15 CmA charge current, 40-C indicates a line which represents the equation prepared by measurement data of experiment of 0.2 CmA charge current, 40-D indicates a line which represents the equation prepared by measurement data of experiment of 1.0 CmA charge current, 40-E indicates a line which represents the equation prepared by measurement data of experiment of 2.0 CmA charge current, and 40-F indicates a line which represents the equation prepared by measurement data of experiment of 2.5 CmA charge current.

As is evident from FIG. 40, according to the method of preparing the equation of the present invention, accurate estimation becomes possible. That is, the maximum errors (absolute value) of the specific capacities calculated by the equations prepared from data of 0.2 CmA, 1.0 CmA, and 2.0 CmA charge currents are 7.9%, 6.1%, and 5.1%, respectively, which shows good estimation accuracy.

On the other hand, the maximum errors (absolute value) of the specific capacities calculated by the equations prepared from data of 0.15 CmA and 2.5 CmA are 20.6% and 27.4%, respectively, which is not favorable since it exceeds ±20%.

Example 5—5

An experiment was performed in which 6 prismatic Li-ion cells (the nominal capacity was 600 mAh) were placed in each oven set at constant temperatures of −5° C., 0° C., 15° C., 30° C., 45° C., and 50° C. respectively and each of the cells was separately connected to a cell charge and discharge automatic test apparatus which has data collection and data storing capability in order to obtain equations for the Li-ion cell. In the experiment, the 6 test cells were cycled 10 times by discharging at 600 mA (1.0 CmA) to 2.75 V and charging in CC-CV mode to 4.1V for 7 days with intervals of one hour between charge and discharge.

In each cycle of charge and discharge, the elapsed time tn from the start of the CV mode charge to the time when the charge current decreases to ½ of that at the CV mode start time and the specific capacity Cn/Co were measured.

Six equations were obtained from the time tn and the specific capacity Cn/Co of cycles from 4th cycle till 10th cycle.

The specific capacities calculated by the six equations and actual measurement specific capacities were compared by using data of the elapsed time tn from the start of the CV mode until the charge current decreases to half and the specific capacity Cn/Co for three cycles for the used prismatic Li-ion cell (the nominal capacity was 1300 mAh) used in the example 5-2.

Figure 41:
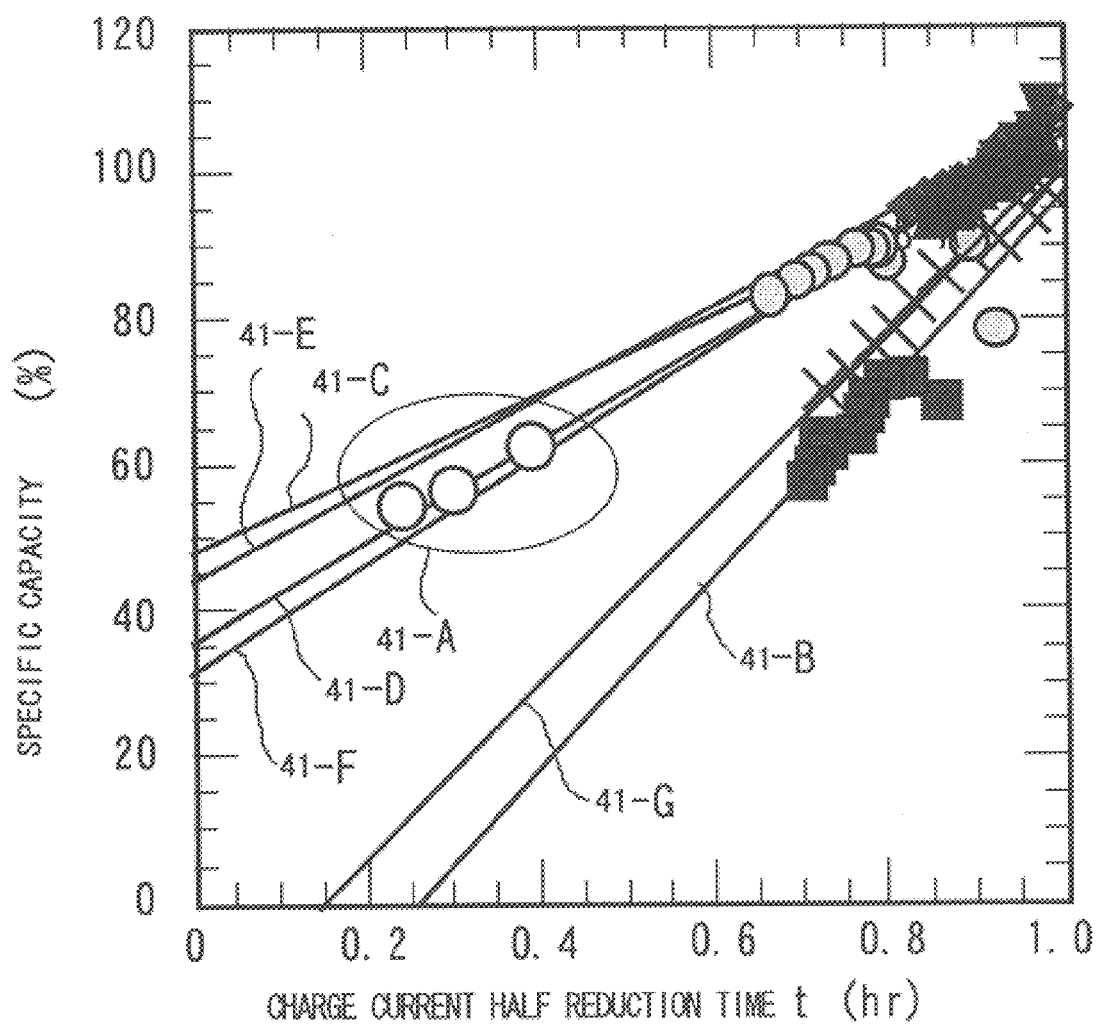
FIG. 41 shows relationship between charge current half reduction time t and specific capacity C/Co in an example 5—5, and lines of each equation.

The result is shown in FIG. 41.

FIG. 41 shows the relationship between the elapsed time tn from the start of the CV charge mode until the charge current decreases to half and the specific capacity Cn/Co. In the figure, 41-A indicates measurement data of the used prismatic cell measured in the example 5-2, 41-B indicates a line which represents the equation prepared by measurement data of experiment at −5° C., 41-C indicates a line which represents the equation prepared by measurement data of experiment at 0° C., 41-D indicates a line which represents the equation prepared by measurement data of experiment at 15° C., 41-E indicates a line which represents the equation prepared by measurement data of experiment at 30° C., 41-F indicates a line which represents the equation prepared by measurement data of experiment at 45° C. and 41-G indicates a line which represents the equation prepared by measurement data of experiment at 50° C.

As is evident from FIG. 41, according to the method of preparing the equation of the present invention, accurate estimation becomes possible. That is, the maximum errors (absolute value) of the specific capacities calculated by the equations prepared from experiment at 0° C., 15° C., 30° C., and 45° C. against the actual measurement data are 7.1%, 4.1%, 6.4% and 6.8% respectively, which shows good estimation accuracy. Especially, when the temperature is 15° C. and 30° C., equations which provide more accurate estimation result can be prepared.

On the other hand, the maximum errors (absolute value) of the specific capacities calculated by the equations prepared from data of −5° C. and 50° C. against the actual measurement data are 58.3% and 44.8% respectively, which is not favorable since it exceeds ±20%.

Example 5-6

In this example, a charger which charges a battery by using the CC-CV charge method and performs capacity and degradation estimation of the battery was manufactured and will be shown. The battery includes three prismatic Li-ion cells (nominal capacity of each is 600 mAh) which are connected in series. In the CC-CV charge method used by the charger for charging the battery, the charge limit voltage is 12.3V (2.75 V/cell), the charge current is 600 mA (1.0 CmA) and the charge-end current which is a threshold for ending the charge is 30 mA (0.05 CmA).

A configuration of this charger is the same as that shown in FIG. 11.

The procedures for degradation estimation of this charger will be described with reference to FIG. 42.

(step A) The charge is started by placing the battery in the charger and the battery voltage is monitored. When the battery voltage V reaches the charge limit voltage 12.3V (4.1 V/cell), time measuring for degradation estimation is started. At the same time, the charge current is monitored.

(step B) When the charge reaches 300 mA (0.5 CmA), the time measuring ends. Then, the elapsed time t from the time when the charge voltage reaches the charge limit voltage until the current reaches 300 mA is recorded.

(step C) The time t is substituted into the equation (37) so that the estimated specific capacity Ce/Co is calculated.

(step D) The calculation result is displayed on the LCD and the LED. According to the estimated specific capacity, one of red, yellow and green LEDs illuminates. At the same time, a numeric value is displayed on the LCD. The value is displayed on the LCD for 30 seconds and the LED illuminates while the charger is connected to the utility power source.

The capacity estimation and degradation estimation of the present invention is performed in the following way.

Figure 42:
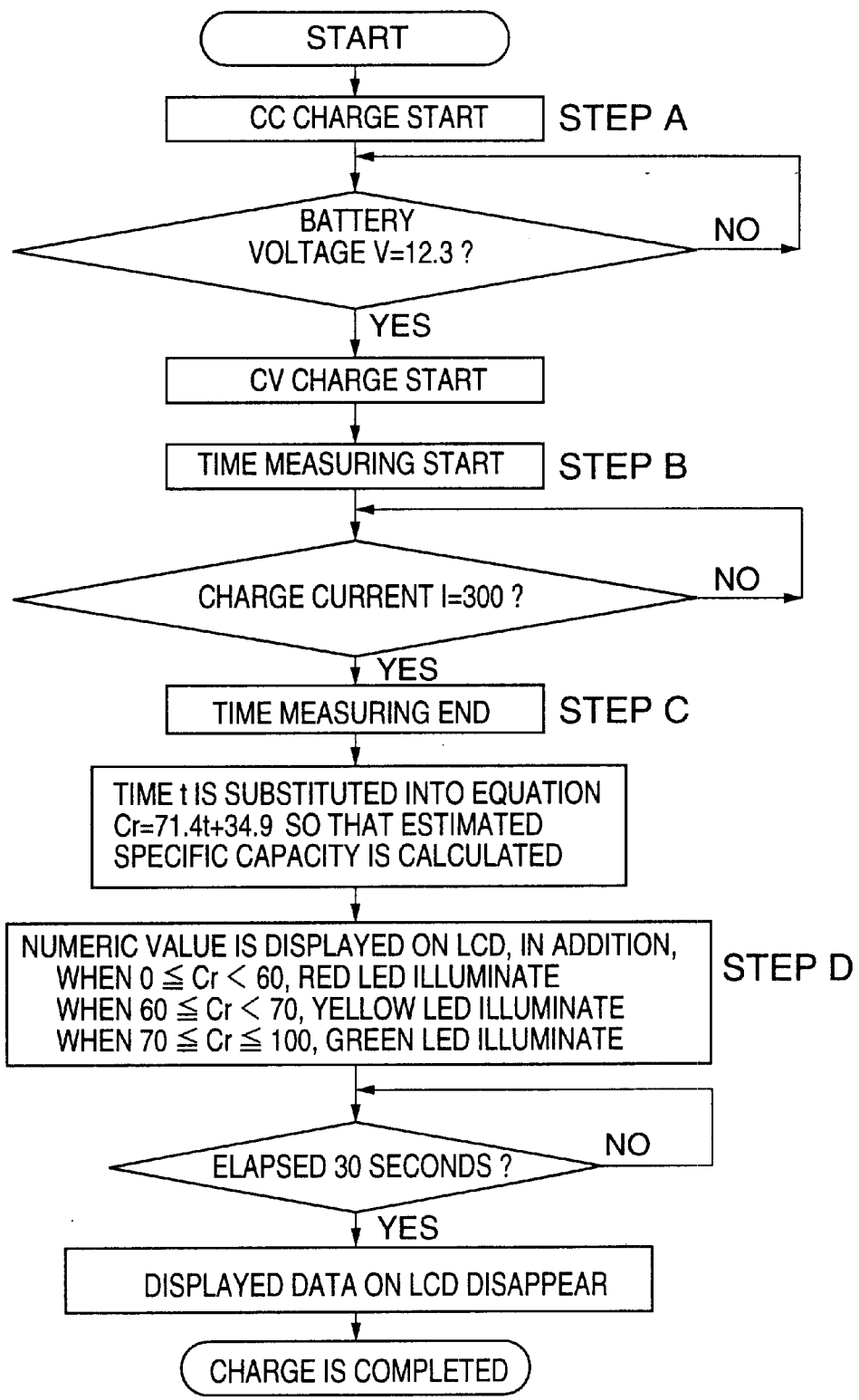
FIG. 42 is a flowchart showing degradation estimation procedures performed in an experiment 5-6.

A program including the equation (37) prepared in the example 5-1 and the steps shown in FIG. 42 is stored in the charge control microprocessor 30 beforehand. While monitoring of the battery voltage and the charge current, the internal timer measures the time t elapsed from the time when the battery voltage reaches 12.3 V, that is, from the time the charge mode changes from the CC mode to the CV mode until the charge current decreases to ½ (300 mA). Then, capacity estimation and degradation estimation of the Li-ion battery is performed by applying the time t to the equation (37) so that the estimated capacity and the result of degradation estimation are displayed on the display part 32.

The charger of this embodiment displays a timer on the LCD such that the charge time of the battery can be recognized.

By using this charger, a used battery of the same type was placed in this charger and was charged. The degradation estimation result was displayed 48 minutes after the time when the charge mode was changed from the CC mode to the CV mode. The charge completed 4 hours and 6 minutes after the time of the mode change. "92%" was displayed on the LCD as the estimated specific capacity and the green LED illuminated.

Then, the charged battery was mounted in the battery charge and discharge automatic test apparatus so that constant current discharge was performed wherein the discharge current was set to be 600 mA (1.0 CmA) and the discharge cut-off voltage was set to be 8.25V. As a result, the discharge capacity was 542 mAh according to this test. This value is equivalent to 90.3% as specific capacity, which revealed that the error of capacity estimation was about 1.7%.

Accordingly, it becomes evident that the charger having capabilities of the present invention can estimate degradation accurately.

Example 5-7

A Li-ion battery which can be mounted in a portable information terminal was manufactured. The configuration is the same as that shown in FIG. 3. The Li-ion battery has a capability of performing the CC-CV method charge on condition that the charge limit voltage is 12.3V, charge current is 600 mA (1.0 CmA) and the charge-end current is 60 mA. The battery includes three prismatic Li-ion cells (nominal capacity is 600 mAh) 12-1, 12-2, and 12-3 which are connected in series. The equation (37) is stored in the IC for protection beforehand.

In addition, a program is stored in a memory in the IC 13 for protection. According to this program, following process is performed. The voltage across the cells 12-1, 12-2, and 12-3 is monitored by Vcc and Vss. The charge voltage is monitored and the elapsed time t from the time when the voltage becomes the charge limit voltage 12.3V (4.1 V/cell), that is, from the time when the charge mode changes from the CC mode to the CV mode to the time when the charge current decreases to ½ (300 mA (0.5 CmA)) is measured. Then, the measured time t is substituted into the equation (37) so that the specific capacity Ce/Co is calculated.

The battery is configured such that the result is output to the body of the portable terminal in order to be displayed on an LCD of the portable terminal via the terminal 19.

On the LCD, a numerical value indicating the degradation estimation result is displayed as % and a bar in which a part of the bar corresponding to the % value ratio is colored is displayed.

A command for doing degradation estimation is provided from the body of the portable terminal concurrently with the start of charge. Procedures for performing the degradation estimation are the same as those shown in FIG. 42 except for the result to be sent to the body since the result is displayed on the display of the portable terminal.

The battery was mounted in the portable information terminal and used for one hour. After that, charge of the battery was started by connecting the terminal to the utility power source. The estimated specific capacity of the battery was displayed as 75% after the start of the charge. After checking that a sign of charge completion was displayed, the information terminal was powered off and the battery was removed from the terminal. Then, the battery was connected to the battery charge and discharge automatic test apparatus by using proper codes and the discharge capacity was measured by discharging the battery on condition that the discharge current was 600 mA (1.0 CmA) and the discharge cut-off voltage was 8.25V (2.75 V/cell). As a result, the discharge capacity was 472 mAh, which means that the specific capacity was 78.7%.

Thus, the error of estimation was −3.7%, which means estimation was performed accurately.

(Sixth Embodiment)

In the following, the sixth embodiment will be described.

The capacity estimation and degradation estimation method can be applied to various apparatuses which mount the Li-ion battery. In the sixth embodiment, examples which mount the Li-ion cell or the Li-ion battery to which the capacity estimation and degradation estimation method of the present invention are applied will be shown.

First, an example in which the present invention is applied to an electric vehicle (EV) will be described.

The electric vehicle in this embodiment is a pure electric vehicle (PEV) which mounts a Li-ion battery including 12 modules, 96 cells in which the rating voltage is 28.8V and the rating capacity is 100 Ah. The seating capacity of the PEV is 4 passengers and the weight is 1415 kg. The mileage per one charge (5 hour charge) is larger that 200 km. The PEV is driven only by the battery. Thus, it is important to grasp not only remaining capacity but also the life of the battery. The capacity estimation and degradation estimation methods of the present invention can be used effectively for evaluating the capacity and the life properly.

Figure 43:
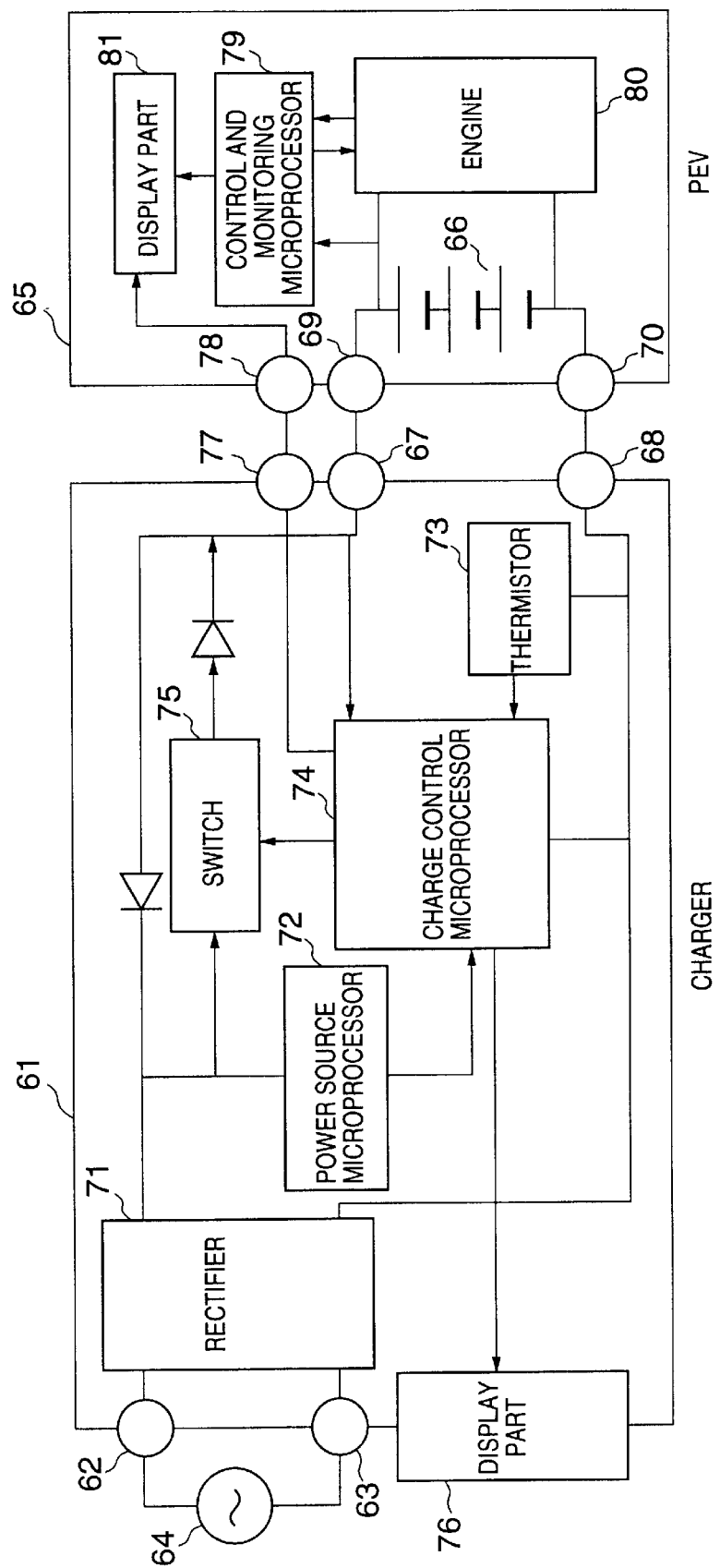
FIG. 43 shows an electric circuit configuration when the Li-ion battery in PEV is charged by a charger which is connected to utility power source in which capacity estimation and degradation estimation are performed while charging.

FIG. 43 shows a configuration when the Li-ion battery in the PEV is charged by a charger. The configuration of the charger is the same as that described so far. When charging the battery, the charger 61 is connected to the utility power 64 via the cable terminals 62 and 63. The Li-ion battery 66 in the PEV 65 is connected to the charger via cable terminals 67, 68, 69, and 70.

In the charger 61 to which the Li-ion battery 66 is connected, alternating current from the utility power 64 is converted into direct power. The charge control microprocessor 74 controls charge on the basis of information from the power source microprocessor and control information on safety from the thermistor 73. The switch 75 is used for ending the charge. In addition, the charge control microprocessor 74 displays charge state and safety state on the display part 76 of the charger 61 and activates an alarm.

In order to performing the capacity estimation and degradation estimation of the present invention in the PEV, a program for performing the estimation by using the equation of the present invention is stored in an available memory in the charge control microprocessor 74 beforehand so that the specific capacity Cr(%), the degradation degree Deg(%) are calculated by applying data of voltage for charge control, current monitor, and the timer to the equation.

Terminals are provided in the charger and the PEV 65 for connecting and disconnecting a cable for sending calculated values. The specific capacity Cr(%) and the degradation degree Deg(%) which are calculated by the charge control microprocessor 74 are sent to a control and monitoring microprocessor 79 in the PEV 65. The data calculated on the basis of the capacity estimation and degradation estimation method of the present invention is displayed, with information of the engine 80, on a proper display part 81 such as an instrument panel and a navigation system display, and generates an alarm. For transmitting the specific capacity Cr(%) and the degradation degree Deg(%) which are calculated by the charge control microprocessor 74 to the control and monitoring microprocessor 79 in the PEV 65, wireless communication instead of using the cable can be used by providing a wireless communication apparatus or a jig between the charger and the PEV.

On the basis of the specific capacity Cr(%) and the degradation degree Deg(%) which are calculated by any one of method of the capacity estimation and the degradation methods of the present invention, mileage expectancy at the time of full charge according to degradation and remaining life of the battery are displayed in the PEV65. In addition, an alarm can be raised when the decrease of capacity or degradation degree exceeds a predetermined value.

An example of a procedure for performing the capacity estimation and degradation estimation will be described in the following.

The program for performing the capacity estimation and degradation estimation by using one of the equations of the present invention is stored beforehand in the charge control microprocessor 74 in the charger. The battery voltage and current are monitored, time is measured by the internal timer so that the specific capacity Cr(%) and the degradation degree Deg(%) are calculated. The calculated values are transmitted to the control and monitoring microprocessor 79 via a cable between the cable terminals 77 and 78. The control and monitoring microprocessor 79 has a program for calculating the mileage expectancy Dr(km) and the life expectancy Y(year) of the battery per one charge. Thus, the control and monitoring microprocessor 79 calculates them by using the specific capacity Cr(%) and the degradation degree Deg(%) based on the following equations $$Dr=Dr^0 \times Cr/100 \tag{38}$$

$$Y=Y^0 \times Deg/100 \tag{39}$$

wherein $Dr^0$ is the mileage expectancy of a new battery per one charge, and $Y^0$ is the life expectancy of the new battery.

The display part 81 of the PEV 65 displays the calculated results.

Figure 44:
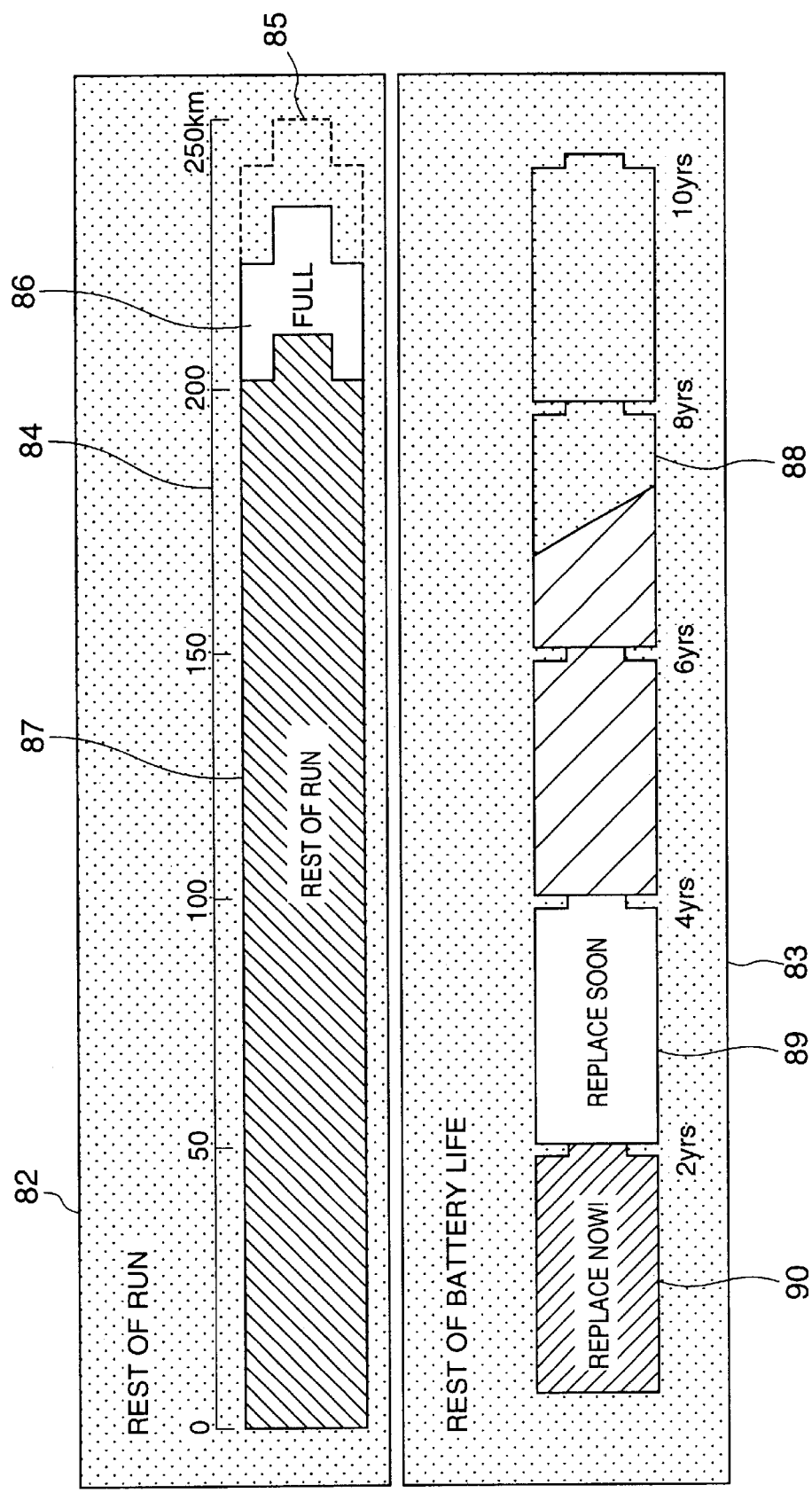
FIG. 44 shows an example of display screen of PEV which displays remaining mileage "Rest of run" and remaining life "Rest of battery life"

FIG. 44 shows an example of the display screen. As shown in FIG. 44, remaining mileage "Rest of run" 82 and remaining life "Rest of battery life" 83 are displayed on the display part 81 of the PEV 65. In the screen of the remaining mileage 82, numbers into which the remaining mileage is divided are shown, The mileage expectancy $Dr^0$ of a new battery is shown as a cell shape 85 by dotted lines. The mileage expectancy Dr which is calculated by the equation (38) is shown as a cell shape 86 by solid lines. The battery energy which is consumed by driving the PEV is obtained by a conventional remaining time estimation method and the remaining mileage can be indicated by using a cell shape 87 filled with a color in the cell shape 86 which indicates full charge state.

In the screen 83 of the remaining battery life calculated by the equation (39), the remaining life is indicated by five cell shapes 88. When Y becomes equal to or smaller than 40%, the second cell 89 from the left side is shown by yellow, which is attention color, and indicates "Replace soon". When Y becomes equal to or smaller than 20%, the cell 90 of the left side is shown by red, which is warning color, and indicates "Replace Now!". The remaining life Y(%) is shown by filling the cells from the left side. By indicating that the filled area of the remaining life Y(%) includes error, the right end of the filled area may be cut in a slanting direction.

When there is not enough space in the display part 79, or according to the type of PEV, the cell shapes can be omitted and only "Replace soon" and "Replace Now!" can be displayed, or only an alarm can be sounded.

Figure 45:
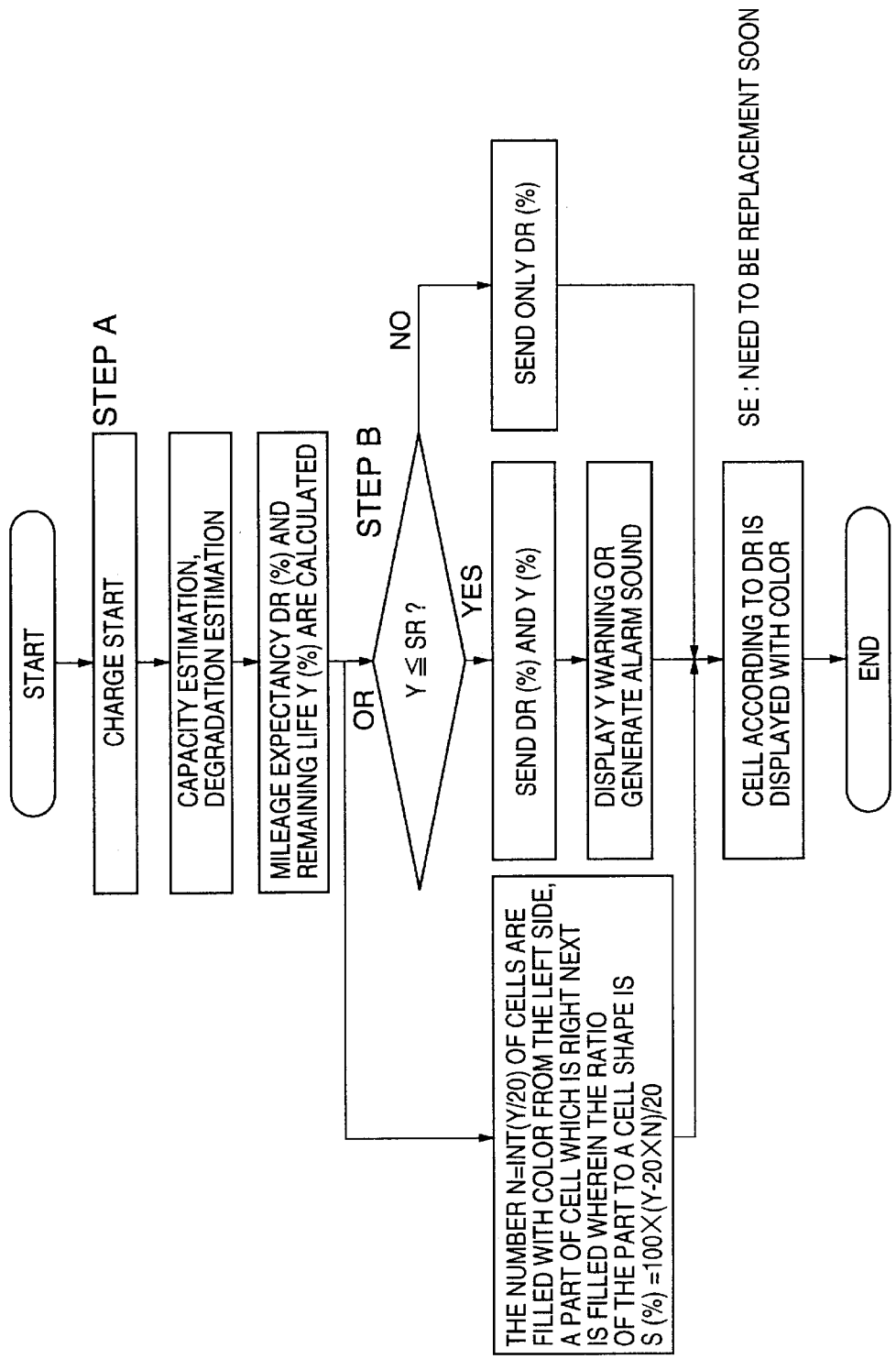
FIG. 45 is a flowchart showing procedures of calculating remaining mileage of the PEV and remaining life of Li-ion battery mounted in the PEV.

FIG. 45 is a flowchart showing a procedure for displaying the remaining mileage and the remaining life of the battery by applying the capacity estimation and the degradation estimation method of the present invention to the Li-ion battery in the PEV. In the following, the procedure will be described with reference to FIG. 45.

(step A) The Li-ion battery mounted in the PEV is charged and the specific capacity Cr(%) and the degradation degree Deg(%) are calculated by applying the capacity estimation and the degradation estimation method of present invention to the Li-ion battery in the PEV. Then, the mileage expectancy Dr(%) and the remaining life Y(%) are calculated by using equations (38) and (39).

(step B) The mileage expectancy Dr(%) and the remaining life Y(%) obtained in the step A are displayed. That is, when the remaining life Y(%) is displayed, N is obtained such that Y is divided by 20

$$N=INT(Y/20) \tag{40}$$

for displaying the remaining life in a scale of 1 to five. Then, the number N of the cells are filled from the left side. Next, a part of the cell shape which is right next to the filled cell is filled such that the ratio of the part to be filled to a cell shape is S(%)=100×(Y−20×N)/20 (41). In the case that the remaining life is not displayed, only when Y becomes equal to or smaller than 40% so that exchanging cells should be considered, it is displayed or an alarm is sounded.

The remaining mileage Dr(%) can be displayed by the cell shape in which the length is determined by Dr(%) obtained by the equation (38).

These displaying methods are examples for describing the embodiment and the present invention is not limited to these method.

The capacity estimation method and the degradation estimation method can be applied to a power assist bicycle. The procedure for the power assist bicycle is the same as that for the PEV. However, as for the power assist bicycle, space for displaying data is generally limited, thus, the part 83 of the remaining life in the display part shown n FIG. 44 can be moved to the side of the charger.

In addition, the capacity estimation method and the degradation estimation method can be applied to a hybrid electric vehicle (HEV), a solar cell generator system (SCS), a windmill generator system (WMS). For these systems, it is important to estimate the remaining life of the battery in order to determine battery exchanging time.

Figures 46A, 46B:
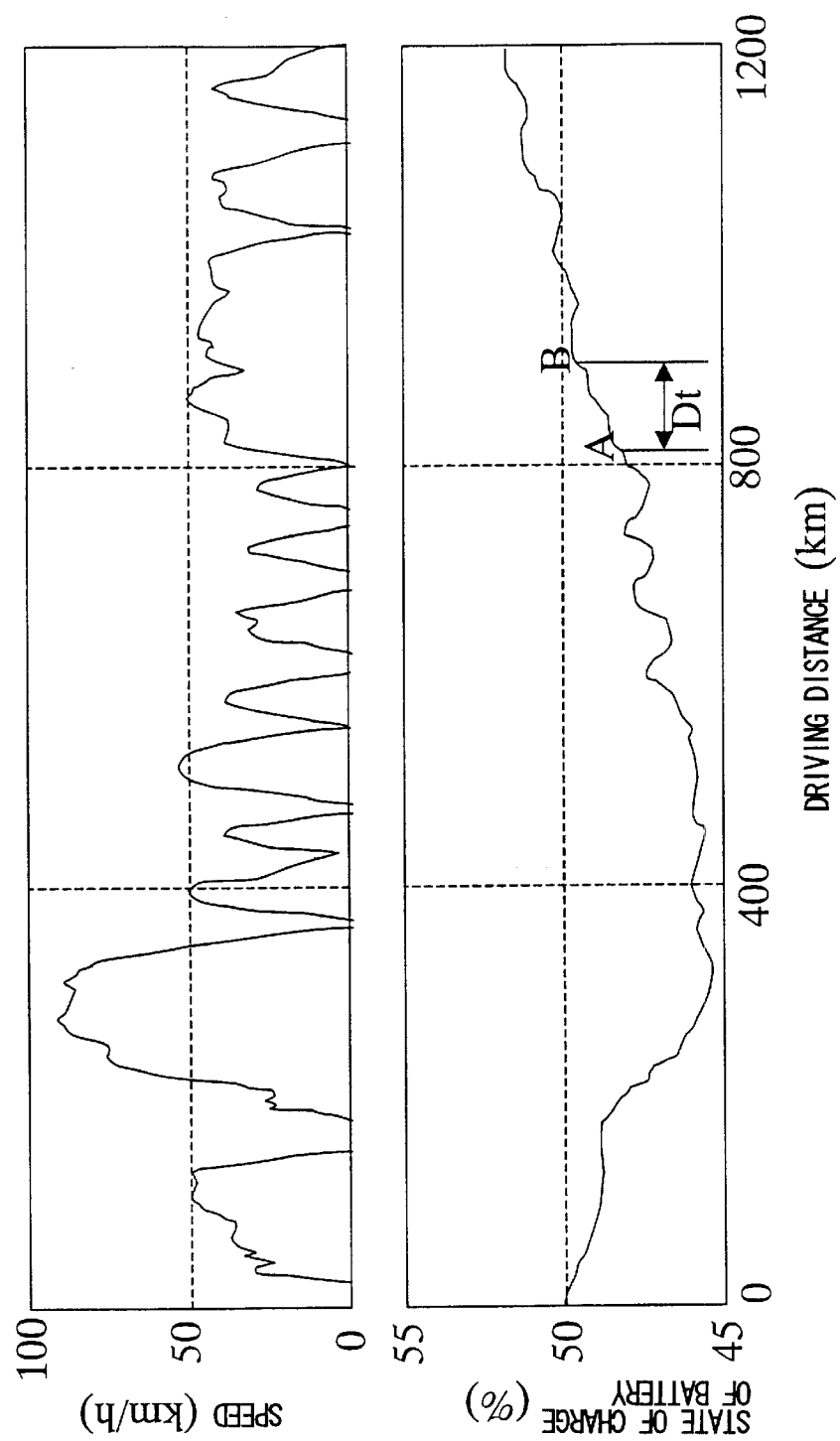
FIGS. 46A and 46B show a running state of HEV and a state of charge of mounted battery.

FIGS. 46A and 46B show an example of a state of charge (SOC) of the battery mounted in the HEV. In FIGS. 46A and 46B, variations between the speed of the HEV and the SOC of the battery are shown, in which the lateral axis indicates the deriving distance and the vertical axis indicates the speed and the SOC in FIGS. 46A and 46B respectively.

As shown in FIGS. 46A and 46B, in this case, different from the PEV and PAB, charge and discharge are repeated frequently in the battery while driving. Thus, it is difficult to use monitored current and voltage directly. Therefore, it is necessary to determine a charge time which is longer than a predetermined time and to convert current and voltage which are monitored in this charge time to values of general constant current and constant voltage charge method (in the following, the constant current and constant voltage charge method will be called as the CC-CV charge method) in order to apply the capacity estimation method and the degradation estimation method of the present invention.

The method of performing estimation by using constant current charge (in the following, the constant current charge will be called as the CC charge) time is most appropriate for capacity estimation and degradation estimation of the Li-ion battery mounted in the HEV. The capacity estimation method and the degradation estimation method of the present invention can be applied in several ways. For example, after identifying a time at which the battery is charged for loner than a predetermined time, preferably for 30 seconds, and, then, capacity estimation and degradation estimation is performed by using charge current and voltage in the time. When the charge period is shorter than 30 seconds, the time for monitoring is not enough so that effective date can not be obtained. In addition, since charge amount is small, estimation error may become large.

Monitoring of charge voltage is performed equal to or more than at least three times in 10 seconds. Then, a mean value of monitored voltages is obtained. Obtaining the mean voltage is performed a plurality of times at intervals of equal to or longer than at least 10 seconds. Accordingly, data of voltage variation in the cc charge can be obtained.

As for charge current, when the system has a mechanism for controlling charge current such that the charge current becomes constant, the constant charge current is used. When the charge current is limited to a predetermined range of value, or when the charge current is not controlled at all, a following method can be used as an example.

Figure 47:
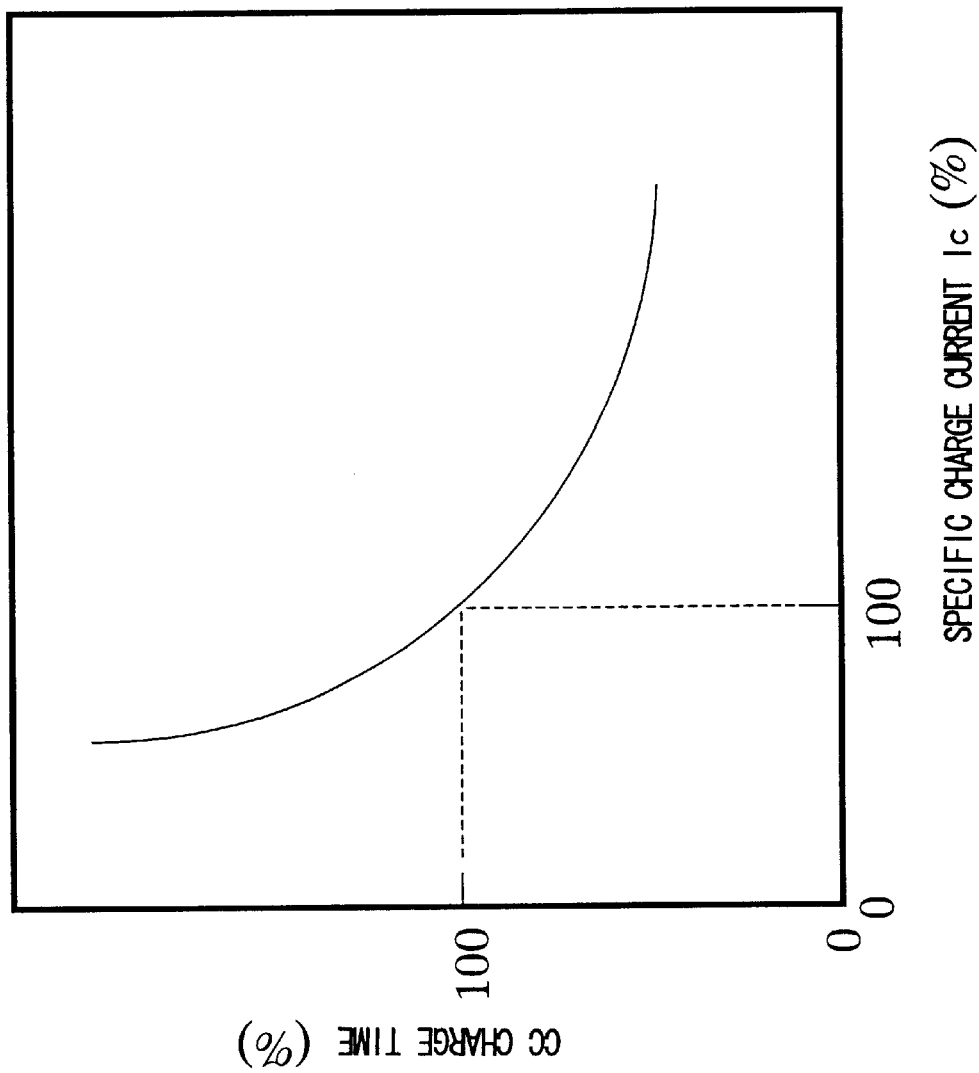
FIG. 47 shows relationship between the CC charge current and the CC charge time used for obtaining conversion coefficient used for applying monitored current to degradation estimation equation in HEV.

That is, monitoring of the charge current is performed equal to or more than three times in 10 seconds. Then, a mean value of the monitored currents is obtained. Obtaining the mean current is performed a plurality of times at intervals of equal to or longer than at least 10 seconds. When the error of the obtained mean currents is smaller than 5%, the charge becomes CC charge. In addition, when discharge is not included in the interval of obtaining the mean current and the interval is equal to or longer than 30 seconds, the charge mode is regarded as in the CC charge mode. Then, the obtained mean current and the charge time t are used for capacity estimation and degradation estimation. When the obtained mean current is different from the current used for determining the equation $Ce/Co=At+B$ (42) or $Ce/Co=A'\times t^{B'}$ (43) (A, B, A', and B' are constants and Co is the nominal capacity), relationship between the CC charge current and the CC charge time is obtained beforehand as shown in FIG. 47, and, then, the relationship is applied to the control and monitoring microprocessor so that conversion factor is obtained.

Figure 48:
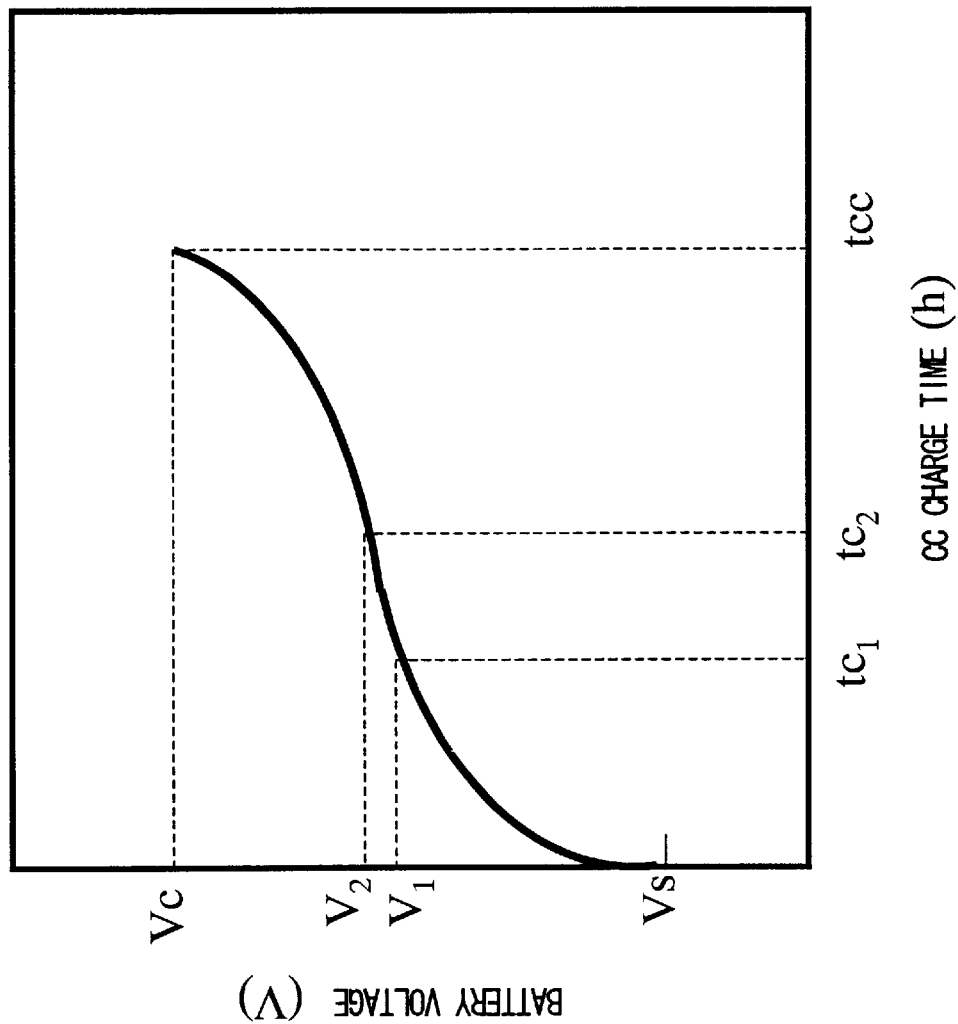
FIG. 48 shows a profile of CC charge voltage used for obtaining CC charge time applied to estimation equation from monitored charge voltage in HEV.

In addition, data of voltage variation in the CC charge of the battery is applied to the control and monitoring microprocessor beforehand. Then, the necessary time tcc for the charge voltage to change from the CC charge start voltage Vs to the CC charge end voltage Vc used for the equation (42) or (43) is calculated by comparing monitored voltages V1 and V2 with data shown in FIG. 48. The specific capacity Ce/Co can be obtained by substituting tcc into the equation (42) or (43).

The degradation degree Deg(%) can be obtained by $Deg(\%)=100\times(1-Ce/Co)$ (44).

Like the PEV, the remaining life Y is calculated from the capacity and the degradation degree so that the remaining life Y can be displayed on a proper display part such as an instrument panel or a navigation system.

For the Li-ion battery of the solar cell generator system (SCS) or the windmill generator system (WMS), the capacity estimation method and the degradation estimation method of the present invention can be used in order to display the remaining life of the battery in the same way as the HEV. However, in this case, since it is rare that the SCS or the WMS repeats charge and discharge as frequently as the HEV and the charge time per one time is longer than that of the HEV, monitoring becomes relatively easy.

According to the present invention, it becomes possible to provide a simple method for estimating capacity of the Li-ion cell, a simple method and apparatus for estimating degradation of the Li-ion cell and a Li-ion battery which includes means of performing capacity estimation and means for warning degradation of the cell as necessary. Thus, the present invention can greatly contribute to management of the Li-ion cell.

That is, in chargers and batteries and the like, degradation state of cells can be grasped accurately only by using monitoring capability of current and timer without adding any special parts. Thus, it becomes possible to perform management of change of Li-ion cell safely and reliably.

In addition, as described in the sixth embodiment, the present invention can be applied to various apparatuses and can greatly contribute to ensuring reliability and enlarging application of electronic devices.

The present invention is not limited to the specifically disclosed embodiments, and variations and modifications may be made without departing from the scope of the invention.

What is claimed is:

1. A method for providing a capacity estimation for a Li-ion cell, comprising the steps of:

obtaining, when said Li-ion cell is charged by a constant current and a constant voltage process, an elapsed time t which is a time difference from a first time when a charge voltage reaches a predetermined voltage Vs in a constant current charge mode to a second time when a charge condition is changed from a constant current charge mode to a constant voltage charge mode; and calculating an estimated capacity Ce of said Li-ion cell by using a function of said elapsed time t.

2. The method of claim 1, further comprising the steps of:

obtaining said elapsed time t for a charge current of said constant current charge mode having a value in a range from Co/(30 hours) to Co/(1 hour);

wherein Co is a nominal capacity of said Li-ion cell, and the step of calculating includes determining said estimated capacity Ce by using an equation $Ce/Co=A\times t^B$, A and B being positive constants, and B being an exponent of said elapsed time t.

3. The method of claim 2, further comprising the steps of:

repeating a charge and discharge cycle at least two times by using another Li-ion cell, which is used to provide a capacity estimation target and which is the same kind of Li-ion cell as said Li-ion cell, wherein said charge and discharge cycle includes a charge period from 3 hours to 10 days, a discharge period, and a rest period between said charge period and said discharge period, the rest period having a value of at least 0;

obtaining a discharge capacity Cn, and an elapsed time tn, which is a third time from when another charge voltage from another constant current charge reaches the predetermined voltage Vs to a fourth time when another charge condition is changed from the constant current charge mode to the constant voltage charge mode in each cycle; and determining values of said constants A and B from said elapsed time tn and said discharge capacity Cn.

4. A method for providing a degradation estimation for a Li-ion cell, comprising the steps of:

obtaining, when said Li-ion cell is charged by a constant current and a constant voltage process, an elapsed time t, which is a time difference from a first time when a charge voltage reaches a predetermined voltage Vs in a constant current charge mode to a second time when a charge condition is changed from a constant current charge mode to a constant voltage charge mode;

calculating an estimated capacity Ce of said Li-ion cell by using a function of said elapsed time t; and determining that said Li-ion cell is degraded when said estimated capacity Ce is smaller than a predetermined limit capacity Cmin.

5. The method of claim 4, wherein the step of calculating includes determining said estimated capacity Ce by using an equation $Ce/Co=A \times t^B$, A and B being positive constants.

6. A degradation estimation apparatus for a Li-ion cell, comprising:

means for obtaining, when said Li-ion cell is charged by a constant current and a constant voltage process, an elapsed time t, which is a time difference from a first time when a charge voltage reaches a predetermined voltage Vs in a constant current charge mode to a second time when a charge condition is changed from a constant current charge mode to a constant voltage charge mode; and a circuit to calculate an estimated capacity Ce of said Li-ion cell by using a function of said elapsed time t; and means for outputting a signal indicating that said Li-ion cell is degraded when said estimated capacity Ce is smaller than a predetermined limit capacity Cmin.

7. The degradation estimation apparatus of claim 6, wherein said estimated capacity Ce is calculated by using an equation $Ce/Co=A \times t^B$, and A and B are positive constants.

8. A Li-ion battery having a charge and discharge control arrangement, comprising:

a memory to store numerical data used to calculate an estimated capacity Ce of Li-ion cells in said Li-ion battery;

means for obtaining, when said Li-ion cell is charged by a constant current and a constant voltage process, an elapsed time t, which is a time difference from a first time when a charge voltage reaches a predetermined voltage Vs in a constant current charge mode to a second time when charge condition is changed from a constant current charge mode to a constant voltage charge mode; and a circuit for calculating said estimated capacity Ce of said Li-ion cells by using said elapsed time t and said numerical data.

9. The Li-ion battery of claim 8, wherein said estimated capacity Ce is calculated by using an equation $Ce/Co=A \times t^B$, and A and B are positive constants.

10. The Li-ion battery of claim 9, further comprising:

means for outputting a warning indicating that said Li-ion battery is degraded when said estimated capacity Ce is smaller than a predetermined limit capacity Cmin.

11. The Li-ion battery of claim 10, wherein said warning includes at least one of a warning by displaying characters, a warning by displaying an image, a warning by a beep, and a warning by a voice.

12. A method for providing a capacity estimation for a Li-ion cell, comprising the steps of:

obtaining, when said Li-ion cell is charged by a constant current and a constant voltage process, an elapsed time t, which is a time difference from a first time when a charge voltage reaches a predetermined voltage Vs in a constant current charge mode to a second time when the charge voltage reaches a charge limit voltage Vc, a charge current being no greater than Co/(20 hours), wherein Co is a nominal capacity of said Li-ion cell; and calculating an estimated specific capacity Ce/Co of said Li-ion cell by using an equation $Ce/Co=At+B$, wherein Ce is an estimated capacity of said Li-ion cell, and A and B are positive constants.

13. The method of claim 12, further comprising the steps of:

repeating a charge and discharge cycle at least three times by using another Li-ion cell, which is the same kind of Li-ion cell as a Li-ion cell and which is a target of capacity estimation, wherein said charge and discharge cycle includes a charge period from 3 days to 10 days by said constant current and constant voltage process, a discharge period, a rest period between said charge period and said discharge period, wherein the rest period is at least 0, and wherein the charge current in said charge period is no greater than Co/(20 hours), discharge current in said discharge period is a value in a range from Co/(5 hours) to Co/(0.5 hour) and a predetermined discharge cut-off voltage Vd is used in said discharge period;

obtaining a discharge capacity Cn and an elapsed time tn, which is another time difference from a third time when another charge voltage in the constant current charge reaches a predetermined voltage Vs to a fourth time when another charge voltage reaches a charge limit voltage Vc, in each cycle; and determining values of said constants A and B from said elapsed time tn and said discharge capacity Cn.

14. The method of claim 13, wherein said estimated capacity Ce is calculated by using an equation $Ce/Co=At+B$, and A and B are positive constants.

15. A capacity estimation apparatus for a Li-ion cell, comprising:

means for obtaining, when said Li-ion cell is charged by a constant current and a constant voltage process, an elapsed time t, which is a time difference from a first time when a charge voltage reaches a predetermined voltage Vs in a constant current charge mode to a second time when the charge voltage reaches a charge limit voltage Vc; and a first circuit to calculate an estimated specific capacity Ce/Co of said Li-ion cell by using an equation $Ce/Co=At+B$, wherein Ce is an estimated capacity of said Li-ion cell, Co is a nominal capacity of said Li-ion cell, and A and B are positive constants;

a second circuit to estimate a degradation state of said Li-ion cell based on said estimated specific capacity Ce/Co, and providing an estimated degradation state; and means for at least one of displaying the estimated degradation state and generating an alarm to warn of the estimated degradation state.

16. A Li-ion battery having a charge and discharge control arrangement, comprising:

a memory to store numerical data used for calculating an estimated specific capacity Ce/Co of Li-ion cells in said Li-ion battery, wherein Ce is an estimated capacity of said Li-ion cells and Co is a nominal capacity of said Li-ion cells;

means for obtaining an elapsed time t, which is a time difference from a first time when a charge voltage from a constant current charge reaches a predetermined voltage Vs in a constant current charge mode to a second time when the charge voltage reaches a charge limit voltage Vc, said Li-ion cell being charged by a constant current and a constant voltage process; and a circuit to calculate said estimated specific capacity Ce/Co of said Li-ion cell by using an equation Ce/Co=At+B and said numerical data, wherein A and B are positive constants;

means for outputting said estimated specific capacity Ce/Co.

17. A method for providing a capacity estimation of a Li-ion cell, comprising the steps of:

obtaining, when said Li-ion cell is charged by a constant current and a constant voltage process, a charge current after a lapse of a predetermined time from a time when a charge condition is changed from a constant current charge mode to a constant voltage charge mode; and calculating an estimated capacity of said Li-ion cell by using said charge current.

18. A method for providing a capacity estimation of a Li-ion cell, comprising the step of:

obtaining, when said Li-ion cell is charged by a constant current and a constant voltage process, an elapsed time t, which is a time difference from a first time when a charge condition is changed from a constant current charge mode to a constant voltage charge mode to a second time when a charge current is a product of a factor $\alpha$ and a charge current Ic in said constant current charge mode, wherein the factor $\alpha$ is between 0 and 1; and calculating an estimated capacity of said Li-ion cell by using said elapsed time t.

19. A method for providing a capacity estimation of a Li-ion cell, comprising the steps of:

repeating a charge and discharge cycle a plurality of times, wherein said charge and discharge cycle includes a charge period, in which said Li-ion cell is charged by a constant current and a constant voltage process to provide a charged Li-ion cell, and a discharge period, in which said charged Li-ion cell is discharged;

obtaining, when said Li-ion cell is charged by the constant current and the constant voltage process, an elapsed time $t_\alpha$, which is a time difference from a first time when a charge condition is changed from a constant current charge mode to a constant voltage charge mode to a second time when a charge current is a product of a factor $\alpha$ and another charge current Ic0 in said constant current charge mode, wherein the factor $\alpha$ is between 0 and 1;

obtaining an estimated specific capacity Ce/Co by using a first equation Ce/Co=−$At_\alpha$+B when said elapsed time $t_\alpha$ increases or remains unchanged as a number of repetitions of said charge and discharge cycle increases, wherein Ce is an estimated capacity, Co is a nominal capacity and A and B are positive constants;

obtaining said estimated specific capacity Ce/Co by using a second equation Ce/Co=+$At_\alpha$+B' when said elapsed time $t_\alpha$ decreases as the number of repetitions of said charge and discharge cycle increases, wherein B' is a positive constant; and obtaining said estimated capacity Ce by using said estimated specific capacity Ce/Co and said nominal capacity Co.

20. The method of claim 19, wherein $\alpha$ is ½.

21. The method of claim 19, comprising the steps of:

repeating a charge and discharge cycle at least one of 5 and 6 times, wherein said charge and discharge cycle includes a charge period, in which said Li-ion cell, which is the same kind of Li-ion cell as another Li-ion cell which is a target of capacity estimation is charged by said constant current and constant voltage process, and a discharge period, in which said Li-ion cell is discharged until a voltage of said Li-ion cell reaches a discharge cut-off voltage Vd, wherein the charge period per one cycle is from one of 3 hours and 3 days to 10 days, a discharge current is from 0.2 CmA to 2.0 CmA, in which 1 CmA is a value obtained by dividing Co by one hour, and ambient temperature is one of from 0 to 45 Celsius degrees and from 15 to 30 Celsius degrees;

obtaining said elapsed time $t_\alpha$ and capacity C of said Li-ion cell C by integrating said discharge current with respect to time in each charge and discharge cycle;

calculating a specific capacity C/Co in each of said charge and discharge cycle;

recording $t_\alpha$ and the specific capacity C/Co obtained in an nth cycle, where n is a positive integer, as a function of n to provide $t_\alpha(n)$ and Cr(n);

determining said constants A, B and B' so that said first equation and said second equation approximately represent a correlation between $t_\alpha(n)$ and Cr(n), when assuming that $t_\alpha=t_\alpha(n)$ and Ce/Co=Cr(n); and estimating a capacity of said another Li-ion cell, which is a target of capacity estimation, by using determined values of said constants A, B and B' in said first equation and said second equation.

22. A method for providing a capacity estimation for a Li-ion cell, comprising the steps of:

repeating a charge and discharge cycle a plurality of times, wherein said charge and discharge cycle includes a charge period, in which said Li-ion cell is charged by a constant current and a constant voltage process to provide a charged Li-ion cell, and a discharge period, in which said charged Li-ion cell is discharged;

obtaining a charge current $I_{tm}$ after a lapse of a predetermined time tm from a time when a charge condition is changed from a constant current charge mode to a constant voltage charge mode, wherein a first condition 0<tm≦0.8Co/Ic0 is satisfied, Co is a nominal capacity of said Li-ion cell and Ic0 is a charge current in said constant current charge mode;

obtaining a first estimated specific capacity Ce/Co by using a first equation Ce/Co=−$MI_{tm}$+N', when said charge current $I_{tm}$ increases or remains unchanged as a number of repetitions of said charge and discharge cycle increases, wherein Ce is a specific capacity of said Li-ion cell and M and N' are positive constants;

obtaining a second estimated specific capacity Ce/Co by using a second equation Ce/Co=+$MI_{tm}$+N', when said charge current $I_{tm}$ decreases as the number of repetitions of said charge and discharge cycle increases, wherein N' is a positive constant; and obtaining said estimated capacity Ce by using said first and second estimated specific capacity Ce/Co and said nominal capacity Co.

23. The method of claim 22, wherein said predetermined time tm is from 1 minute to 15 minutes.

24. The method of claim 22, further comprising the steps of:

repeating a charge and discharge cycle at least 5 times, wherein said charge and discharge cycle includes a charge period, in which another Li-ion cell, which is the same kind of Li-ion cell as said Li-ion cell and is a target of capacity estimation, is charged by said constant current and constant voltage process to provide a charged Li-ion cell, and a discharge period, in which said charged Li-ion cell is discharged until a voltage of said charged Li-ion cell reaches a discharge cut-off voltage Vd, wherein a charge period per one cycle is from 3 hours to 10 days, a discharge current is from 0.2 CmA to 2.0 CmA, wherein 1 CmA is a value obtained by dividing Co by one hour, ambient temperature is from 0 to 45 degrees Celsius or from 15 to 30 degrees Celsius;

obtaining said charge current $I_{tm}$ and capacity C of said another Li-ion cell by integrating said discharge current with respect to time in each charge and discharge cycle;

calculating a specific capacity C/Co in each charge and discharge cycle;

recording the charge current $I_{tm}$ and the specific capacity C/Co obtained in an nth cycle, where n is a positive integer, as a first function $I_{tm}(n)$ and a second function Cr(n);

determining said constants M and N' so that said first equation and said second equation approximately represent a correlation between the first function $I_{tm}(n)$ and the second function Cr(n) when assuming that $I_{tm}=I_{tm}(n)$ and Ce/Co=Cr(n); and estimating another capacity of said another Li-ion cell which is a target of capacity estimation, by calculating said first equation and said second equation using the said constants M and N'.

25. A method for providing a degradation estimation of a Li-ion cell, comprising the steps of:

repeating a charge and discharge cycle a plurality of times, wherein said charge and discharge cycle includes a charge period, in which said Li-ion cell is charged by a constant current and a constant voltage process to provide a charged Li-ion cell, and a discharge period, in which said charged Li-ion cell is discharged;

obtaining, when said Li-ion cell is charged by a constant current and a constant voltage method, an elapsed time $t_\alpha$, which is a time difference from a first time when a charge condition is changed from a constant current charge mode to a constant voltage charge mode to a second time when a charge current is a product of α and a charge current Ic0 in said constant current charge mode, wherein α is between 0 and 1;

obtaining a first estimated specific capacity Ce/Co by using a first equation Ce/Co=−At$_\alpha$+B, when said elapsed time $t_\alpha$ increases or remains unchanged as a number of repetitions of said charge and discharge cycle increases, wherein Ce is an estimated capacity, Co is a nominal capacity and A and B are positive constants;

obtaining a second estimated specific capacity Ce/Co by using a second equation Ce/Co=+At$_\alpha$+B', when said elapsed time $t_\alpha$ decreases as a number of repetitions of said charge and discharge cycle increases, wherein A and B' are positive constants; and obtaining said estimated capacity Ce by using said first and second estimated specific capacity Ce/Co and said nominal capacity Co; and determining that said Li-ion cell is degraded when said estimated capacity Ce is smaller than a predetermined limit capacity.

26. A method for providing a degradation estimation of a Li-ion cell, comprising the steps of:

repeating a charge and discharge cycle a plurality of times, wherein said charge and discharge cycle includes a charge period, in which said Li-ion cell is charged by a constant current and a constant voltage process to provide a charged Li-ion cell, and a discharge period, in which said charged Li-ion cell is discharged;

obtaining a charge current $I_{tm}$ after a lapse of a predetermined time tm from a time when a charge condition is changed from a constant current charge mode to a constant voltage charge mode, wherein 0<tm≦0.8Co/Ic0 is satisfied, Co is a nominal capacity of said Li-ion cell and Ic0 is a charge current in said constant current charge mode;

obtaining a first estimated specific capacity Ce/Co by using a first equation Ce/Co=−MI$_{tm}$+N', when said charge current $I_{tm}$ increases or remains unchanged as a number of repetitions of said charge and discharge cycle increases, wherein Ce is an estimated capacity of said Li-ion cell and M and N' are positive constants;

obtaining a second estimated specific capacity Ce/Co by using a second equation Ce/Co=+MI$_{tm}$+N', when said charge current $I_{tm}$ decreases as the number of repetitions of said charge and discharge cycle increases, wherein N' is a positive constant; and obtaining said estimated capacity Ce by using said first and second estimated specific capacity Ce/Co and said nominal capacity Co;

determining that said Li-ion cell is degraded when said estimated capacity Ce is smaller than a predetermined limit capacity.

27. A degradation estimation apparatus for a Li-ion cell, comprising:

a cell control arrangement comprising:

means for repeating a charge and discharge cycle a plurality of times, wherein said charge and discharge cycle includes a charge period, in which said Li-ion cell is charged by a constant current and a constant voltage process to provide a charged Li-ion cell, and a discharge period, in which said charged Li-ion cell is discharged;

means for obtaining, when said Li-ion cell is charged by the constant current and constant voltage process, an elapsed time $t_\alpha$ from a first time when a charge condition is changed from a constant current charge mode to a constant voltage charge mode to a second time when a charge current is a product of α and a charge current Ic0 in said constant current charge mode, wherein α is between 0 and 1;

a memory to store said elapsed time $t_\alpha$ as a function $t_\alpha(n)$ of n in an nth cycle for each charge and discharge cycle;

a logic circuit including:

means for obtaining a first estimated specific capacity Ce/Co by using a first equation Ce/Co=−At$_\alpha$+

B, when said elapsed time $t_\alpha$ increases or remains unchanged as a number of repetitions of said charge and discharge cycle increases, wherein Ce is an estimated capacity, Co is a nominal capacity and A and B are positive constants;

means for obtaining a second estimated specific capacity Ce/Co by using a second equation $Ce/Co=+At_\alpha+B'$, when said elapsed time $t_\alpha$ decreases as the number of repetitions of said charge and discharge cycle increases, wherein B' is a positive constant; and means for obtaining said estimated capacity Ce by using said first and second estimated specific capacity Ce/Co and said nominal capacity Co; and means for determining that said Li-ion cell is degraded when said estimated capacity Ce is smaller than a predetermined limit capacity.

28. A degradation estimation apparatus for a Li-ion cell, comprising:

a cell control arrangement comprising:

means for repeating a charge and discharge cycle a plurality of times, wherein said charge and discharge cycle includes a charge period, in which said Li-ion cell is charged by a constant current and a constant voltage process to provide a charged Li-ion cell, and a discharge period, in which said charged Li-ion cell is discharged;

means for obtaining a charge current $I_{tm}$ after a lapse of a predetermined time tm from a time when a charge condition is changed from a constant current charge mode to a constant voltage charge mode, wherein a condition of $0<tm\leq0.8Co/Ic0$ is satisfied, Co is a nominal capacity of said Li-ion cell and Ic0 is a charge current in said constant current charge mode;

a memory to store said charge current $I_{tm}$ as a function $I_{tm}(n)$ of n in an nth cycle for each charge and discharge cycle;

a logic circuit including:

means for obtaining a first estimated specific capacity Ce/Co by using a first equation $Ce/Co=-MI_{tm}+N'$, when said charge current $I_{tm}$ increases or remains unchanged as a number of repetitions of said charge and discharge cycle increases, wherein Ce is an estimated capacity of said Li-ion cell and M and N' are positive constants;

means for obtaining a second estimated specific capacity Ce/Co by using a second equation $Ce/Co=+MI_{tm}+N'$, when said charge current $I_{tm}$ decreases as the number of repetitions of said charge and discharge cycle increases, wherein N' is a positive constant; and means for obtaining said estimated capacity Ce by using said first and second estimated specific capacity Ce/Co and said nominal capacity Co;

means for determining that said Li-ion cell is degraded when said estimated capacity Ce is smaller than a predetermined limit capacity.

29. A Li-ion battery comprising:

a measuring part, when a charge and discharge cycle is repeated a plurality of times, obtaining an elapsed time $t_\alpha$ from a first time when charge condition is changed from a constant current charge mode to a constant voltage charge mode to a second time when a charge current is a product of α and a charge current Ic0 in said constant current charge mode, wherein said charge and discharge cycle includes a charge period in which said Li-ion cell is charged by a constant current and constant voltage process and a discharge period in which said charged Li-ion cell is discharged;

a memory storing said elapsed time $t_\alpha$ as a function $t_\alpha(n)$ of n in the nth cycle for each cycle;

a logic circuit comprising:

means for obtaining an estimated specific capacity Ce/Co by using a first equation $Ce/Co=-At_\alpha+B$ when said elapsed time $t_\alpha$ increases or remains unchanged as the number of repetition of said cycle increases, wherein Ce is a specific capacity, Co is a nominal capacity and A and B are positive constants;

means for obtaining said estimated specific capacity Ce/Co by using a second equation $Ce/Co=+At_\alpha+B'$ when said elapsed time $t_\alpha$ decreases as the number of repetition of said cycle increases, wherein B' is a positive constant; and means for obtaining said estimated capacity Ce by using said estimated specific capacity Ce/Co and said nominal capacity Co; and means for judging that said Li-ion cell is degraded when said estimated capacity Ce becomes smaller than a predetermined limit capacity.

30. A Li-ion battery comprising:

a measuring arrangement, when a charge and discharge cycle is repeated a plurality of times, obtaining a charge current $I_{tm}$ after a lapse of a predetermined time tm from the time when charge condition is changed from a constant current charge mode to a constant voltage charge mode, wherein $0<tm\leq0.8Co/Ic0$ is satisfied, Co is a nominal capacity of said Li-ion cell and Ic is charge current in said constant current charge mode, wherein said charge and discharge cycle includes a charge period in which said Li-ion cell is charged by a constant current and constant voltage method and a discharge period in which said charged Li-ion cell is discharged;

a memory to store said charge current $I_{tm}$ as a function $I_{tm}(n)$ of n in the nth cycle for each cycle;

a logic circuit comprising:

means for obtaining an estimated specific capacity Ce/Co by using a first equation $Ce/Co=-MI_{tm}+N'$ when said charge current $I_{tm}$ increases or remains unchanged as the number of repetition of said cycle increases, wherein Ce is a specific capacity of said Li-ion cell and M and N' are positive constants;

means for obtaining said estimated specific capacity Ce/Co by using a second equation $Ce/Co=+MI_{tm}+N'$ when said charge current $I_{tm}$ decreases as the number of repetition of said cycle increases, wherein N' is a positive constant; and means for obtaining said estimated capacity Ce by using said estimated specific capacity Ce/Co and said nominal capacity Co;

means for judging that said Li-ion cell is degraded when said estimated capacity Ce becomes smaller than a predetermined limit capacity.

31. A method for providing a capacity estimation for a Li-ion cell, comprising the steps of:

obtaining, when said Li-ion cell is charged by a constant current and a constant voltage process, a charge current It after a lapse of a time t, which is from 30 seconds to 30 minutes, from a time when a charge condition is changed from a constant current charge mode to a constant voltage charge mode; and calculating an estimated capacity Ce of said Li-ion cell by using said charge current It and a first equation $Ce/Co+-a\times It+b$, wherein Co is a nominal capacity of said Li-ion cell, and a and b are positive constants.

32. The method of claim 31, wherein said constants a and b are calculated by a second equation $a = d \times t^e$ and a third equation $b = f \times t^h$, wherein each of d, e, f, and h are constants greater than zero.

33. The method of claim 32, further comprising the steps of:
- repeating a charge and discharge cycle at least 5 times by using a Li-ion cell, which is a capacity estimation target and a same kind of Li-ion cell as said Li-ion cell, wherein said charge and discharge cycle includes a charge period from 3 hours to one month, in which charging is performed by the constant current and constant voltage process, a discharge period, and a rest period of at least zero between said charge period and said discharge period;
- obtaining, in each charge and discharge cycle, charge currents $It_{ni}$, after a lapse of times $t_{ni}$, which are between 30 seconds and 30 minutes, from a time when a charge condition is changed from a constant current charge mode to a constant voltage charge mode, wherein n is a number assigned to each cycle and i is a number assigned to each of the times $t_{ni}$ in each cycle;
- obtaining a discharge capacity Cn in each cycle;
- determining said constants a and b in said first equation and d, e, f, and h in said first and second equations by using said times $t_{ni}$, said charge currents $It_{ni}$ and said discharge capacity Cn.

34. A method for providing a capacity estimation for a Li-ion cell, comprising the steps of:
- obtaining, when said Li-ion cell is charged by a constant current and a constant voltage process, an elapsed time t, which is a time difference from a fist time when a charge condition is changed from a constant current charge mode to a constant voltage charge mode to a second time when a charge current is a product of $\alpha$ and another charge current in said constant current charge mode, where $\alpha$ is between 0 and 1;
- obtaining an estimated capacity Ce of said Li-ion cell by using an equation $Ce/Co = At + B$ and said elapsed time t, wherein Co is a nominal capacity of said Li-ion cell and A and B are positive constants.

35. The method of claim 34, wherein $\alpha$ is ½.

36. The method of claim 34, further comprising the steps of:
- repeating a charge and discharge cycle at least 5 times by using a Li-ion cell, which is at least one of a capacity estimation target and a same kind of Li-ion cell as said Li-ion cell, wherein said charge and discharge cycle includes a charge period from 3 hours to 10 days, in which a charge is provided by said constant current and constant voltage process and a charge current in said constant current charge mode is from Co/5 hours to Co/0.5 hour, a discharge period, and rest period between said charge period and said discharge period, the rest period being at least 0;
- obtaining in each cycle a discharge capacity Cn and an elapsed time tn from a time when a charge condition is changed from a constant current charge mode to another time when the charge current is a product of $\alpha$ and another charge current in said constant current charge mode, where $\alpha$ is between 0 and 1; and
- determining values of said constants A and B from said elapsed time tn and said discharge capacity Cn.

37. The method of claim 36, wherein $\alpha$ is ½.

38. A method for providing a degradation estimation for a Li-ion cell, comprising the steps of:
- obtaining, when said Li-ion cell is charged by a constant current and a constant voltage process, an elapsed time t, which is the time from when a charge condition is changed from a constant current charge mode to a constant voltage charge mode to another time when a charge current is a product of $\alpha$ and another charge current in said constant current charge mode, where $\alpha$ is between 0 and 1;
- obtaining an estimated capacity Ce of said Li-ion cell by using an equation $Ce/Co = At + B$ and said elapsed time t, wherein Co is a nominal capacity of said Li-ion cell and A and B are positive constants; and
- determining that said Li-ion cell is degraded when said estimated capacity Ce is smaller than a predetermined limit capacity Cmin.

39. The method of claim 38, wherein $\alpha$ is ½.

40. A degradation estimation apparatus for a Li-ion cell, comprising:
- means for obtaining, when said Li-ion cell is charged by a constant current and a constant voltage process, an elapsed time t, which is a time from a first time when a charge condition is changed from a constant current charge mode to a constant voltage charge mode to a second time when a charge current is a product of $\alpha$ and another charge current in said constant current charge mode, where $\alpha$ is between 0 and 1;
- a circuit to obtain an estimated capacity Ce of said Li-ion cell by using said elapsed time t; and
- means for outputting a signal indicating that said Li-ion cell is degraded when said estimated capacity Ce is smaller than a predetermined limit capacity Cmin.

41. The capacity estimation apparatus for said Li-ion cell of claim 40, wherein $\alpha$ is ½, and said circuit is configured to obtain said estimated capacity Ce by using an equation $Ce/Co = At + B$ and said elapsed time t, wherein Co is a nominal capacity of said Li-ion cell and A and B are positive constants.

42. A Li-ion battery having a charge and discharge control arrangement, comprising:
- a memory to store numerical data used for calculating an estimated capacity Ce of Li-ion cells in said Li-ion battery;
- means for obtaining, when said Li-ion cell is charged by a constant current and a constant voltage process, an elapsed time t, which is a time difference from a first time when a charge condition is changed from a constant current charge mode to a constant voltage charge mode to a second time when a charge current is a product of $\alpha$ and another charge current in said constant current charge mode, where $\alpha$ is between 0 and 1;
- a circuit to obtain an estimated capacity Ce of said Li-ion cell by using said elapsed time t.

43. The Li-ion battery of claim 42, wherein $\alpha$ is ½, and said circuit is configured to obtain said estimated capacity Ce of said Li-ion cell by using an equation $Ce/Co = At + B$ and said elapsed time t, wherein Co is a nominal capacity of said Li-ion cell and A and B are positive constants.

44. The Li-ion battery of claim 42, further comprising:
- means for outputting a warning indicating that said Li-ion cell is degraded when said estimated capacity Ce is smaller than a predetermined limit capacity Cmin.

45. The Li-ion battery of claim 44, wherein said warning is at least one of a warning by an electrical signal, a warning by displaying characters, a warning by displaying an image, a warning by a beep, and a warning by a voice.

* * * * *